US012281013B2

(12) United States Patent
Tanner et al.

(10) Patent No.: US 12,281,013 B2
(45) Date of Patent: *Apr. 22, 2025

(54) MICROWAVE REACTOR SYSTEM ENCLOSING A SELF-IGNITING PLASMA

(71) Applicant: Lyten, Inc., Sunnyvale, CA (US)

(72) Inventors: David Tanner, Yuba City, CA (US); Daniel Cook, Woodside, CA (US); Bryce H. Anzelmo, Mountain View, CA (US); Ranjeeth Kalluri, Fremont, CA (US); Michael W. Stowell, Sunnyvale, CA (US)

(73) Assignee: Lyten, Inc., San Jose, CA (US)

( * ) Notice: Subject to any disclaimer, the term of this patent is extended or adjusted under 35 U.S.C. 154(b) by 1270 days.

This patent is subject to a terminal disclaimer.

(21) Appl. No.: 17/008,401

(22) Filed: Aug. 31, 2020

(65) Prior Publication Data

US 2021/0053829 A1 Feb. 25, 2021

Related U.S. Application Data

(63) Continuation-in-part of application No. 16/283,234, filed on Feb. 22, 2019, now Pat. No. 10,781,103,
(Continued)

(51) Int. Cl.
*C01B 32/05* (2017.01)
*B01J 8/00* (2006.01)
(Continued)

(52) U.S. Cl.
CPC ............. *C01B 32/05* (2017.08); *B01J 8/0055* (2013.01); *B01J 19/126* (2013.01);
(Continued)

(58) Field of Classification Search
CPC ....... C01B 32/05; B01J 8/0055; B01J 19/126; B01J 2219/0886; B01J 2219/0894;
(Continued)

(56) References Cited

U.S. PATENT DOCUMENTS

| 5,211,923 A | 5/1993 | Harkness et al. |
| 5,693,173 A | 12/1997 | Colombo et al. |

(Continued)

FOREIGN PATENT DOCUMENTS

| CN | 106398802 A | 2/2017 |
| IN | 105870419 A | 8/2016 |

(Continued)

OTHER PUBLICATIONS

Baldissarelli, Vanessa et al., "Plasma-Assisted Production of Carbon Black and Carbon Nanotubes from Methane by Thermal Plasma Reform," J. Braz., Chem. Soc., vol. 25, No. 1, 126-132, 2014, pub. online: Nov. 26, 2013.

(Continued)

*Primary Examiner* — Brian W Cohen
*Assistant Examiner* — John Lee
(74) *Attorney, Agent, or Firm* — Paradice & Li LLP

(57) ABSTRACT

This disclosure provides a reactor system that includes a microwave energy source that generates a microwave energy, a field-enhancing waveguide (FEWG) coupled to the microwave source. The FEWG includes a field-enhancing zone having a cross-sectional area that decreases along a length of the FEWG. The field-enhancing zone includes a supply gas inlet that receives a supply gas, a reaction zone that generates a plasma in response to excitation of the supply gas by the microwave energy, a process inlet that injects a raw material into the reaction zone, and a constricted region that retains a portion of the plasma and combines the plasma and the raw material in response to the microwave energy within the reaction zone. An expansion chamber is in fluid communication with the constricted region facilitates expansion of the plasma. An outlet outputs a plurality of carbon-inclusive particles derived from the expanded plasma and the raw material.

23 Claims, 24 Drawing Sheets

Related U.S. Application Data which is a continuation of application No. 15/725,928, filed on Oct. 5, 2017, now Pat. No. 10,308,512.

(60) Provisional application No. 62/406,745, filed on Oct. 11, 2016, provisional application No. 62/404,851, filed on Oct. 6, 2016.

(51) Int. Cl.
  *B01J 19/12* (2006.01)
  *H01J 37/32* (2006.01)
  *B01D 46/00* (2022.01)

(52) U.S. Cl.
  CPC .. *H01J 37/32192* (2013.01); *H01J 37/32229* (2013.01); *B01D 46/00* (2013.01); *B01J 2219/0886* (2013.01); *B01J 2219/0894* (2013.01); *B01J 2219/1209* (2013.01); *B01J 2219/1248* (2013.01); *B01J 2219/1269* (2013.01); *B01J 2219/1296* (2013.01); *C01P 2004/61* (2013.01)

(58) Field of Classification Search
  CPC ........ B01J 2219/1209; B01J 2219/1248; B01J 2219/1269; H01J 37/32192; H01J 37/32229; B01D 46/00; C01P 2004/61
  USPC ..................................................... 204/157.43
  See application file for complete search history.

(56) References Cited

U.S. PATENT DOCUMENTS

| | | | |
|---|---|---|---|
| 6,120,741 A | 9/2000 | Jacquault et al. | |
| 6,156,114 A | 12/2000 | Bell et al. | |
| 6,383,301 B1 | 5/2002 | Bell et al. | |
| 8,636,960 B2 | 1/2014 | Spitzl et al. | |
| 8,968,588 B2 | 3/2015 | Zhao et al. | |
| 9,862,602 B1 | 1/2018 | Riso et al. | |
| 9,862,606 B1 | 1/2018 | Cook et al. | |
| 10,308,512 B2* | 6/2019 | Tanner | C01B 32/05 |
| 2002/0050323 A1 | 5/2002 | Moisan et al. | |
| 2003/0024806 A1 | 2/2003 | Foret | |
| 2003/0086859 A1 | 5/2003 | Kawakami et al. | |
| 2004/0245008 A1 | 12/2004 | Gardner | |
| 2004/0261617 A1 | 12/2004 | Stewart | |
| 2005/0089684 A1 | 4/2005 | Barron et al. | |
| 2005/0123467 A1 | 6/2005 | Harutyunyan | |
| 2005/0163696 A1 | 7/2005 | Uhm et al. | |
| 2007/0212254 A1 | 9/2007 | Nagatsu | |
| 2007/0274893 A1 | 11/2007 | Wright et al. | |
| 2008/0029030 A1 | 2/2008 | Goto et al. | |
| 2009/0060805 A1 | 3/2009 | Muradov et al. | |
| 2009/0186167 A1* | 7/2009 | Tsuji | H05H 1/30 427/569 |
| 2009/0194528 A1 | 8/2009 | Kotzian et al. | |
| 2010/0036023 A1 | 2/2010 | Weng et al. | |
| 2010/0056819 A1 | 3/2010 | Jang et al. | |
| 2010/0078320 A1* | 4/2010 | Stowell | H01J 37/32477 204/192.12 |
| 2011/0036014 A1 | 2/2011 | Tsangaris et al. | |
| 2011/0059006 A1 | 3/2011 | Donnet et al. | |
| 2011/0206946 A1 | 8/2011 | Schmidt et al. | |
| 2012/0034137 A1 | 2/2012 | Risby | |
| 2012/0058397 A1 | 3/2012 | Zhamu et al. | |
| 2012/0094175 A1 | 4/2012 | Sheem et al. | |
| 2013/0136684 A1 | 5/2013 | Wu et al. | |
| 2013/0150516 A1 | 6/2013 | Lettow | |
| 2013/0248773 A1 | 9/2013 | Chang et al. | |
| 2013/0270110 A1 | 10/2013 | Sasai et al. | |
| 2013/0296479 A1 | 11/2013 | Martin et al. | |
| 2013/0310495 A1 | 11/2013 | Kim et al. | |
| 2014/0030181 A1 | 1/2014 | Liu et al. | |
| 2014/0159572 A1 | 6/2014 | Risby et al. | |
| 2014/0251955 A1 | 9/2014 | Itoh et al. | |
| 2014/0313636 A1 | 10/2014 | Tour et al. | |
| 2015/0007773 A1* | 1/2015 | Toyoshima | B82Y 40/00 118/723 MW |
| 2015/0044565 A1 | 2/2015 | Wang et al. | |
| 2015/0073072 A1 | 3/2015 | Kim et al. | |
| 2015/0179294 A1 | 6/2015 | Kim et al. | |
| 2015/0246813 A1 | 9/2015 | Koveal et al. | |
| 2015/0267063 A1 | 9/2015 | Drewer et al. | |
| 2016/0059197 A1 | 3/2016 | Stevanovic et al. | |
| 2016/0185603 A1 | 6/2016 | Bozalina et al. | |
| 2016/0243518 A1 | 8/2016 | Spitzl | |
| 2016/0276055 A1 | 9/2016 | Choi et al. | |
| 2016/0340495 A1 | 11/2016 | Pan et al. | |
| 2017/0113935 A1 | 4/2017 | Pennington et al. | |
| 2017/0174520 A1 | 6/2017 | Walters et al. | |
| 2018/0099871 A1 | 4/2018 | Tanner et al. | |
| 2018/0226229 A1 | 8/2018 | Stowell et al. | |
| 2018/0327611 A1 | 11/2018 | Scheffer et al. | |

FOREIGN PATENT DOCUMENTS

| | | |
|---|---|---|
| JP | 2001122690 A | 5/2001 |
| JP | 2004346385 A | 12/2004 |
| KR | 100583500 B1 | 5/2006 |
| WO | 2000014518 A1 | 3/2000 |
| WO | 2010094969 A1 | 8/2010 |
| WO | 2014090992 A3 | 8/2014 |
| WO | 2015189643 A1 | 12/2015 |
| WO | 2016001476 A1 | 1/2016 |
| WO | 2016126599 A1 | 8/2016 |
| WO | 2016135328 A1 | 9/2016 |

OTHER PUBLICATIONS

International Search Report and Written Opinion for Intl. Application No. PCT/US2021/041110 dated Dec. 17, 2021; 9 pages.

* cited by examiner

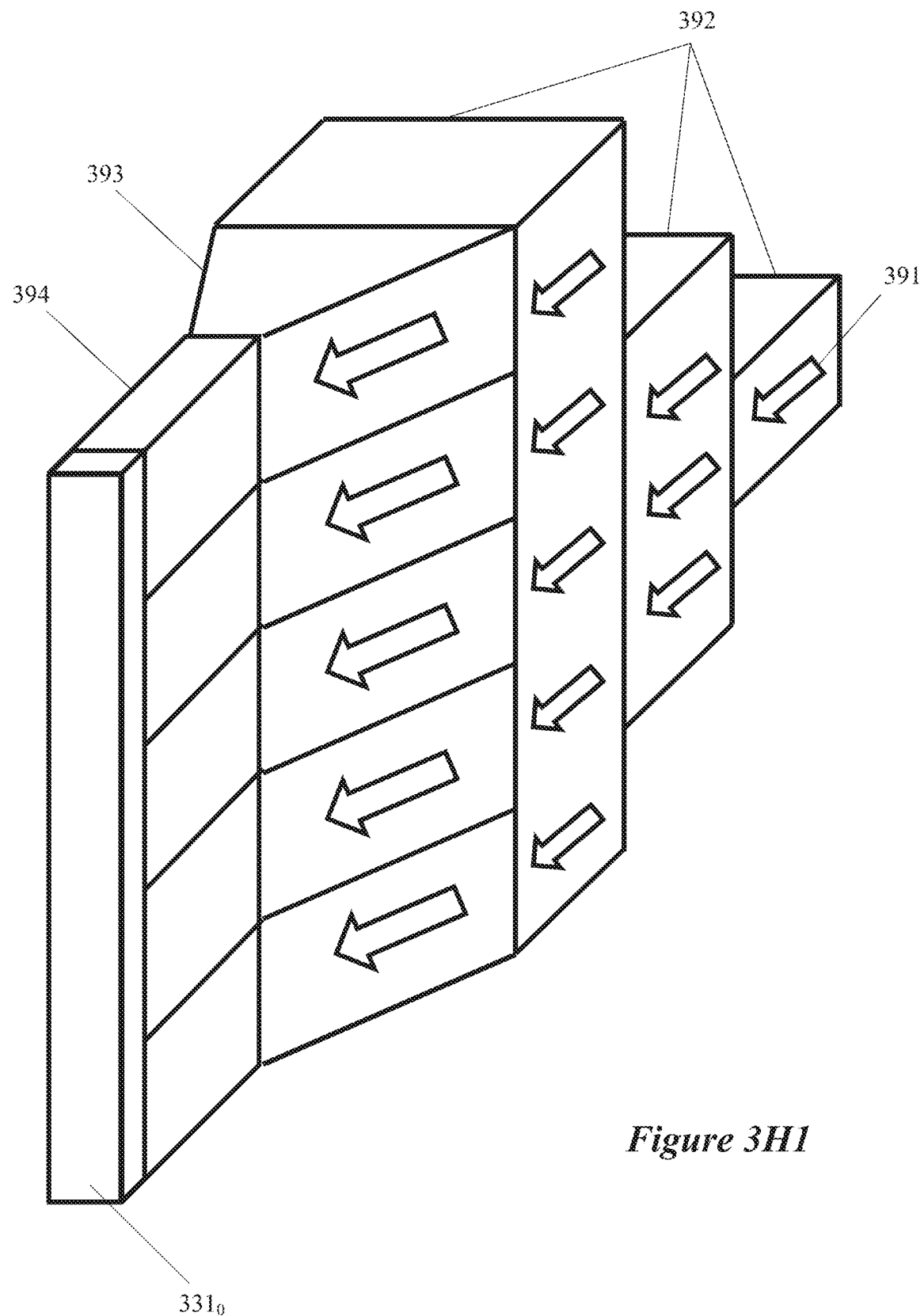
*Figure 3H1*

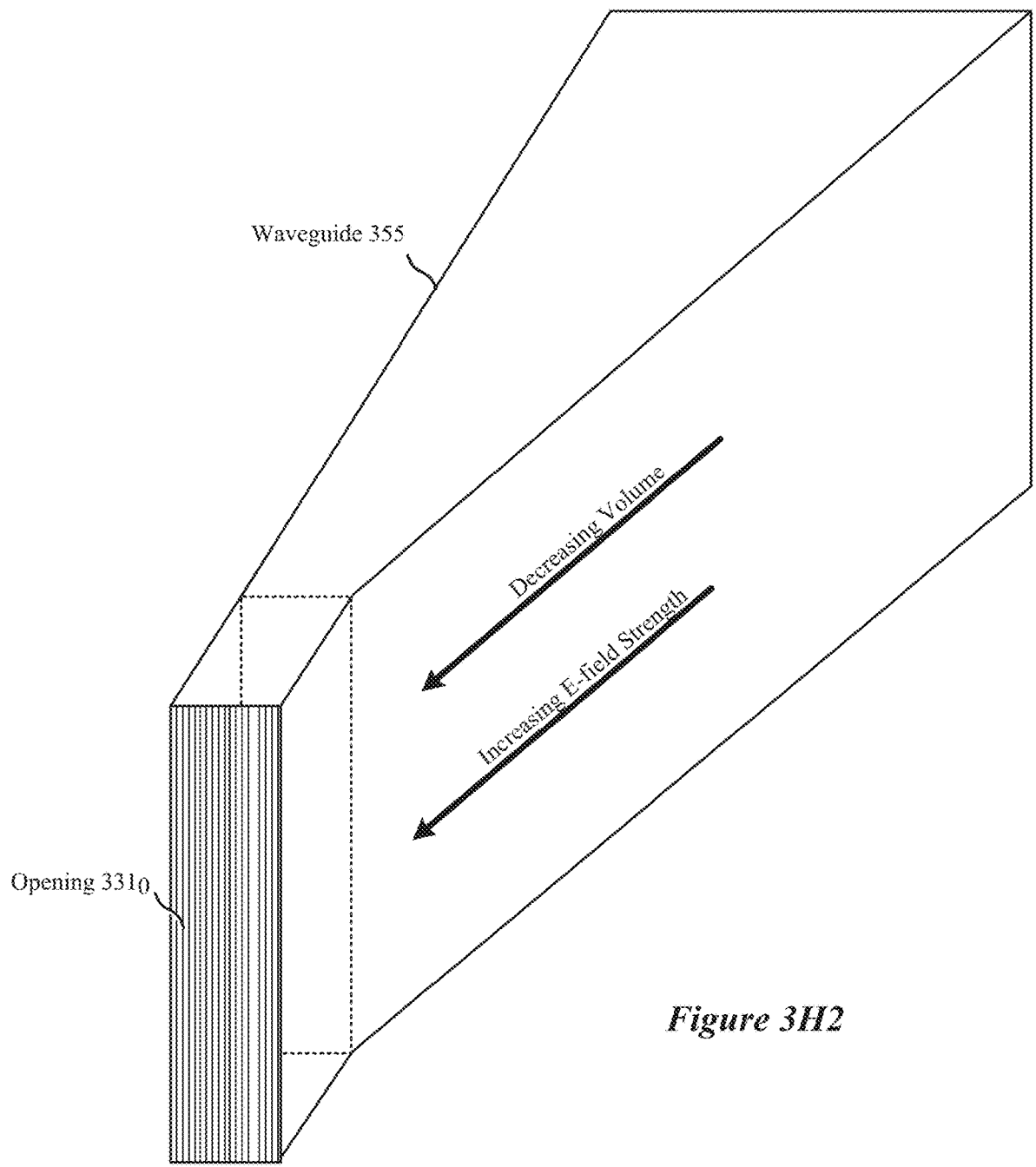
Figure 3H2

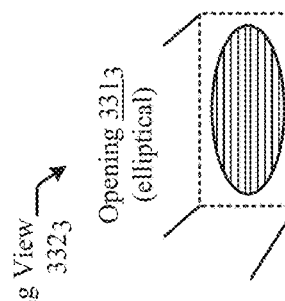
Figure 3K1
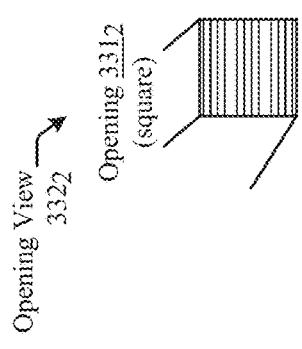
Figure 3K2
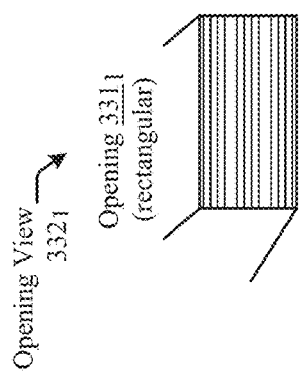
Figure 3K3
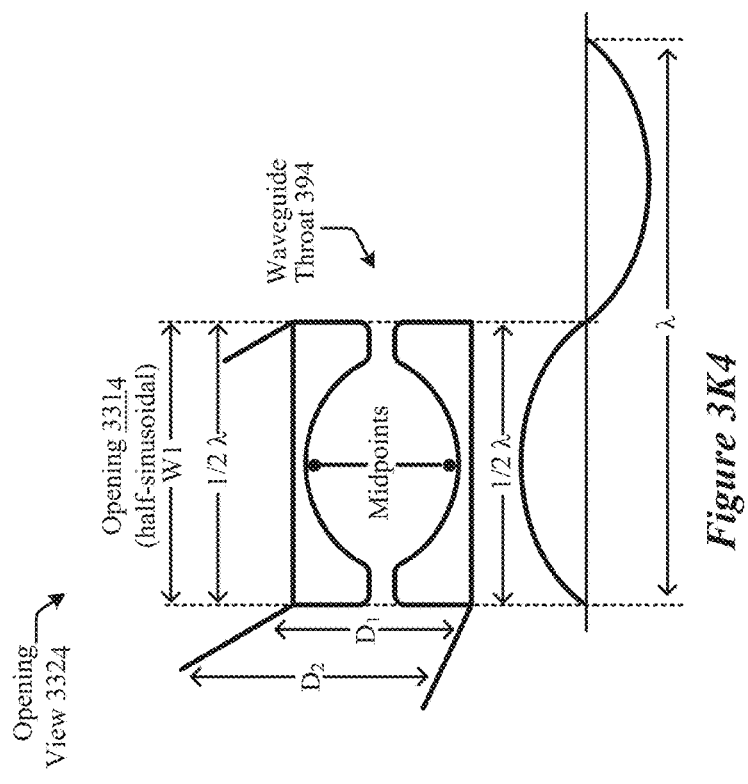
Figure 3K4

MICROWAVE REACTOR SYSTEM ENCLOSING A SELF-IGNITING PLASMA

CROSS-REFERENCE TO RELATED APPLICATIONS

This application is a continuation-in-part of U.S. patent application Ser. No. 16/283,234 entitled "Microwave Reactor System with gas-solids separation" and filed on Feb. 22, 2019, which is a continuation of U.S. patent application Ser. No. 15/725,928 entitled "Microwave Reactor System with gas-solids separation" and filed on Oct. 5, 2017, which claims priority to U.S. Provisional Patent Application No. 62/404,851 entitled "Microwave Reactor System" filed on Oct. 6, 2016 and to U.S. Provisional Patent Application No. 62/406,745 entitled "Bio-Gas System" filed on Oct. 11, 2016, all of which are assigned to the assignee hereof. The disclosures of all prior applications are considered part of and are incorporated by reference in this patent application in their respective entireties.

TECHNICAL FIELD

This disclosure relates generally to reactors for producing carbon agglomerates, and, more particularly, to reactors featuring multiple energy sources.

DESCRIPTION OF THE RELATED ART

Reactors employing a microwave energy excited plasma environment are used in various industries, including semiconductor wafer processing and industrial chemical processing of hydrocarbon gases. Typical configurations include equipment intended for flowing precursor and reagent gases for reaction in an elongated vessel coupled to microwave energy source, which propagates microwave energy into a gaseous mixture contained by the vessel to generate a plasma. Microwave energy propagated into the plasma cracks, such as where long-chain hydrocarbons are broken down into simpler molecules such as light hydrocarbons by the breaking of carbon-carbon bonds in the precursors, molecules prevalent in the gaseous mixture into their respective component species. Microwave chemical processing systems are effective because the plasmas they employ can operate at relatively high power coupling efficiencies at low ion energies, and are capable of supporting various gas reactions, such as the conversion of methane into hydrogen and carbon particulates, the conversion of carbon dioxide into oxygen and carbon, and coating particulates and other seed materials with other layers for functionalization and complex layered materials and aggregate processing.

Typical systems for chemical gas processing include a quartz reaction chamber through which process materials are flowed, and a microwave magnetron source coupled to the reaction chamber through a waveguide. Input microwave energy can be either in the form of a continuous wave or be pulsed according to a pre-determined input frequency. Systems are designed to control propagation of the microwave energy into the reaction chamber, and any resultant gas flow within the reaction chamber to improve the energy absorption by the enclosed gaseous mixture. Systems can include a wedge-shaped component located where the microwave waveguide intersects the quartz reaction chamber to, for example, concentrate a targeted electric field within a relatively small area, while avoiding exposure of the waveguide conductive walls to the gases to be processed.

In systems that produce both gases and particulates, particulate filtration can be achieved using a gas-solids separation system. The gas-solids separation systems can contain cyclone filters, back-pulse filters, or other filters. However, filtering carbon-containing particles from input hydrocarbon gases can present operational challenges. For example, generated carbon-containing particles can be very small (such as having median particle size below 100 nm), which worsens such particle filtration challenges In an attempt to address such challenges, systems can be configured to use back-pulse filters that employ heated filters such as heated filter candles, that are periodically cleared by blowing gas through the filter candles to dislodge carbon-containing particles such as using a back-pulse that flows gas in the opposite direction the from the filtration direction. Other gas-solids separation systems for separating carbon-containing particles from input hydrocarbon gas use cyclone separators, which can be also heated.

SUMMARY

The systems, methods and devices of this disclosure each have several innovative aspects, no single one of which is solely responsible for the desirable attributes disclosed herein.

One innovative aspect of the subject matter described in this disclosure can be implemented in a reactor system. In some implementations, the reactor system includes a microwave energy source, a field-enhancing waveguide (FEWG), an expansion chamber, and an outlet. The microwave energy source is configured to generate a microwave energy. The FEWG is coupled to the microwave energy source, and includes a field-enhancing zone having a cross-sectional area that decreases along a length of the FEWG. In some implementations, the field-enhancing zone includes a supply gas inlet configured to receive a supply gas, a reaction zone configured to generate a plasma in response to excitation of the supply gas by the microwave energy, a process inlet configured to inject a raw material into the reaction zone, and a constricted region configured to retain at least some of the generated plasma within the reaction zone, the constricted region further configured to combine the plasma and the raw material in response to microwave energy within the constricted region. field-enhancing waveguide (FEWG). The expansion chamber is in fluid communication with the constricted region, and configured to expand the plasma. The outlet is configured to output a plurality of carbon-inclusive particles derived from the expanded plasma and the raw material. In some aspects, the microwave energy is pulsed according to a pulse frequency. In other aspects, the FEWG may include a controller configured to adjust one or more of an electron density, an electron temperature, or a gas temperature within the FEWG. In some other aspects, the FEWG is configured to self-nucleate the carbon-inclusive particles.

In some implementations, the carbon-inclusive particles include graphene platelets that can be fused together at substantially orthogonal angles. In some other implementations, the reactor system also includes one or more energy sources configured to generate a thermal energy. In some aspects, the thermal energy generated by the one or more energy sources is configured to disperse graphene platelets within each of the carbon-inclusive particles.

In some implementations, the FEWG may be configured to adjust a length of the plasma by selectively flowing one or more precursors through the field-enhancing zone. In addition, or in the alternative, the constricted region may be configured to concentrate the microwave energy in conjunction with the combining of the plasma and the raw material.

In some implementations, the reactor system may include a pair of electrodes positioned on opposite sides of the FEWG and proximate to the reaction zone. In some aspects, the pair of electrodes may be configured to generate an electric field through which the plasma and the raw material are further combined. In other aspects, a degree of concentration of the microwave energy may be based on a magnitude of the electric field generated by the pair of electrodes. In some other aspects, an increase in the electric field strength may be configured to cause a self-ignition of the plasma by combining any one or more of the supply gas or the raw material.

In some implementations, the raw material is configured to be converted into the carbon-inclusive particles in the expansion chamber. In some aspects, the raw material may be any one or more of carbonaceous particles, colloidal dispersions, or a plurality of solid particles. In some other aspects, the constricted region may also include an opening connecting the FEWG to the expansion chamber. The opening may have a defined shape including any one or more of a rectangle, a square, or an ellipse. In some aspects, a density of the plasma may be based at least in part on the defined shape of the opening. In other aspects, a homogeneity of plasma radicals within the plasma may be based at least in part on the defined shape of the opening. In addition, or in the alternative, the opening may be configured to separate the plasma from one or more surfaces of the expansion chamber.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIGS. 3G and 3H1 are simplified diagrams of microwave chemical processing systems in which multiple field-enhancing waveguides are coupled to one microwave energy generator, according to some implementations.

FIG. 3H2 shows simplified diagram of a field-enhancing waveguide configured to cause free-space ignition of a plasma, according to some implementations.

FIGS. 3K1, 3K2, 3K3, and 3K4 show several opening shapes that correspond to differently configured field-enhancing waveguide geometries that are configured to cause free-space ignition of a plasma, according to some implementations.

DETAILED DESCRIPTION

Figure 1A:
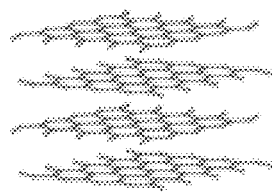
FIGS. 1A, 1B, 1C, and 1D show schematics of carbon allotropes as known in the art, according to some implementations.

Chemical processing systems can propagate microwave energy into a gaseous mixture to generate a plasma, which can be used to convert a process input material into several desired separated components, any one or more of which may be suitable to undergo post-processing operations. Separated components can include a mixture of solid particles and gaseous products. In such systems, the microwave plasma chemical reactor can be designed to produce gases and particles with desirable properties, such as product gas species, product gas purity, particle composition and crystal structure, particle size, surface area, mass density, electrical conductivity, etc., from a particular input material. The input material properties, such as input material species, input material purity, etc., can also affect physical and chemical properties of the separated components, such as product gas species, product gas purity, particle composition and crystal structure, particle size, surface area, mass density, electrical conductivity, etc. Also, in systems that produce mixtures of solid particles and gaseous products, integration with a gas-solids separation system can be of critical importance, such as those that effectively filter a large fraction of the produced particles.

Throughout this disclosure the terms "process material," "input material," "precursor material", and "reagent material" all refer to material being converted into separated components in the described systems employing microwave-excited plasma cracking of input hydrocarbon gases. The input material can also be referred to as a "process gas."

A materials processing system can include an input material comprising a hydrocarbon gas, a microwave plasma reactor, and a multi-stage gas-solid separator system coupled to the microwave plasma reactor. The microwave plasma reactor can include a microwave energy source, a waveguide having a reaction zone, where the microwave energy source is coupled to the reaction zone through the waveguide, and the microwave energy generates a plasma in the reaction zone. The microwave plasma reactor can include an inlet configured to receive and direct the input material into a reaction zone, where plasma present in the reaction zone can separate the input material into separated components (such as hydrogen gas and carbon particles).

Input materials can be gases, liquids, or colloidal dispersions. In microwave plasma chemical processing reactors of various implementations, the processing of the input materials into separated components occurs in a reaction zone of a waveguide. In this disclosure, implementations may be described using one type of input material, such as gases, as an example material, but the implementations may be equally applicable to other types of materials, such as liquids and/or colloidal dispersions, such as phase separated mixtures in which one substance of microscopically dispersed insoluble or soluble particles is suspended throughout another substance.

Input material can be a gas. Such as a hydrocarbon gas, including $C_2H_2$, $C_2H_4$, $C_2H_6$. Alternatively, or in addition, the input material can be an industrial gas such as natural gas or biogas. The input material can be a mixture of natural gas and hydrogen gas, or a mixture of biogas a hydrogen gas. The process material can be methane, ethane, ethylene, acetylene, propane, propylene, butane, butylene(s), or butadiene, and the separated components are hydrogen and nanoparticulate carbon. The process material can be carbon dioxide with water, and the separated components are oxygen, carbon, and water. The process material can be $H_2S$, and the separated components are hydrogen gas and sulfur. The input material, in some implementations, does not contain carbon dioxide, or has less than 1% carbon dioxide, or less than 0.1% carbon dioxide, or less than 0.01% carbon dioxide. The input material, in some implementations, does not contain oxygen, or has less than 1% oxygen, or less than 0.1% oxygen, or less than 0.01% oxygen. The process material, in some implementations, does not contain water, or has less than 1% water, or less than 0.1% water, or less than 0.01% water. The process material can be a complex gas-based material, for example $SiH_4$, trimethylaluminum (TMA), trimethylgallium (TMG), glycidyl methacrylate (GMA), $SF_6$, and other materials used in the semiconductor industry for the deposition and etching of metals and dielectrics.

The separated products can include hydrogen gas, and the hydrogen gas is used in applications such as in refineries, ammonia synthesis, methanol synthesis, metallurgical reduction processes, or the hydrogenation of fatty acids. The input material can be a gas that is produced in industrial processes, such as natural gas, or biogas. In some cases, the input material can be a byproduct of an industrial process.

Natural gas (NG) input material generally contains methane, and ethane. NG can also contain other hydrocarbons such as propane, butane, and pentane. NG can also contain other species in lower concentrations such as nitrogen and carbon dioxide. In general, the composition of species in natural gas varies by source. NG can contain methane, up to 10 mol % ethane, up to 5 mol % propane, up to 2 mol % butane, up to 4 mol % nitrogen, and up to 4 mol % carbon dioxide. As an example of one particular region, Northern California NG contains 86.6 wt. % methane, 5.86 wt. % ethane, 3.5 wt. % propane, 1.51 wt. % butane, 2.5 wt. % carbon dioxide, and a concentration of nitrogen below the experimental detection limit.

Bio-gas input material generally contains methane, carbon dioxide, nitrogen, water, and other species. In general, the composition of species in biogas varies by source. For example, biogas can contain approximately 65% to 70% methane, 25% to 30% carbon dioxide, 0% to 5% nitrogen, 0% to 5% water, 0% to 5% hydrogen sulfide, and less than 1% oxygen. The composition of the biogas can be outside of these ranges, and other species can be included. The bio-gas input material is pre-treated prior to conversion in the microwave plasma reactors to remove one or more constituent species, such as carbon dioxide, hydrogen sulfide, water, and/or oxygen.

The flow rate of the input material into the reactor is from 1 slm (standard liters per minute) to 1000 slm, or from 2 slm to 1000 slm, or from 5 slm to 1000 slm, or greater than 1 slm, or greater than 2 slm, or greater than 5 slm.

The separated components contain hydrogen gas and carbon particles, and the solids loading, in mass of solids per volume of gas, is greater than 0.001 g/L, or is greater than 0.01 g/L, or is greater than 0.05 g/L, or greater than 0.1 g/L, or greater than 0.15 g/L, or greater than 0.2 g/L, or greater than 0.25 g/L, or greater than 1 g/L, or greater than 2 g/L, or greater than 5 g/L, or from 0.001 g/L to 5 g/L, or from 0.001 g/L to 2.5 g/L, or from 0.001 g/L to 1 g/L, or from 0.001 g/L to 0.5 g/L, or from 0.001 g/L to 0.1 g/L, or from 0.01 g/L to 5 g/L, or from 0.01 g/L to 2.5 g/L, or from 0.01 g/L to 1 g/L, or from 0.01 g/L to 0.5 g/L, or from 0.01 g/L to 0.4 g/L, or from 0.01 g/L to 0.3 g/L, or from 0.01 g/L to 0.2 g/L, or from 0.01 g/L to 0.1 g/L, or from 0.1 g/L to 5 g/L, or from 0.1 g/L to 2.5 g/L, or from 0.1 g/L to 1 g/L, or from 0.1 g/L to 0.5 g/L, or from 0.1 g/L to 0.4 g/L, or from 0.1 g/L to 0.3 g/L, or from 0.1 g/L to 0.2 g/L.

In instances where the separated components include solid particles and gaseous products, the multi-stage gas-solid separator system can include one or more cyclone separators, and a fines filter system. The one or more cyclone separators can filter the carbon particles from the separated components, and the fines filter system is coupled to the output of the first cyclone separator, such that the fines filter system filters the carbon particles from the output from the cyclone separators. Some examples of fines filters are filters utilizing porous media to capture particles, such as pressure filters, vacuum filters, back-pulse filters, etc., filters utilizing liquids to capture particles, such as distillation columns, liquid vortex filters, etc., and filters utilizing electrostatic forces to capture particles, such as electrostatic precipitation filters.

In instances where the separated components include solid particles and gaseous products, disclosed multi-stage gas-solid separator systems can be configured to communicate with or include one or more cyclone separators, and a back-pulse filter system. The one or more cyclone separators filter the carbon particles from the separated components, and the back-pulse filter system is coupled to the output of the first cyclone separator, such that the back-pulse filter system filters the carbon particles from the output from the cyclone separators. The temperature of gas-solids separation systems (such as the cyclone separators and back-pulse filter system) can also be elevated to prevent gaseous species from condensing on the filters and the produced particles. The gaseous products are purified after the gas-solids separation system and prior to storage. Other types of fines filters may apply to the presently disclosed implementations.

Carbon Allotropes Produced Using Microwave Chemical Processing Systems

Chemical processing systems configured to propagate microwave energy to generate a plasma can produce carbon nanoparticles and aggregates, such as the materials described in U.S. patent application Ser. No. 15/594,032, entitled "Carbon Allotropes," and in U.S. patent application Ser. No. 15/711,620 entitled "Seedless Particles With Carbon Allotropes," which are assigned to the same assignee as the present application, and are incorporated herein by reference herein for all purposes.

The input material and process conditions within the reactor and gas-solids separation systems can affect the properties of the carbon particles and agglomerates produced, which can include different allotropes (such as the property of some chemical elements to exist in two or more different forms, in the same physical state) of carbon, including graphite, graphene, fullerenes, amorphous carbon, and combinations thereof, as described below. The carbon nanoparticles and aggregates can be characterized by a high degree of order (such as low concentration of defects), and/or high purity (such as low concentration of elemental impurities), in contrast to the less ordered and lower purity particles achievable with conventional systems and methods.

The form-factors of the materials described herein are particles (such as nanoparticles or aggregates). The form-factors are not films, which are arranged on objects or substrates. The carbon particles described herein can be core-less or seedless (such as do not contain a core or a seed of a material other than carbon). The carbon aggregates described herein can be characterized by a size that is substantially larger than comparable prior art particles.

In contrast to particles created via conventional systems and methods, the seedless carbon nanoparticles and aggregates described herein have low concentration of elemental impurities, and have large particles sizes, high surface areas and high electrical conductivities as synthesized. The carbon nanoparticles and aggregates described herein can be produced and filtered using relatively high speed, low cost, improved microwave chemical processing systems and methods, as described herein.

The term "graphene" implies an allotrope of carbon consisting of a single layer of atoms arranged in two-dimensional honeycomb lattice. Each atom in a graphene sheet is connected to its three nearest neighbors by a σ-bond and contributes one electron to a conduction band that extends over the whole sheet. This is the same type bonding seen in carbon nanotubes and polycyclic aromatic hydrocarbons, and (partially) in fullerenes and glassy carbon. These conduction bands make graphene a semimetal with unusual electronic properties that are best described by theories for massless relativistic particles. Carbon atoms in graphene are $sp^2$-bonded. Additionally, graphene has a Raman spectrum with three main peaks: a G-mode at approximately 1580 $cm^{-1}$, a D-mode at approximately 1350 $cm^{-1}$, and a 2D-mode peak at approximately 2690 $cm^{-1}$ (when using a 532 nm excitation laser). In the present disclosure, a single layer of graphene is configured as a single sheet of hexagonally arranged (such as $sp^2$-bonded) carbon atoms. It is known that the ratio of the intensity of the 2D-mode peak to the G-mode peak (such as the 2D/G intensity ratio) is related to the number of layers in the graphene. A higher 2D/G intensity ratio corresponds to fewer layers in multilayer graphene materials. Graphene can contain fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contains a single layer of carbon atoms, or contains from 1 to 10 layers of carbon atoms, or contains from 1 to 7 layers of carbon atoms, or contains from 1 to 5 layers of carbon atoms. Few layer graphene (FLG) can contain from 2 to 7 layers of carbon atoms. Many layer graphene (MLG) can contain from 7 to 15 layers of carbon atoms.

The term "graphite" implies a crystalline form of the element carbon with its atoms arranged in a hexagonal structure. The carbon atoms in graphite are $sp^2$-bonded. Additionally, graphite has a Raman spectrum with two main peaks: a G-mode at approximately 1580 $cm^{-1}$ and a D-mode at approximately 1350 $cm^{-1}$ (when using a 532 nm excitation laser). Graphite can contain layers of hexagonally arranged (such as $sp^2$-bonded) carbon atoms. Graphite can contain greater than 15 layers of carbon atoms, or greater than 10 layers of carbon atoms, or greater than 7 layers of carbon atoms, or greater than 5 layers of carbon atoms, or greater than 3 layers of carbon atoms.

The term "fullerene" implies a molecule of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in structure to graphite, which is composed of stacked graphene sheets of linked hexagonal rings. Fullerenes may also contain pentagonal (or sometimes heptagonal) rings.

The term "multi-walled fullerene" implies fullerenes with multiple concentric layers. For example, multi-walled nanotubes (MWNTs) contain multiple rolled layers (concentric tubes) of graphene. Multi-walled spherical fullerenes (MWSFs) contain multiple concentric spheres of fullerenes.

The term "amorphous carbon" implies a carbon allotrope that has minimal or no crystalline structure. One method for characterizing amorphous carbon is through the ratio of $sp^2$ to $sp^3$ hybridized bonds present in the material. The $sp^2$ to $sp^3$ ratios can be determined by comparing the relative intensities of various spectroscopic peaks (including EELS, XPS, and Raman spectroscopy) to those expected for carbon allotropes with $sp^2$ or $sp^3$ hybridization.

The term "nanoparticle" implies a particle that has a size from 1 nm to 900 nm. The nanoparticle can include one or more type of structure (such as crystal structure, defect concentration, etc.), and one or more type of atom. The nanoparticle can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (such as with few voids), porous shapes (such as with many voids), etc. The term "particle" implies a particle that has any size, including nanoparticles.

The term "aggregate" implies a plurality of particles or nanoparticles that are connected together by Van der Waals forces, by covalent bonds, by ionic bonds, by metallic bonds, or by other physical or chemical interactions. Aggregates can vary in size considerably, but in general are larger than about 500 nm.

The terms "particle" or "particles" imply any size particles, including nanoparticles and aggregates.

The carbon particles and nanoparticles described herein contain graphite and graphene, with no seed particles. The particles and nanoparticles described herein can contain graphite containing greater than 15 layers of carbon atoms, or greater than 10 layers of carbon atoms, or greater than 7 layers of carbon atoms, or greater than 5 layers of carbon atoms, or greater than 3 layers of carbon atoms, and graphene containing fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contain a single layer of carbon atoms, or contain from 1 to 10 layers of carbon atoms, or contain from 1 to 7 layers of carbon atoms, or contain from 1 to 5 layers of carbon atoms, with no seed particles. A plurality of the carbon particles or nanoparticles can be contained within a carbon aggregate. A carbon material can contain a plurality of the carbon aggregates.

The carbon particles or nanoparticles can comprise multi-walled spherical fullerenes (MWSFs). The carbon particles or nanoparticles further can comprise connected MWSFs, with layers of graphene coating the connected MWSFs. The carbon particles or nanoparticles can comprise amorphous carbon.

The particles and aggregates described herein can contain a mixture of graphene and a second allotrope of carbon, and do not contain a seed particle. The second allotrope of carbon can be graphite, MWSFs, connected MWSFs, or amorphous carbon. The particles and aggregates can contain a mixture of graphene, a second allotrope of carbon, and a third allotrope of carbon, and do not contain a seed particle. The second allotrope is graphite and the third allotrope is MWSFs, connected MWSFs, or amorphous carbon.

Figure 1B:
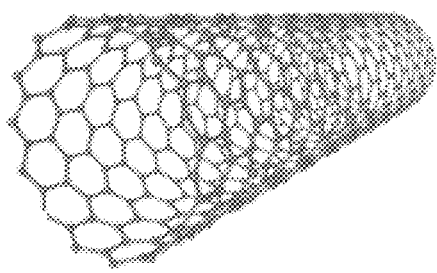
Figure 1C:
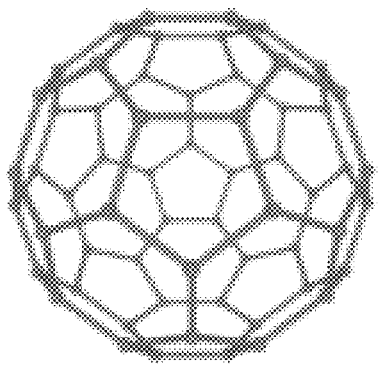
Figure 1D:
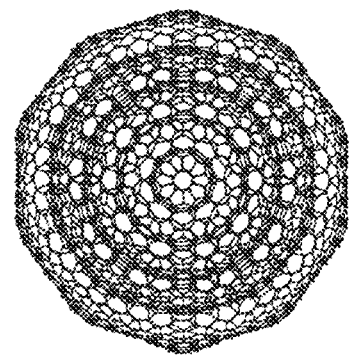

The particles and aggregates described herein can contain higher-order carbon allotropes. Some examples of higher-order carbon allotropes are shown in FIGS. 1A, 1B, 1C, and 1D. FIG. 1A shows a schematic of graphite, where carbon forms multiple layers of a two-dimensional, atomic-scale, hexagonal lattice in which one atom forms each vertex. Graphite, as shown here, is made of single layers of graphene. FIG. 1B shows a schematic of a carbon nanotube, where carbon atoms form a hexagonal lattice that is curved into a cylinder. Carbon nanotubes can also be referred to as cylindrical fullerenes. FIG. 1C shows a schematic of a C60 buckminsterfullerene, where a single layer of a hexagonal lattice of carbon atoms forms a sphere. Other spherical fullerenes exist that contain single layers of hexagonal lattices of carbon atoms, and can contain 60 atoms, 70 atoms, or more than 70 atoms. FIG. 1D shows a schematic of a carbon nano-onion from U.S. Pat. No. 6,599,492, which contains multiple concentric layers of spherical fullerenes.

Figure 1E:
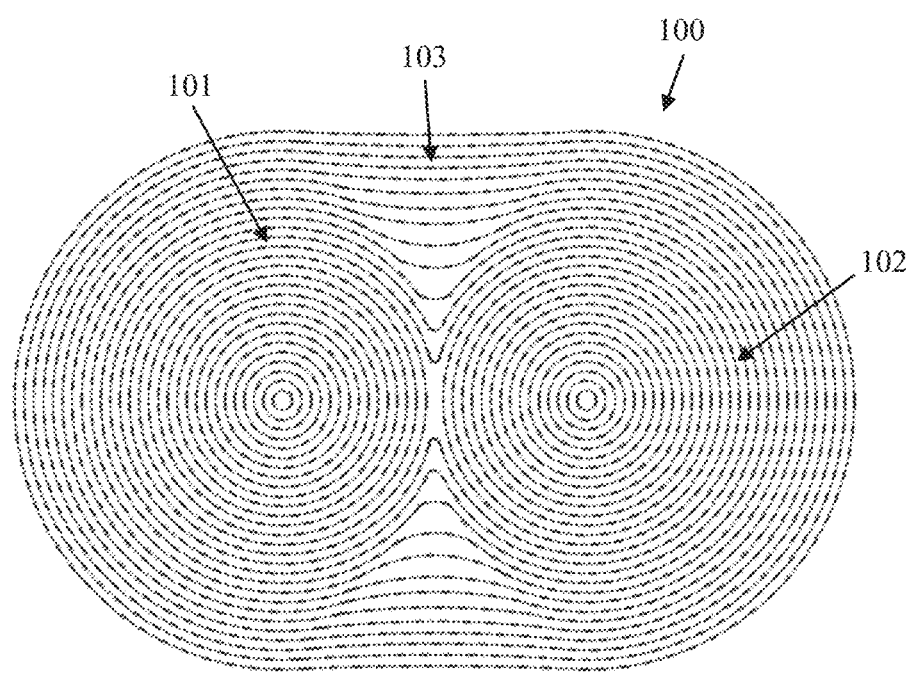
FIG. 1E shows a schematic of idealized connected multi-walled spherical fullerenes, according to some implementations.

The carbon nanoparticles and aggregates produced by any one or more of the reactors or reactor configurations described herein can be characterized by a well-ordered structure with high purity as illustrated by an idealized carbon nanoparticle 100 shown in FIG. 1E. The carbon allotrope in FIG. 1E contains two connected multi-walled spherical fullerenes (MWSFs) 101 and 102 with layers of graphene 103 coating the connected MWSFs 101 and 102. The allotrope shown in FIG. 1E is also core-less (such as does not contain a core of a material other than carbon at the center of the spherical fullerene). The nanoparticle shown in FIG. 1E has a relatively high uniformity since the ratio of MWSFs to graphene is high, is well-ordered since there are no point defects (such as missing carbon atoms) and no distorted carbon lattices. The nanoparticle also has a high purity since there are no elements (such as a core of impurities) other than carbon, in contrast with low uniformity mixtures of MWSFs mixed with other carbon allotropes, poorly-ordered MWSFs with many point defects and distorted lattices, and low purity MWSFs (such as with seed particles at the core). The connected MWSFs can contain a core. Alternatively, or in addition, the core can be a void, or a carbon-based material that is not an MWSF (such as amorphous carbon), or a seed that is not carbon-based.

The aggregates described herein can contain graphene, such as containing up to 15 layers, and one or more other carbon allotropes in addition to graphene, and have a ratio of graphene to other carbon allotropes from 20% to 80%, a high degree of order (such as a Raman signature with the ratio of the intensity of the 2D-mode peak to the G-mode peak greater than 0.5), and a high purity (such as the ratio of carbon to other elements, other than H, is greater than 99.9%). The ratio of graphene to other carbon allotropes can be from 5% to 95%, or from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. The particles produced using the methods described herein can contain graphite and other carbon allotropes, and do not contain a core composed of impurity elements other than carbon. In some cases, the aggregates of the particles have large diameters (such as greater than 10 microns across).

The aggregates described herein can contain graphene (such as containing up to 15 layers) and graphite (such as containing greater than 15 layers) and have a ratio of graphene to graphite from 20% to 80%, a high degree of order (such as a Raman signature with the ratio of the intensity of the 2D-mode peak to the G-mode peak greater than 0.5), and a high purity (such as the ratio of carbon to other elements, other than H, is greater than 99.9%). The ratio graphene to graphite can be from 5% to 95%, or from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. The particles can be produced using the methods described herein contain graphite and graphene, and do not contain a core composed of impurity elements other than carbon. In some cases, the aggregates of the particles have large diameters (such as greater than 10 microns across).

The aggregates described herein can contain graphene, MWSFs or connected MWSFs, and optionally graphite, and have a ratio of graphene to MWSF from 20% to 80%, a high degree of order (such as a Raman signature with ratio of the intensities of the D-mode peak to G-mode peak from 0.95 to 1.05), and a high purity (such as the ratio of carbon to other elements, other than H, is greater than 99.9%). The ratio of graphene to MWSFs or connected MWSFs can be from 5% to 95%, or from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. The particles produced using the methods described herein contain MWSFs or connected MWSFs, and the MWSFs do not contain a core composed of impurity elements other than carbon. The aggregates of the particles have large diameters (such as greater than 10 microns across).

The aggregates described herein can contain graphene, amorphous carbon, and optionally graphite, and have a ratio of graphene to amorphous carbon from 1% to 10%, and have a high purity (such as the ratio of carbon to other elements, other than H, is greater than 99.9%). The ratio of graphene to amorphous carbon can be from 5% to 95%, or from 1% to 90%, or from 1% to 80%, or from 1% to 60%, or from 1% to 40%, or from 1% to 20%, 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. The particles produced using the methods described herein can contain amorphous carbon, and do not contain a core composed of impurity elements other than carbon. In some cases, the aggregates of the particles have large diameters (such as greater than 10 microns across).

The carbon material can have a ratio of carbon to other elements, except hydrogen, greater than 60%, or greater than 70%, or greater than 80%, or greater than 90%, or greater than 99%, or greater than 99.5%, or greater than 99.7%, or greater than 99.9%, or greater than 99.95%.

The median size of the carbon aggregates can be from 1 micron to 50 microns, or from 2 microns to 20 microns, or from 5 microns to 40 microns, or from 5 microns to 30 microns, or from 10 microns to 30 microns, or from 10 microns to 25 microns, or from 10 microns to 20 microns. The size distribution of the carbon aggregates can have a 10th percentile from 1 micron to 10 microns, or from 1 micron to 5 microns, or from 2 microns to 6 microns, or from 2 microns to 5 microns. The size of the particles that make up the aggregates can vary in size and can be smaller than 10 nm or up to hundreds of nanometers in size. The nanoparticles that make up the aggregates have an average diameter in a range from 5 to 500 nm, or from 5 to 250 nm, or from 5 to 100 nm, or from 5 to 50 nm, or from 10 to 500 nm, or from 10 to 250 nm, or from 10 to 100 nm, or from 10 to 50 nm, or from 40 to 500 nm, or from 40 to 250 nm, or from 40 to 100 nm, or from 50 to 500 nm, or from 50 to 250 nm, or from 50 to 100 nm. The size of aggregates can be measured using TEM images. The size of the aggregates can be measured using a laser particle size analyzer (such as a Fritsch Analysette 22 MicroTec plus).

The surface area of the carbon aggregates, when measured using the Brunauer-Emmett-Teller (BET) method with nitrogen as the adsorbate (such as the "BET method using nitrogen", or the "nitrogen BET method") or the Density Functional Theory (DFT) method, can be from 50 to 300 m2/g, or from 100 to 300 m2/g, or from 50 to 200 m2/g, or from 50 to 150 m2/g, or from 60 to 110 m2/g, or from 50 to 100 m2/g, or from 70 to 100 m2/g. A carbon aggregate containing MWSFs or connected MWSFs, as defined above, can have high specific surface area. The carbon aggregate can have a BET specific surface area from 10 to 300 m2/g, or from 10 to 200 m2/g, or from 10 to 100 m2/g, or from 10 to 50 m2/g, or from 50 to 500 m2/g, or from 100 to 200 m2/g, or from 100 to 300 m2/g, or from 100 to 1000 m2/g.

The density of the carbon aggregates as-synthesized (such as upon exiting the microwave plasma reactor) can be less than 0.1 g/cm3, or less than 0.5 g/cm3, or less than 0.25 g/cm3, or less than 0.2 g/cm3, or less than 0.1 g/cm3, or less than 0.05 g/cm3, or from 0.01 g/cm3 to 1 g/cm3, or from 0.01 g/cm3 to 0.5 g/cm3, or from 0.01 g/cm3 to 0.25 g/cm3, or from 0.01 g/cm3 to 0.2 g/cm3, or from 0.01 g/cm3 to 0.1 g/cm3, or from 0.01 g/cm3 to 0.075 g/cm3, or from 0.01 g/cm3 to 0.05 g/cm3.

The carbon aggregates, when compressed (such as into a disk, pellet, etc.), and optionally annealed, have an electrical conductivity greater than 500 S/m, or greater than 1000 S/m, or greater than 2000 S/m, or from 500 S/m to 20,000 S/m, or from 500 S/m to 10,000 S/m, or from 500 S/m to 5000 S/m, or from 500 S/m to 4000 S/m, or from 500 S/m to 3000 S/m, or from 2000 S/m to 5000 S/m, or from 2000 S/m to 4000 S/m, or from 1000 S/m to 5000 S/m, or from 1000 S/m to 3000 S/m. In some cases, the density after compression is approximately 1 g/cm3, or approximately 1.2 g/cm3, or approximately 1.5 g/cm3, or approximately 2 g/cm3, or approximately 2.2 g/cm3, or approximately 2.5 g/cm3, or approximately 3 g/cm3. In some cases, compression pressure of 2000 psi to 12000 psi are used, and the compressed material can be annealed at temperatures from 500° C. and 1500° C., or from 800° C. to 1000° C.

A carbon aggregate containing MWSFs or connected MWSFs, as defined above, has high electrical conductivity. A carbon aggregate containing MWSFs or connected MWSFs, as defined above, is compressed into a pellet and the pellet has electrical conductivity greater than 500 S/m, or greater than 1000 S/m, or greater than 2000 S/m, or greater than 3000 S/m, or greater than 4000 S/m, or greater than 5000 S/m, or greater than 10000 S/m, or greater than 20000 S/m, or greater than 30000 S/m, or greater than 40000 S/m, or greater than 50000 S/m, or greater than 60000 S/m, or greater than 70000 S/m, or from 500 S/m to 100000 S/m, or from 500 S/m to 1000 S/m, or from 500 S/m to 10000 S/m, or from 500 S/m to 20000 S/m, or from 500 S/m to 100000 S/m, or from 1000 S/m to 10000 S/m, or from 1000 S/m to 20000 S/m, or from 10000 to 100000 S/m, or from 10000 S/m to 80000 S/m, or from 500 S/m to 10000 S/m. In some cases, the density of the pellet is approximately 1 g/cm3, or approximately 1.2 g/cm3, or approximately 1.5 g/cm3, or approximately 2 g/cm3, or approximately 2.2 g/cm3, or approximately 2.5 g/cm3, or approximately 3 g/cm3. Additionally, tests have been performed in which compressed pellets of the carbon aggregate materials have been formed with compressions of 2000 psi and 12000 psi and with annealing temperatures of 800° C. and 1000° C. The higher compression and/or the higher annealing temperatures generally resulted in pellets with higher electrical conductivity, including in a range of 10000 S/m to 15000 S/m.

The carbon nanoparticles and aggregates described herein are characterized by Raman spectroscopy to determine the species of carbon allotropes present, and their degree of order. The main peaks in the Raman spectra for graphite and graphene are the G-mode, the D-mode, and the 2D-mode. The G-mode peak has a wave number of approximately 1580 cm-1 and is attributed to the vibration of carbon atoms in sp2-hybridized carbon networks. The D-mode peak has a wave number of approximately 1350 cm-1 and can be related to the breathing of hexagonal carbon rings with defects. The 2D-mode peak is a second-order overtone of the D-mode and has a wave number of approximately 2690 cm-1.

The graphite- and graphene-containing carbon materials have a Raman spectrum (using 532 nm incident light) with a 2D-mode peak and a G-mode peak, and the 2D/G intensity ratio is greater than 0.2, or greater than 0.5, or greater than 1.

Raman spectroscopy can also be used to characterize the structure of MWSFs. When using 532 nm incident light, the Raman G-mode is typically at 1582 cm-1 for planar graphite but can be downshifted for MWSFs (such as to 1565-1580 cm-1). The D-mode is observed at approximately 1350 cm-1 in the Raman spectra of MWSFs. The ratio of the intensities of the D-mode peak to G-mode peak (such as the D/G intensity ratio) is related to the degree of order of the MWSFs, where a lower D/G intensity ratio indicates higher degree of order. A D/G intensity ratio near or below 1 indicates a relatively high degree of order, and a D/G intensity ratio greater than or equal to 1.2 indicates lower degree of order.

A carbon nanoparticle or a carbon aggregate containing MWSFs or connected MWSFs, as described herein, has a Raman spectrum with a first Raman peak at about 1350 cm-1 and a second Raman peak at about 1580 cm-1, when using 532 nm incident light. The ratio of an intensity of the first Raman peak to an intensity of the second Raman peak (such as the ID/IG, or the D/G intensity ratio) for the nanoparticles or the aggregates described herein is in a range from 0.95 to 1.05, or from 0.9 to 1.1, or from 0.8 to 1.2, or from 0.9 to 1.2, or from 0.8 to 1.1, or from 0.5 to 1.5, or less than 1.5, or less than 1.2, or less than 1.1, or less than 1, or less than 0.95, or less than 0.9, or less than 0.8. The carbon materials containing the MWSFs can have a Raman spectrum (using 532 nm incident light) with a D-mode peak and a G-mode peak, and the D/G intensity ratio is from 0.9 to 1.1, or less than about 1.2.

The carbon materials containing amorphous carbon have a Raman spectrum (using 532 nm incident light) with a 2D-mode peak, a D-mode peak and a G-mode peak, and the D/G intensity ratio can be greater than 0.5. The Raman spectrum also has a low intensity 2D-mode peak. The 2D-mode peak has an intensity less than approximately 30% of the G-mode peak intensity, or less than 20% of the G-mode peak intensity, or less than 10% of the G-mode peak intensity. The Raman spectrum has a D-mode peak and G-mode peak with a shallow valley between them. The minimum intensity of the shallow valley between the D-mode peak and the G-mode peak is greater than approximately 40% of the G-mode peak intensity, or greater than approximately 50% of the G-mode peak intensity, or greater than approximately 60% of the G-mode peak intensity.

One benefit of producing aggregates of carbon nanoparticles, particularly with diameters in the ranges described above, is that aggregates of particles greater than 10 microns are easier to collect than particles or aggregates of particles that are smaller than 500 nm. The ease of collection reduces the cost of manufacturing equipment used in the production of the carbon nanoparticles and increases the yield of the carbon nanoparticles. Additionally, particles greater than 10 microns in size pose fewer safety concerns compared to the risks of handling smaller nanoparticles, such as potential health and safety risks due to inhalation of the smaller nanoparticles. The lower health and safety risks, thus, further reduce the manufacturing cost.

Microwave Chemical Processing Systems

Figure 2A:
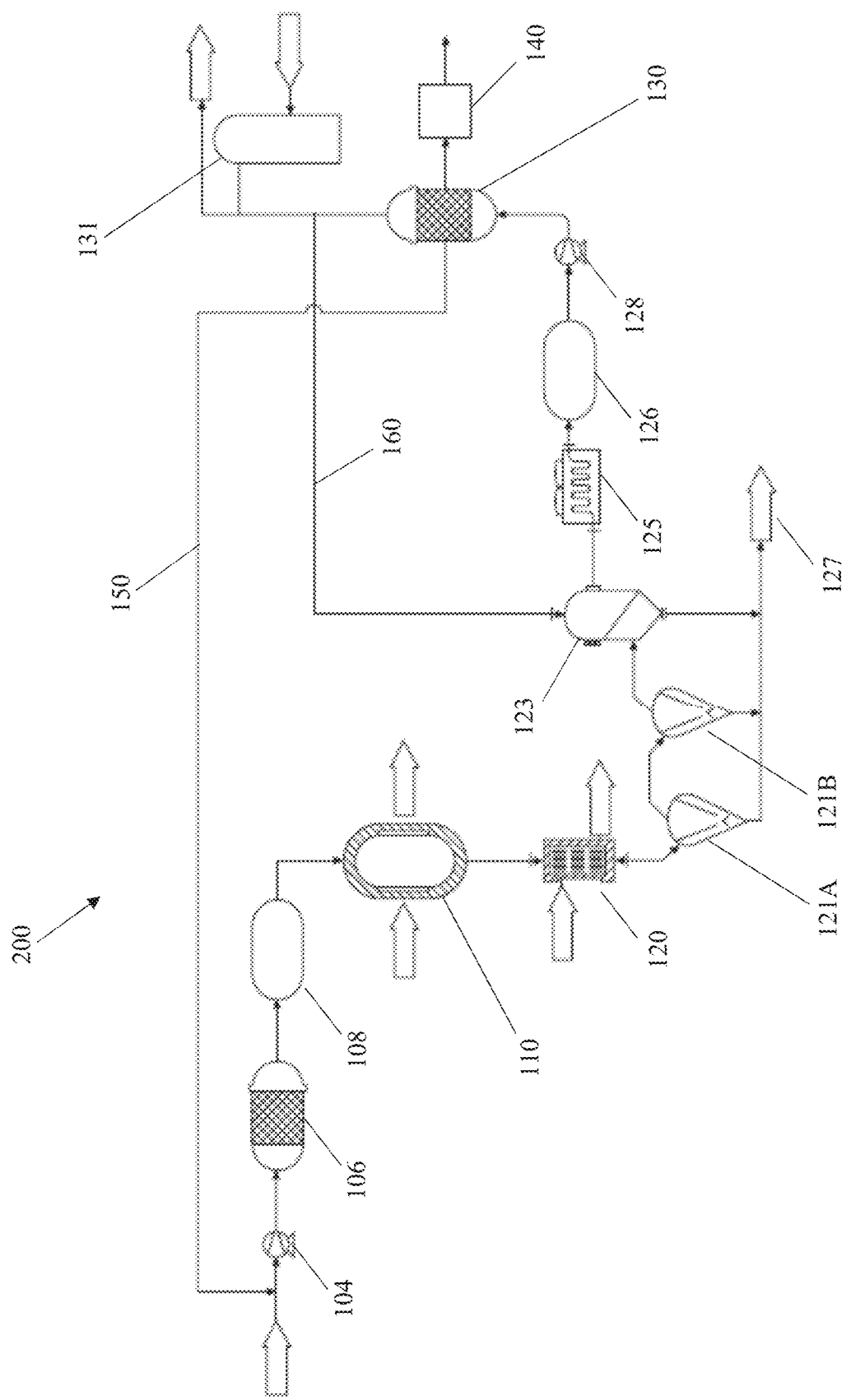
FIG. 2A shows a schematic of a microwave chemical processing system, according to some implementations.

FIG. 2A shows a schematic of a chemical processing system 200. The example shown in FIG. 2A is designed to convert natural gas into hydrogen gas and carbon particle separated products. The incoming natural gas (NG) is first compressed using a natural gas compressor 104. Next, water is removed from the compressed NG using one or more NG driers 106. Next the dried NG is stored in the NG receiver 108 to accommodate any flow difference between the NG flow entering the microwave chemical processing system 200 and the flow that is provided to the microwave plasma reactors 110. After the NG is pre-treated by the compressor 104, drier 106 and receiver 108, it is converted into hydrogen gas and carbon particles in one or more reactors 110, which may be configured to propagate a microwave energy into accumulated gaseous mixtures to generate a plasma. Hydrogen gas and carbon particles exiting the one or more reactors 110 are next cooled using an effluent cooler (heat exchanger) 120, in preparation for the gas-solids separation. The cooled hydrogen gas and carbon particles enter a first cyclone separator 121A, and then a second cyclone separator 121B.

After gas-solids separation by the cyclone separators, the hydrogen gas and carbon particles that have not been filtered out by the cyclone separators are further filtered by the back-pulse filter system 123. The back-pulse filter system 123 is also fed by a back-pulse gas line 160 to enable the cleaning of the filter elements within the back-pulse filter system 123. The carbon particles filtered by the cyclone separators 121A and 121B and filter system 123 are transported to a supersack for storage at arrow 127. The hydrogen with the carbon particles filtered out is then further cooled in the dry cooler 125. The hydrogen gas is stored in the $H_2$ accumulator 126 to accommodate any flow difference between the hydrogen gas flow exiting the dry cooler 125 and entering the subsequent system components, and then compressed in the $H_2$ compressor 128, before being purified in the pressure swing absorber (PSA) 130. The purified hydrogen gas is sent to the $H_2$ storage system 131, and the unpurified hydrogen that was rejected by the PSA 130 is sent to the flare 140 to be burned off.

The example system shown in FIG. 2A also includes a hydrogen recycling line 150. In this example, a hydrogen stream from the PSA 130 is routed back to the input of the compressor 104. Additionally, in this example system, the gas line 160 that supplies the back-pulse gas for cleaning the filter elements in the back-pulse filter system 123 is also provided from a hydrogen stream from the PSA 130.

Gases that are produced as separated components in the microwave chemical processing system can be recycled. For example, purified and/or unpurified hydrogen can be recycled from one location in the microwave chemical processing system to another location in the system. In some cases, the purified hydrogen from the PSA and/or unpurified hydrogen rejected by the PSA can be routed back to the microwave plasma reactor. The purified and/or unpurified hydrogen can be provided directly to the microwave plasma reactor, or it can be pre-treated (such as by a compressor, drier, or a purification system) before being provided to the microwave plasma reactor. In other cases, the purified hydrogen from the PSA and/or unpurified hydrogen rejected by the PSA can be routed back to the back-pulse filter to serve as the back-pulse gas.

The example system 200 shown in FIG. 2A has particular components chosen to facilitate the conversion of compressed NG into hydrogen gas and carbon particles. Systems for converting hydrocarbons (such as NG) into hydrogen and carbon particles may have additional components or may omit one or more of the components shown in the system in FIG. 2A. Where there are different input materials and/or separated components, the systems can have different components. For example, in microwave chemical processing systems for the conversion of biogas into hydrogen gas and carbon particles, the biogas can be pre-treated before being converted into hydrogen gas and carbon particles in the microwave plasma reactors. There are different compositions and purities of biogas, and in some cases water, carbon dioxide, hydrogen sulfide and/or other components of the biogas can be removed prior to conversion in the microwave plasma reactors. Several of the elements in the microwave chemical processing systems (similar to the example system shown in FIG. 2A) are described in greater detail below.

Microwave Chemical Processing Systems: Gas-Solid Separation Systems

Disclosed multi-stage gas-solid separator systems can include a first cyclone separator and a back-pulse filter system. In some cases, the first cyclone separator filters the carbon particles from the separated components, and the back-pulse filter system is coupled to the output of the first cyclone separator, such that the back-pulse filter system filters the carbon particles from the output from the first cyclone separator.

The first cyclone separator is designed to filter out the largest particles, and the back-pulse filter system is designed to filter out smaller particles. For example, the size of the majority of the carbon particles filtered by the first cyclone separator can be greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns; and the size of the majority of the carbon particles filtered by the back-pulse filter system are greater than 100 nm, or greater than 200 nm, or greater than 500 nm, or greater than 1 micron, or from 50 nm to 2 microns, or from 100 nm to 1 micron, or from 100 nm to 500 nm.

The first cyclone separator is designed to filter out a first fraction of the particles produced in the microwave plasma reactor, and the back-pulse filter system is designed to filter out a second fraction of particles. For example, greater than 30%, or greater than 40%, or greater than 50%, or greater than 60%, or greater than 70%, or greater than 80%, or greater than 90%, or greater than 95%, or greater than 99%, of the carbon particles are filtered after the separated components are filtered by the first cyclone separator, and greater than 80%, or greater than 90%, or greater than 95%, or greater than 99%, or greater than 99.5%, or greater than 99.9% of the carbon particles are filtered after the separated components are filtered by the first cyclone separator and the back-pulse filter system.

There can be more than one cyclone separator upstream of the back-pulse filter system. For example, the multi-stage gas-solid separator system can contain a second cyclone separator between the first cyclone separator and the back-pulse filter system, where the first cyclone separator filters out a first fraction of the carbon particles in the separated components, the second cyclone separator filters out a second fraction of carbon particles in the separated components, and the back-pulse filter system filters out a third fraction of carbon particles in the separated components.

Disclosed multi-stage gas-solid separation systems can contain multiple stages, where the first stage is designed to filter out the largest particles, and each subsequent stage is designed to filter out smaller particles than the preceding stage, such that the last stage is designed to filter out the smallest particles. For example, in the case of the gas-solids separation system containing a first cyclone separator, a second cyclone separator, and a back-pulse filter system, the particle sizes filtered by each stage can have various size ranges. For instance, the size of the majority of the carbon particles filtered by the first cyclone separator can be greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns. Furthermore, the size of the majority of the carbon particles filtered by the second cyclone separator can be greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns. And, the size of the majority of the carbon particles filtered by the back-pulse filter system are greater than 100 nm, or greater than 200 nm, or greater than 500 nm, or greater than 1 micron, or from 50 nm to 2 microns, or from 100 nm to 1 micron, or from 100 nm to 500 nm.

The multi-stage gas-solid separation system contains multiple stages, where the first stage is designed to filter out a first fraction of the particles produced in the microwave plasma reactor, and each subsequent stage is designed to filter out a subsequent fraction of particles. For example, in the case of the gas-solids separation system containing a first cyclone separator, a second cyclone separator, and a back-pulse filter system, the fractions of particles filtered by each stage can have various size ranges. For instance, in various embodiments, greater than 30%, or greater than 40%, or greater than 50%, or greater than 60%, or greater than 70%, or greater than 80%, or greater than 90%, or greater than 95%, or greater than 99%, of the carbon particles are filtered after the separated components are filtered by the first cyclone separator. Furthermore, greater than 30%, or greater than 40%, or greater than 50%, or greater than 60%, or greater than 70%, or greater than 80%, or greater than 90%, or greater than 95%, or greater than 99%, of the carbon particles are filtered after the separated components are filtered by the first cyclone separator and the second cyclone separator. And, greater than 80%, or greater than 90%, or greater than 95%, or greater than 99%, or greater than 99.5%, or greater than 99.9% of the carbon particles are filtered after the separated components are filtered by the first cyclone separator, the second cyclone separator, and the back-pulse filter system.

There can be advantages to different configurations in different embodiments. For example, in situations where the production rate of separated components from each microwave plasma reactor is high, it can be cost-effective to filter the separated products from each reactor in an individual gas-solid separation system. On the other hand, in situations where the production rate of the separated components from each microwave plasma reactor is low, it can be cost-effective to combine the flows from multiple microwave plasma reactors into an individual gas-solid separation system. Temperatures in microwave chemical processing systems can be high (such as greater than 500° C.), and as such, tend to generate products that are hot when exiting the reactor. Temperature of gas-solids separation system components (such as filters) can also be elevated to prevent gaseous species from condensing on the filters and the produced particles. For example, microwave chemical processing systems that produce carbon-containing particles and hydrogen gas from hydrocarbon input materials, also typically produce various reaction by-products including hydrocarbons. The hydrocarbon by-products boiling points can be from approximately 80° C. to approximately 400° C., or greater than 80° C., or greater than 300° C. The temperature of the gas-solid separation system can be tuned to produce captured particles with a desired concentration of hydrocarbons adsorbed on the captured particles. For example, the concentration by mass of adsorbed hydrocarbons can be from 1% to 20%, or from 1% to 10%, or from 1% to 5%, or from 0.1% to 20%, or from 0.1% to 10%, or from 0.1% to 5%, or from 0.1% to 1%, or from 0.01% to 20%, or from 0.01% to 10%, or from 0.01% to 5%, or from 0.01% to 1%, or from 0.01% to 0.1%.

The gas-solid separation system can be heated. In some cases, the one or more cyclone separators and back-pulse filter systems contained in the gas-solids separation systems are heated to a temperature from 100° C. to 600° C., or from 200° C. to 500° C., or from 300° C. to 500° C., or greater than 300° C., or greater than 400° C., or greater than 500° C.

The gas-solids separation system can additionally contain one or more heat exchangers. A first heat exchanger can be located between the output of the microwave reactor output, and the first cyclone separator input (such as between reactor 110 and cyclone separator 121A of FIG. 2A). This first heat exchanger can be used to cool the products from the microwave plasma reactor to a temperature suitable to filtration in the cyclone separators. For example, the output products from the microwave plasma reactor can have a temperature from 500° C. to 1500° C., and the cyclone separators and back-pulse filter system in the gas-solids separation system can operate at temperatures from 200° C. to 400° C. In such an example, a first heat exchanger can be used to cool the output products before entering the first cyclone separator in the gas-solids separation system.

A second heat exchanger can be used to cool the gas exiting the last particle filtration stage in the gas-solids separation system (such as after back-pulse filter 123 of FIG. 2A). In some cases, the gas will be cooled by this second heat exchanger to be accumulated, compressed, purified further, and/or stored.

The gas-solids separation systems described herein overcome shortcomings of conventional systems. The gas-solids separation systems described herein enable a high fraction of microwave plasma produced carbon-inclusive particles to be collected (such as greater than 99% of the particles in the separated components captured by the gas-solid separation system), even though the particles are small (such as median size less than 10 microns) and have low densities (such as less than 0.2 g/cm$^3$). Furthermore, the gas-solids separation systems can operate at high gas flows (such as greater than 5 slm) and maintain high collection efficiencies (such as greater than 99%). The gas-solids separation systems can also be integrated in-line with microwave plasma reactors without disturbing the environment within the reactor (such as the gas flows and oxygen levels). For example, the gas-solid separation systems described herein can achieve low pressure drops across the gas-solid separation systems (such as less than 0.5 psig, or from 0.5 to 10 psig pressure drop across the gas-solid separation system). These low-pressure drops can be achieved at high flow rates (such as greater than 5 slm) and with high collection efficiencies (such as greater than 99% of the particles in the separated components captured by the gas-solid separation system). Additionally, the components of the gas-solids separation systems are compatible with hot separated components output from the reactors. The gas-solid separation systems that include a cyclone separator followed by a back-pulse filter system are particularly advantageous, because such a system enables a large fraction of particles (such as greater than 99%) to be captured, without causing a large pressure drop across the gas-solid separation system. This contrasts with conventional systems that use a single back-pulse filter, which will experience large pressure drops as a large quantity of particles are captured in the filter element. The cyclone separators and back-pulse filter system within the gas-solids separation systems described herein are described in more detail below.

Cyclone Separators in Gas-Solid Separation Systems

The cyclone separators have a cylindrical and/or conical interior, an input, and an output. The input of the cyclone separators can be configured to receive a gas that contains a first particle concentration. The cylindrical and/or conical interior contains a rotating flow of gas and particles (such as a vortex) and uses rotational effects (such as vortex separation) to separate the particles from the gas. The output of the cyclone separators can be configured to expel a gas that contains a second particle concentration. Since some fraction of the particles are filtered by the cyclone separator, the second particle concentration is less than the first particle concentration. The cyclone separators additionally contain a solids collection port, through which the particles that are filtered by the cyclone separator can be removed. The solids collection port is connected to a load lock system, such that the particles that are filtered by the cyclone separator can be removed without exposing the interior of the cyclone separator to air. The solids collection ports of the cyclone separators are connected to a jacketed (such as cooled, or heated) hopper to store the collected particles. Solids collection ports of the cyclone separators are connected to a jacketed hopper, which is in turn connected to an additional particle storage unit (such as a vessel, a sack, a bag, or a supersack), which is used to store the collected particles and/or prepare for shipping. A mechanical system (such as conveyor, belt, auger, screw type of system, or piston push rod) is included in the cyclone separators to transport the filtered particles from the internal environment to the output, to aid in particle collection.

The cyclone separators in the gas-solids separation systems operate at flow rates from 0.1 ACFM (actual cubic feet per minute) to 100 ACFM, or from 0.1 ACFM to 50 ACFM, or from 0.1 ACFM to 10 ACFM, or from 1 ACFM to 100 ACFM, or from 1 ACFM to 50 ACFM, or from 10 ACFM to 100 ACFM, or from 10 ACFM to 50 ACFM, or greater than 1 ACFM, or greater than 10 ACFM, or greater than 20 ACFM. The cyclone separators in the gas-solids separation systems operate at temperatures from 80° C. to 550° C., or from 80° C. to 500° C., or from 80° C. to 450° C., or from 80° C. to 400° C., or from 80° C. to 350° C., or from 80° C. to 300° C., or from 80° C. to 250° C., or from 80° C. to 200° C., or from 100° C. to 550° C., or from 100° C. to 500° C., or from 100° C. to 450° C., or from 100° C. to 400° C., or from 100° C. to 350° C., or from 100° C. to 300° C., or from 100° C. to 250° C., or from 100° C. to 200° C., or greater than 80° C., or greater than 100° C., or greater than 200° C., or greater than 300° C., or greater than 400° C. The cyclone separators in the gas-solids separation systems operate at pressures from 0.1 psig (pounds per square inch gauge) to 300 psig, or from 0.1 psig to 200 psig, or from 0.1 psig to 100 psig, or from 0.1 psig to 10 psig, or from 1 psig to 300 psig, or from 1 psig to 200 psig, or from 1 psig to 100 psig, or from 1 psig to 10 psig, or from 10 psig to 200 psig, or from 10 psig to 100 psig, or greater than 0.1 psig, or greater than 1 psig, or greater than 10 psig, or greater than 100 psig. The cyclone separators in the gas-solids separation systems operate at pressure drops (such as pressure difference between the input and the output) from 0.1 psig to 10 psig, or from 0.1 psig to 5 psig, or from 1 psig to 10 psig, or from 1 psig to 5 psig, or greater than 0.1 psig, or greater than 1 psig, or greater than 3 psig, or greater than 5 psig. The length (such as the dimension approximately aligned with the axis of the vortex) of the interior of the cyclone separator is from 0.1 m to 10 m, or from 0.1 m to 5 m, or from 0.1 m to 2 m, or from 0.1 m to 1 m, or from 0.1 m to 0.5 m, or from 0.5 m to 10 m, or from 0.5 m to 5 m, or from 0.5 m to 2 m, or from 0.5 m to 1.5 m, or greater than 0.1 m, or greater than 0.2 m, or greater than 0.5 m, or greater than 1 m, or greater than 1.5 m, or greater than 2 m, or greater than 5 m.

The diameter of the cylindrical and/or conical interior of the cyclone separator is from 1 cm to 50 cm, or from 1 cm to 20 cm, or from 1 cm to 10 cm, or from 5 cm to 50 cm, or from 5 cm to 30 cm, or from 5 cm to 20 cm, or from 5 cm to 10 cm, or greater than 1 cm, or greater than 5 cm, or greater than 10 cm, or greater than 20 cm.

The cyclone separators described herein enable a high fraction of microwave plasma produced particles to be collected (such as greater than 90%), even though the particles are small (such as median size less than 10 microns) and have low densities (such as less than 0.2 g/cm3). Furthermore, the cyclone separators can operate at high gas flows (such as greater than 5 slm) and maintain high collection efficiencies (such as greater than 90%). The cyclone separators can also be integrated in-line with microwave plasma reactors without disturbing the environment within the reactor (such as the gas flows and oxygen levels). Additionally, the cyclone separators are compatible with hot separated components output from the reactors.

Back-Pulse Filter Systems in Gas-Solid Separation Systems

The back-pulse filter systems contain back-pulse filters, each back-pulse filter with an interior containing one or more filter elements, a filtering input, and a filtering output. The filtering input of the back-pulse filters can be configured to receive a gas that contains a first particle concentration in the upstream direction of the filter element. The filter element contains pores to separate the particles from the gas. The filtering output of the back-pulse filters can be configured to expel a gas from the downstream side of the filter element that contains a second particle concentration. Since some fraction of the particles are filtered by the back-pulse filter, the second particle concentration is less than the first particle concentration. The back-pulse filters additionally contain a solids collection port, through which the particles that are filtered by the back-pulse filter can be removed. The solids collection port is connected to a load lock system, such that the particles that are filtered by the back-pulse filter can be removed without exposing the interior of the back-pulse filter to air. The solids collection ports of the back-pulse filter are connected to a jacketed (such as cooled, or heated) hopper to store the collected particles. Solids collection ports of the back-pulse filter are connected to a jacketed hopper, which is in turn connected to an additional particle storage unit (such as a vessel, a sack, a bag, or a supersack), which is used to store the collected particles and/or prepare for shipping. A mechanical system (such as conveyor, belt, auger, screw type of system, or piston push rod) is included in the back-pulse filter to transport the filtered particles from the internal environment to the output, to aid in particle collection.

The back-pulse filter system can contain one or more back-pulse filters, and a valve system for directing flow through the one or more back-pulse filters in forward or reverse directions. Each back-pulse filter in the system can be in a filtering state or a cleaning state. During the filtering state, the gas and particle mixture is flowing through filter elements inside the back-pulse filters in a forward direction (such as from the upstream to the downstream side of the filter element). The filter elements can be porous, such as sintered particles, a screen or mesh, and the particles can be filtered out of the mixture and be captured in the pores of the filter elements. The particles that are captured in the pores of the filter elements inside of the back-pulse filters can be dislodged by directing gas flow through the filter elements in the reverse direction (such as from the downstream to the upstream side of the filter element).

The back-pulse filters can contain one or more additional ports configured to aid in the cleaning process. For example, one or more back-pulse inputs can be configured to receive a back-pulse gas pulse into the back-pulse filter interior, which is used to dislodge the particles captured in the filter element. Since the back-pulse pulse is used to dislodge the particles in the filter, the back-pulse input(s) are located at the downstream side of the filter element, and direct the back-pulse gas through the filter element from the downstream to the upstream side. One or more back-pulse outputs can be configured to emit a back-pulse gas pulse from the upstream side of the filter element, after it has dislodged the particles captured in the filter element. When the back-pulse filter is in the cleaning state, the filtering input(s) and filtering output(s) are closed (such as using valves), and the back-pulse input(s) and output(s) are open. Conversely, when the back-pulse filter is in the filtering state, the filtering input(s) and filtering output(s) are open (such as using valves), and the back-pulse input(s) and output(s) are closed.

A plurality of back-pulse filters is arranged in parallel such that a first back-pulse filter of the plurality of back-pulse filters can be in the cleaning state while other back-pulse filters of the plurality of back-pulse filters are in the filtering state. This enables the overall back-pulse filter system to continuously filter particles from the microwave plasma reactor, without having to stop particle production to clean the filters. The number of back-pulse filters arranged in parallel can be from, for example, 2 to 10, and the number of back-pulse filters in the filtering state and the cleaning state can change throughout a processing run. The duration of the back-pulse gas pulse into the back-pulse filter interior, used to dislodge the particles captured in the filter element, is approximately 1 second, or 2 seconds, or 5 seconds, or 10 seconds, or greater than 1 second, or greater than 2 seconds, or greater than 10 seconds. The back-pulse filter can be cleaned without using the valve system to isolate the back-pulse filter from the reactor. The back-pulse gas pulse can be prevented from interacting with the rest of the system (such as the reactor and other components of the gas-solid separation system) by isolating the back-pulse filter during cleaning (such as using a system of valves, and other back-pulse filters in parallel).

The back-pulse filter can be isolated from the rest of the gas-solid separation system (such as using a system of valves) to allow the collected carbon particles to cool before being moved to a subsequent component of the system (such as for storage).

Additionally, the total pressure drop across the back-pulse filter system is managed using systems with a plurality of back-pulse filters arranged in parallel. For example, a system of valves can be used to select one or more back-pulse filters to operate, while one or more other back-pulse filters are isolated. The number of filters in the filtering state and the cleaning state can be chosen to create a certain pressure drop across the back-pulse filter system.

The filter elements in the back-pulse filters contain porous metal materials (such as porous stainless steel, sintered stainless steel, etc.), or porous ceramic materials, or a polymer (such as polyimide). The pore size of the filter elements in the back-pulse filters is greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns.

The back-pulse filters (in the back-pulse filtration systems) in the gas-solids separation systems operate at flow rates from 0.1 ACFM (actual cubic feet per minute) to 100 ACFM, or from 0.1 ACFM to 50 ACFM, or from 0.1 ACFM to 10 ACFM, or from 1 ACFM to 100 ACFM, or from 1 ACFM to 50 ACFM, or from 10 ACFM to 100 ACFM, or from 10 ACFM to 50 ACFM, or greater than 1 ACFM, or greater than 10 ACFM, or greater than 20 ACFM. The back-pulse filters in the gas-solids separation systems operate at temperatures from 80° C. to 550° C., or from 80° C. to 500° C., or from 80° C. to 450° C., or from 80° C. to 400° C., or from 80° C. to 350° C., or from 80° C. to 300° C., or from 80° C. to 250° C., or from 80° C. to 200° C., or from 100° C. to 550° C., or from 100° C. to 500° C., or from 100° C. to 450° C., or from 100° C. to 400° C., or from 100° C. to 350° C., or from 100° C. to 300° C., or from 100° C. to 250° C., or from 100° C. to 200° C., or greater than 80° C., or greater than 100° C., or greater than 200° C., or greater than 300° C., or greater than 400° C. The back-pulse filters in the gas-solids separation systems operate at pressures from 0.1 psig (pounds per square inch gauge) to 300 psig, or from 0.1 psig to 200 psig, or from 0.1 psig to 100 psig, or from 0.1 psig to 10 psig, or from 1 psig to 300 psig, or from 1 psig to 200 psig, or from 1 psig to 100 psig, or from 1 psig to 10 psig, or from 10 psig to 200 psig, or from 10 psig to 100 psig, or greater than 0.1 psig, or greater than 1 psig, or greater than 10 psig, or greater than 100 psig. The back-pulse filters in the gas-solids separation systems operate at pressure drops (such as pressure difference between the input and the output) from 0.1 psig to 10 psig, or from 0.1 psig to 5 psig, or from 1 psig to 10 psig, or from 1 psig to 5 psig, or greater than 0.1 psig, or greater than 1 psig, or greater than 3 psig, or greater than 5 psig.

The back-pulse filter systems described herein enable a high fraction of microwave plasma produced particles to be collected (such as greater than 99%), even though the particles are small (such as median size less than 1 microns) and have low densities (such as less than 0.2 g/cm3). Furthermore, the back-pulse filter systems can operate at high gas flows (such as greater than 5 slm) and maintain high collection efficiencies (such as greater than 90%). The back-pulse filter systems can also be integrated in-line with microwave plasma reactors without disturbing the environment within the reactor (such as the gas flows and oxygen levels). Additionally, the back-pulse filter systems are compatible with hot separated components output from the reactors. The back-pulse filter systems described herein also enable truly interruption-free continuous operation by combining more than one back-pulse filters in parallel configured with a system of valves that allow some filters to be filtering while others are being cleared with back-pulses.

Chemical Processing Systems: Gas Production

Chemical processing systems produce gases, and the gaseous products are cooled, compressed, and/or purified prior to storage. The gaseous product produced is hydrogen, with a purity of greater than 90%, or greater than 95%, or greater than 99%, or greater than 99.5%, or greater than 99.9%, or greater than 99.95%, or greater than 99.99%, or greater than 99.999%. In some cases, the hydrogen upon exiting the reactor, or upon exiting the gas-solids separation system (if present) has a purity level that may require additional purification to meet the required hydrogen gas final product specifications.

Hydrogen gas is produced, and after exiting the microwave plasma reactor, or after exiting the gas-solids separation system (if present), the hydrogen gas is cooled (such as using a dry cooler), accumulated (such as in an hydrogen gas accumulator), compressed (such as in a hydrogen gas compressor), and purified (such as in a pressure-swing absorber, dense polymer membrane purifier, micro-porous ceramic purifier, dense metallic purifier, porous carbon purifier, dense ceramic purifier, or cryogenic purifier) before storing (such as in a hydrogen gas storage system).

Skid Integration

The microwave chemical processing systems described herein can be integrated into modular process skid, such as a process system contained within a frame that allows the process system to be easily transported. Such skids can contain complete process systems, and multiple process skids can be combined to create larger process systems or entire portable plants. Process skids have some advantages compared to traditional construction where process system parts are shipped individually and installed incrementally at the manufacturing site. Process skids can also provide parallel construction advantages since the process systems are built off-site in a fabrication facility while other upgrades are completed at the plant site simultaneously.

Figure 2B:
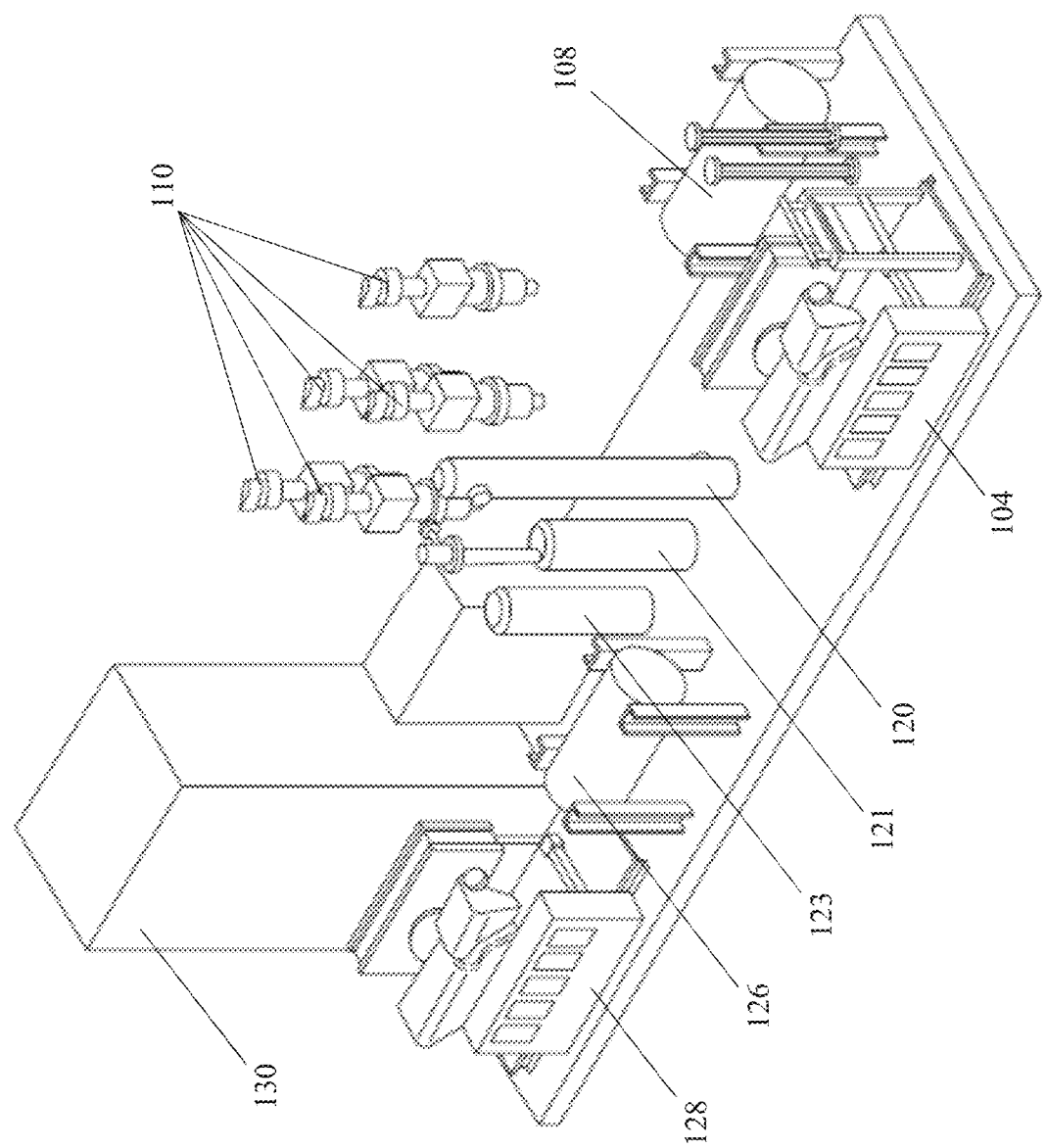
FIG. 2B shows a schematic of a microwave chemical processing system integrated into a skid according to some implementations.

FIG. 2B shows an example of a microwave chemical processing system integrated into a skid. The elements shown in FIG. 2B correspond to the same elements in the system diagram in FIG. 2A. The natural gas (NG) compressor 104, the NG accumulator 108, the microwave plasma reactors 110, the effluent cooler (such as a heat exchanger) 120, a cyclone separator 121, the back-pulse filter system 123, the $H_2$ accumulator 126, the $H_2$ compressor 128, and the pressure swing absorber (PSA) 130, are all shown in the figure, approximately to scale and in the locations required for skid integration. A cyclone separator 121 and a back-pulse filter system 123 are configured with hoppers in FIG. 2B, for storing the carbon particles filtered by the cyclone separators and back-pulse filter systems. Other components of the microwave chemical processing system that are integrated into the skids are not shown for simplicity.

Some components of the microwave chemical processing systems described herein are required to be located away from the skid, for example on an external pad. One example of such components are the microwave generator power sources, which can be required to be located some distance (such as greater than 15 feet) away from the skids in certain applications.

The microwave chemical processing system is integrated into a skid, and the skid is used in a local (such as point of use) application, such as an application where the input materials are produced in the same location as the skid, and/or where the separated components are utilized in the same location as the skid. For example, a microwave chemical processing system integrated into a skid can be located at a landfill, and the skid can convert the locally produced methane (or biogas) into higher value products (such as hydrogen gas and carbon particles). As another example, a microwave chemical processing system integrated into a skid can be located at an oil refinery, and the skid can produce hydrogen from hydrocarbons, and the hydrogen can be utilized for oil refining. The microwave chemical processing system is integrated into a skid, and the skid is used in a regional or remote application, such as an application where the input materials are produced in a different location from the skid, and/or where the separated components are utilized in a different location from the skid. For example, a number of a microwave chemical processing systems integrated into skids can be co-located at a regional site, where input materials (such as hydrocarbons) are delivered to the regional site and the separated components (such as hydrogen gas and carbon particles) are shipped to other locations for utilization (such as compressed hydrogen gas to power hydrogen fuel cells, or particulate carbon as a tire additive).

Microwave Reactors

The carbon particles, nanoparticles, aggregates and materials described herein can be produced using microwave plasma reactors and methods, such as any appropriate microwave reactor and/or method described in U.S. patent application Ser. No. 15/351,858, entitled "Microwave Chemical Processing," or in U.S. patent application Ser. No. 15/428,474, now issued as U.S. Pat. No. 9,767,992, and entitled "Microwave Chemical Processing Reactor," which are assigned to the same assignee as the present application, and are incorporated herein by reference as if fully set forth herein for all purposes Microwave plasma chemical processing of process materials (such as hydrocarbon gases, or liquid mixtures) is used to produce solid particles and gaseous products (such as the carbon particles, nanoparticles and aggregates described herein and hydrogen). More specifically, microwave plasma chemical processing of precursor materials using various techniques, including pulsing of the microwave radiation to control the energy of the plasma, can be used to produce solid particles and gaseous products (such as the carbon particles, nanoparticles and aggregates described herein and hydrogen. Disclosed reactors and reactor configurations provide for precise control of microwave energy applied to the plasma to correspondingly enable selection of one or more reaction pathways in conversion of supplied precursor materials into specific desired separated components, such as three-dimensional multi-modal carbon-based particles featuring micro- and meso-porous pathways formed therein. Microwave radiation applied in one or more sequences of discrete pulses can be used to control an amount of microwave energy applied to the plasma since short-lived high-energy gaseous or plasma-based species that are created when a plasma ignites can be re-generated at the onset of each new pulse. Accordingly, energy levels prevalent within the plasma can be carefully controlled to have a lower overall average ion energy than conventional techniques, but still be maintained at a high enough level to enable targeted chemical reactions to occur at high precursor material flows and high pressures.

Conventional microwave plasma chemical processing systems using pulsed microwave radiation to control the energy of the plasma have very high cracking efficiency, in excess of 90%. These conventional systems, however, use low gas flow rates, below 1 standard liter per minute (slm), and small gas volumes within the plasma, with a consequence that the production rate is low, and the production cost is high. These conventional systems cannot increase the gas flow rate and the gas volume within the plasma while using high frequency microwave pulsing (such as above approximately 100 Hz) because the plasma cannot ignite fast enough to keep up with the pulses when a large volume and high flow of gas is used.

In contrast to previously developed systems, a microwave plasma can be generated in a supply gas and/or precursor material, and the energy in the plasma is sufficient to form separated components, including the carbon nanoparticles and aggregates described herein, from precursor material molecules. A source of microwave radiation is coupled to a reaction chamber, the plasma is generated along a first portion of the length of the reaction chamber, and the precursor material is separated into components, including the carbon nanoparticles and aggregates described herein, along a second portion of the length of the reaction chamber. The microwave radiation is coupled directly into the plasma and not through a dielectric wall as in conventional methods.

Regarding microwave plasma chemical processing of precursor materials to produce solid particles and gaseous products (such as the carbon particles, nanoparticles and aggregates described herein and hydrogen), pulsed microwave radiation can be supplied through a waveguide having a length, where the microwave radiation propagates in a direction along the waveguide. A pressure within the waveguide is at least 0.1 atmosphere. A supply gas is provided into the waveguide at a first location along a length of the waveguide, where a majority of the supply gas flows in the direction of the microwave radiation propagation. A plasma can generated in, or from, the supply gas in at least a portion of the length of the waveguide, and a precursor material (such as a process gas, or a liquid precursor) is added into the waveguide at a second location downstream from the first location. A majority of the precursor material flows in the direction of the microwave propagation at a rate greater than 5 slm, or greater than 5 L/min for liquid mixtures. An average energy of the plasma is controlled to convert the precursor material into separated components, including the carbon nanoparticles and aggregates described herein, by controlling at least one of a pulsing frequency of the pulsed microwave radiation, where the pulsing frequency is greater than 500 Hz; and a duty cycle of the pulsed microwave radiation, where the duty cycle is less than 90%.

Microwave plasma chemical processing systems include a waveguide having a first gas inlet, a second gas inlet downstream of the first gas inlet, and a length. The first inlet is configured to receive a supply gas, and the second inlet is configured to receive a precursor materials (such as a process gas, or a liquid mixture). A pulsed microwave radiation source is coupled to the waveguide to generate a plasma in the supply gas, where the microwave radiation propagates in a direction along the length of the waveguide to react with the precursor material. The microwave radiation source is configured to pulse microwave radiation on and off at a frequency from 500 Hz to 1000 kHz and with a duty cycle less than 90%. The majority of the flow of the supply gas and the majority of the flow of the precursor material are parallel to the direction of the microwave propagation. The flow of the process gas is greater than 5 slm, and the waveguide is configured to accommodate pressures of at least 0.1 atmosphere.

The waveguides of the microwave chemical processing reactors of the present disclosure are field-enhancing waveguides that enable high throughputs of an input material to be processed, where the waveguide itself can serve or act as a chemical reaction chamber and/or reactor rather than requiring placement of to-be-processed material in a quartz chamber positioned separate to the microwave energy waveguide, as encountered in conventional systems. The design of disclosed reactor systems can provide for a relatively large volume for chemical reactions to occur while concurrently reducing the impact of particulate build-up and the amount of accumulated particulate matter on the walls of the reaction chamber. Particulate build-up on the quartz walls in conventional systems reduces the efficiency of the chemical processing since the microwave energy must penetrate the quartz walls in which the processed gas is contained. In the present systems, the microwave energy is propagated in a waveguide that serves as the reaction chamber for the processed material, and thus the microwave energy will not be hindered by particulate that may be deposited onto the walls of the chamber (such as waveguide).

As used herein, the term "field-enhancing waveguide" (FEWG) refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The field-enhancing zone can change cross-sectional area in a continuous manner (such as linearly, or non-linearly) or an abrupt manner (such as through one or more discrete steps). The pressure within the FEWGs and/or in the reaction zone of the reactor are from 0.1 atm to 10 atm, or from 0.5 atm to 10 atm, or from 0.9 atm to 10 atm, or greater than 0.1 atm, or greater than 0.5 atm, or greater than 0.9 atm.

Figure 3A:
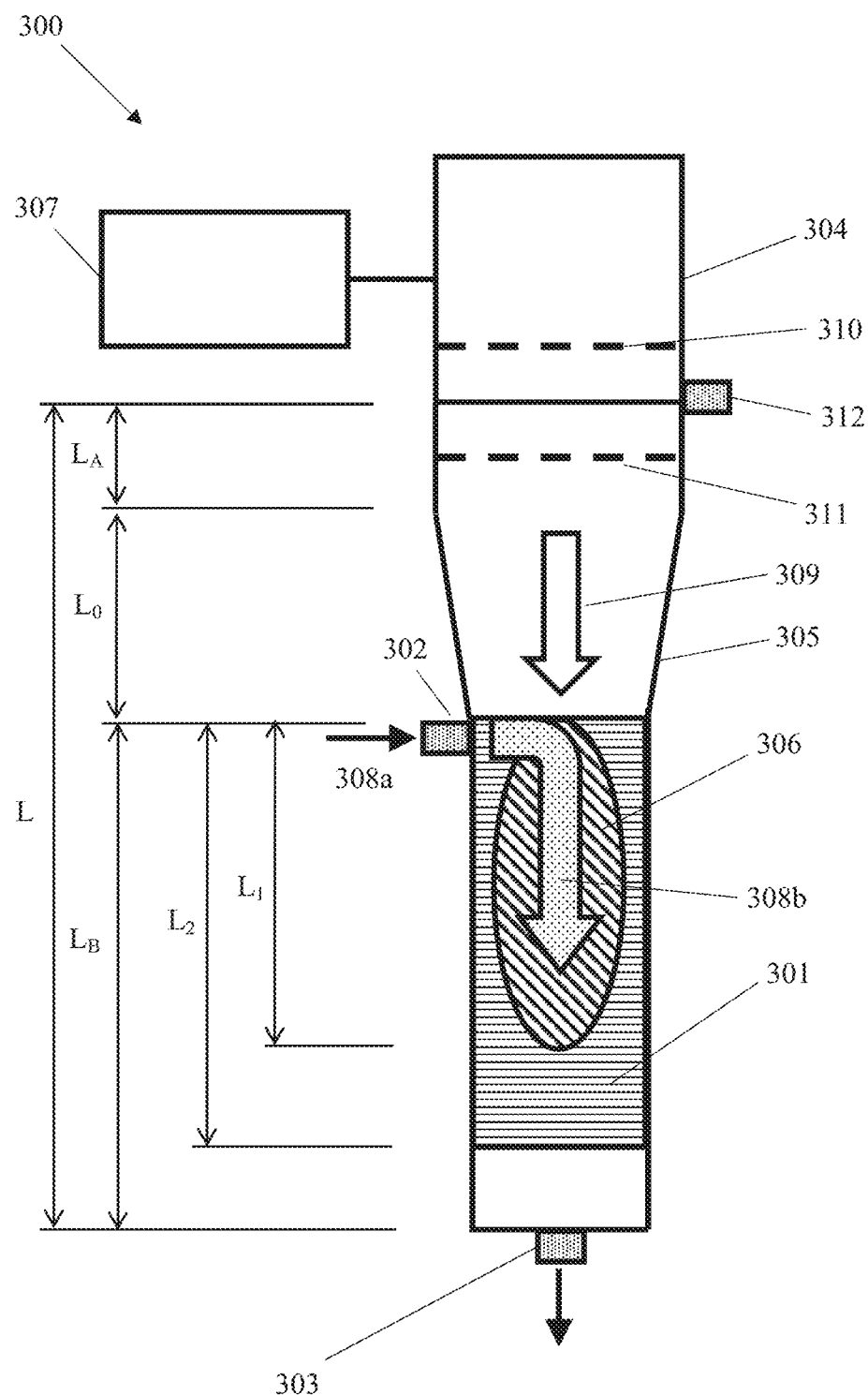
FIG. 3A shows a simplified vertical cross-section of a microwave plasma reactor according to some implementations.

FIG. 3A shows a microwave chemical processing system in which a FEWG is coupled to a microwave energy generator (such as a microwave energy source). A plasma is generated from a supply gas in a plasma zone of the FEWG, and a reaction length of the FEWG serves as the reaction zone to separate the process material into separate components. The present reactor as demonstrated by FIG. 3A lacks a dielectric barrier between the field-enhancing zone of the field-enhancing waveguide and the reaction zone. In contrast, reaction zones of conventional systems are typically enclosed within a dielectric barrier such as a quartz chamber as discussed earlier. The direction of propagation of the microwave energy is at least substantially parallel to the majority of the flow of the supply gas and/or the process material, such as precursor material, and the microwave energy enters the waveguide upstream of the portion of the FEWG where the separated components are generated.

As shown in FIG. 3A, a microwave chemical processing reactor 300 generally includes a FEWG 305, one or more inlets 302 configured to receive supply gas and/or process material 308a flowing into the FEWG 305, and a microwave energy source 304 that is coupled to the FEWG 305, among other elements not shown for simplicity. The "process material" can also be referred to as the "input material", the "precursor material", or the "process gas". The inlets 302 can be designed to accommodate gaseous or liquid mixture precursor materials. In the case of liquid precursors, the inlet 302 can include an atomizer (or other assembly) to effectively disperse the liquid precursor in the reactor. A bubbler can be used to vaporize a liquid, and the vapor provided to the inlet 302. Microwave circuit 307 controls a pulsing frequency at which microwave energy 309 from microwave energy source 304 is pulsed. The microwave energy 309 from microwave energy source 304 is continuous wave.

The FEWG 305 has a length L. The portion of the FEWG 305 with length LA (shown in FIG. 3A) is closer to the microwave energy generator than the portion of the FEWG with length LB (shown in FIG. 3A). Throughout this disclosure, different zones, portions and/or geometries of the FEWG will be described by a capital L with a subscript denoting the certain portion of the FEWG (such as $L_A$, $L_0$, $L_B$, $L_1$, $L_2$), and synonymously, the lengths of the different portions of the FEWG will also be described by a capital L with a subscript denoting the length of a certain portion of the FEWG (such as $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$, is located between lengths $L_A$ and $L_B$ of the FEWG and has a decreasing cross-sectional area along the path of the microwave energy propagation. The decrease in cross-sectional area serves to concentrate the electric field, thus increasing the microwave energy density while still providing a significant amount of area in which plasma can be formed compared to conventional systems. The portion of the FEWG with length $L_B$ (shown in FIG. 3A) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 305 are set according to the microwave frequency, in order to properly function as a waveguide. For example, for an elliptical waveguide the cross-sectional dimensions can be 5.02 inches by 2.83 inches for 2.1-2.7 GHz.

In conventional microwave plasma materials processing systems, the limited region in which plasma can form, such as less than one square inch as described above, can function to excessively constrain the volume in which gas reactions can occur. Also, as commonly encountered in conventional systems, microwave energy enters a reaction chamber through a window typically made of quartz. In conventional systems, dielectric materials (such as particulate carbon) are coated on the quartz window during processing which can thus lead to a decreased power delivery over time. This phenomena can be highly problematic if these separated components absorb microwave energy because they can prevent the microwave energy from effectively propagating into the reaction chamber to excite gaseous mixtures contained therein to generate the plasma. Consequently, a rapid build-up of by-products, such as carbon particles that are produced from the gas reactions, occurs, and limits the run-time of the processing equipment. The system 300 described below can be designed without the use of a window in the reaction zone; that is, using a parallel propagation type gas flow system where input microwave energy enters upstream from a reaction zone or area. As a result, more energy and power can be coupled into the plasma from the microwave energy source. The lack of a window and the greater volume within the waveguide 305, compared to limited reaction chamber volumes in conventional systems, greatly reduces particle accumulation, which in turn usually cases limited run-times, and therefore improves overall production efficiency of the microwave processing system.

The microwave energy 309 in FIG. 3A creates a microwave plasma 306 in the supply gas and/or process material within a plasma zone with length $L_1$ (shown in FIG. 3A) of the length of the FEWG 305. The plasma zone with length $L_1$ is located within the portion of the FEWG $L_B$, where the cross-sectional area is smaller, and the energy density of microwave energy propagated therein is higher than in length $L_A$. A supply gas that is different from the process material is used to generate the microwave plasma 306. The supply gas may be, for example, hydrogen, helium, nitrogen, a noble gas such as argon, or mixtures of more than one type of gas. The supply gas is the same as the process material, where the process material is the material from which separated components are being created.

The supply gas and/or process material inlet 302 is located upstream from the portion of the FEWG $L_B$, or is located within the portion of the FEWG $L_0$, or is located within the portion of the FEWG $L_A$, or is located upstream of the portion of the FEWG $L_A$. The portion of the FEWG $L_1$ extends from a position along the FEWG downstream from the position where the supply gas and/or process material 308a enters the FEWG, to the end of the FEWG or to a position between the entrance of the supply gas and/or process material and the end of the FEWG 305. The portion of the FEWG $L_1$ extends from where the supply gas and/or process material 308a enters the FEWG, to the end of the FEWG or to a position between the entrance of the supply gas and/or process material and the end of the FEWG.

The generated plasma 306 provides energy for reactions to occur in process material 308b within a reaction zone 301 of the FEWG 305 having a reaction length $L_2$. Reaction zone $L_2$ extends from where the process material 308a enters the FEWG 305, to the end of the FEWG 305 or to a position between the entrance of the process material and the end of the FEWG 305. Provided sufficient operating conditions set by, for example, a user and/or a control system controlling the FEWG 305, the energy in the plasma 306 will be sufficient to form separated components from the process material molecules. One or more outlets 303 are configured to collect the separated products out of the FEWG 305 downstream of the reaction zone portion 301 of the FEWG where reactions occur in the process material 308b. In the example shown in FIG. 3A, the propagation direction of the microwave energy 309 is parallel with the majority of the supply gas and/or process material flow 308b, and the microwave energy 309 enters the FEWG 305 upstream of the reaction zone 301 of the FEWG where the separated components are generated.

A pressure barrier 310 that is transparent to, such as allowing for unimpeded flow-through, microwave energy can be located within the microwave energy source 304, near the outlet of the microwave energy source, or at other locations between the microwave energy source 304 and the plasma 306 produced in the FEWG. This pressure barrier 310 can serve as a safety measure to protect from potential backflow of plasma into the microwave energy source 304. Plasma does not form at the pressure barrier itself. Rather, the pressure barrier is simply a mechanical barrier. Some examples of materials that the pressure barrier can be made of are quartz, ethylene tetrafluoroethylene (ETFE), other plastics, or ceramics. There can configurations of the FEWG with two pressure barriers 310 and 311, where one or both pressure of the barriers 310 and 311 are within the microwave energy source 304, near the outlet of the microwave energy source, or at other locations between the microwave energy source 304 and the plasma 306 produced in the FEWG. The pressure barrier 311 is closer to the plasma 306 in the FEWG than the pressure barrier 310, and there is a pressure blowout port 312 between the pressure barriers 310 and 311 in case the pressure barrier 311 fails.

The local impedance within the FEWG is tailored using filaments, point sources, electrodes and/or magnets. Filaments, point sources, electrodes and/or magnets are used to increase the density plasma within the reaction zone of the FEWG.

Figure 3B:
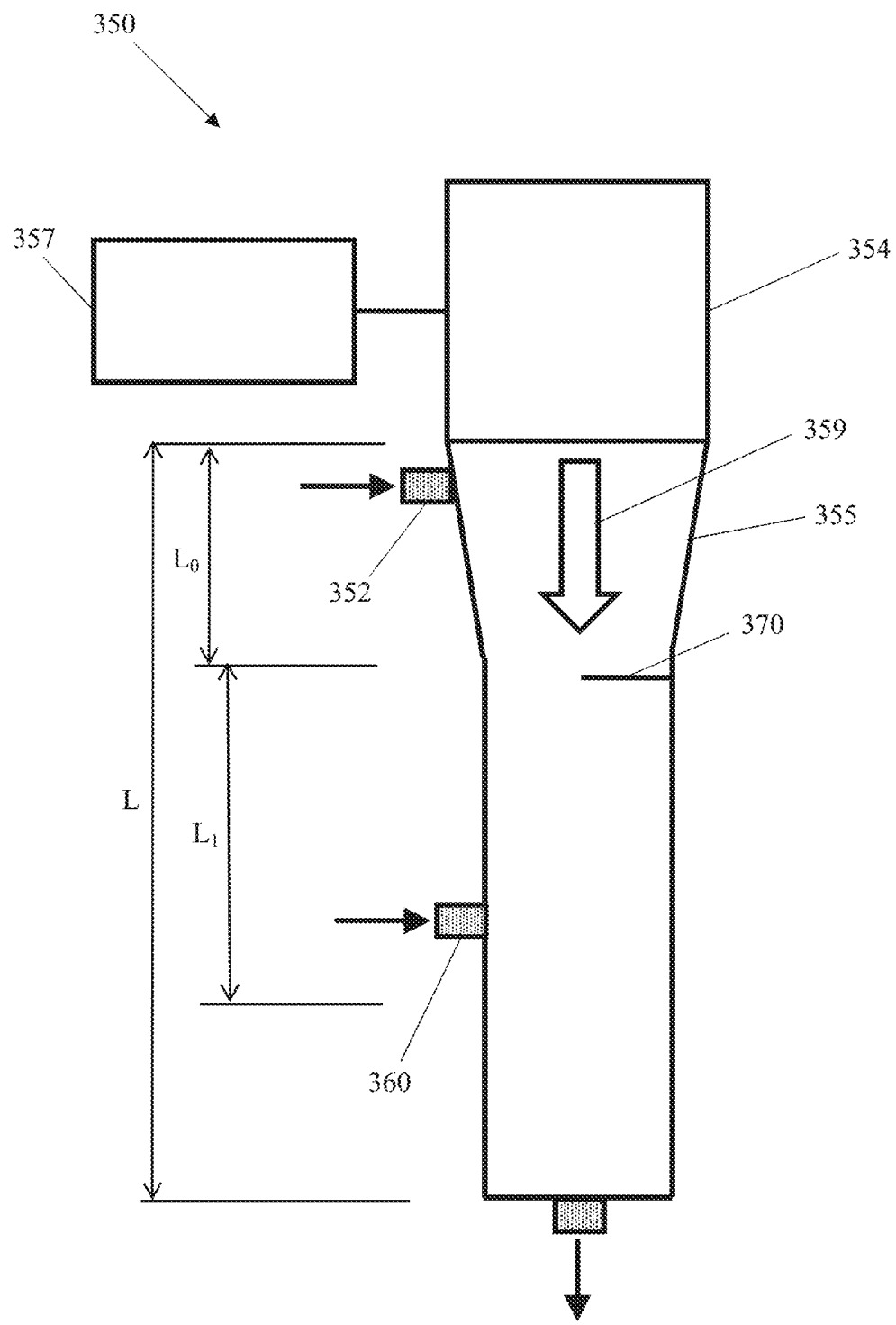
FIG. 3B shows a simplified vertical cross-section of a microwave plasma reactor having a filament, according to some implementations.

FIG. 3B illustrates a microwave processing system with a FEWG and filaments. In FIG. 3B, the microwave processing system 350 includes a microwave energy generator (such as a microwave energy source) 354, a FEWG 355, and a microwave emitter circuit 357. Microwave energy 359 is supplied by the microwave energy source 354, to propagate in a direction down the length L of the FEWG 355. Supply gas inlet 352 is placed near the entrance of the portion $L_0$, rather than at the entrance to the portion $L_1$ (such as the plasma zone). One or more metal filaments 370 is placed within the FEWG 355 to assist in the ignition of the plasma and/or the excitation of higher energy species within the plasma. Metal filament 370 is downstream of the first gas inlet 352, near the entrance to the plasma zone portion of the FEWG $L_1$ (with a smaller cross-sectional area than the FEWG closer to the microwave energy generator). The filament 370 may be located at other locations within portion $L_1$ of the overall length L of the FEWG 355, where $L_1$ is the region in the waveguide where the plasma is formed as described in relation to previous implementations. The filament 370 is located within portion $L_1$ of the FEWG and upstream of the process material inlet 360, so that it will be located outside of the portion $L_2$ (such as length $L_2$ shown in FIG. 3A) where reactions are taking place and which could coat the filament with reacted species. The presence of filament 370 can reduce the plasma ignition voltage by providing an ignition site, by focusing the electric field of microwave energy 359. Additionally, the filament 370 can become heated and emit electrons through thermionic emission, which further contributes to reducing the plasma ignition voltage. Although the filament 370 is illustrated as a single wire, filament 370 may take other configurations such as a coil or multiple filaments. The filament 370 can be tungsten. The filament may be actively energized (powered) or may be passive. The filament 370 is an osmium filament (such as configured as a plate, or coil, or other shape) adjacent to a heater coil. The filament 370 is a ferrous material in the field of an inductive coil. The filament 370 is actively heated where the active components (such as heating source components) are located outside of the waveguide 355 and the filament material that is being heated is inside of the waveguide 355.

The filament 370 within the FEWG can assist with the plasma ignition. An advantage of using a filament 370 within the FEWG is that it enables a plasma to form quickly enough to keep up with fast microwave pulsing frequencies (such as at frequencies greater than 500 Hz, or greater than 1 kHz), even with high gas flows (such as greater than 5 slm) and large gas volumes (such as up to 1000 L). This is particularly important at high pressures (such as greater than 0.9 atm, or greater than 1 atm, or greater than 2 atm), because the high energy species will extinguish quickly in a high pressure atmosphere, and if the plasma cannot ignite fast enough, then there will be a low fraction of high-energy species (such as integrated over time) in a pulsed plasma at high pressures.

The carbon structures, agglomerations, scaffolds, networks, and aggregates (referred to herein as "nanoparticles" for convenience of description) including the different carbon allotropes described herein can be produced using the microwave plasma reactors with gas flows (such as supply gas flow, process gas flow, or input material gas flow) from 1 slm (standard liters per minute) to 1000 slm, or from 2 slm to 1000 slm, or from 5 slm to 1000 slm, or greater than 1 slm, or greater than 2 slm, or greater than 5 slm, or greater than 10 slm, or greater than 100 slm. The carbon nanoparticles described herein are produced using the microwave plasma reactors with gas residence times from 0.001 seconds to 100 seconds, or from 0.01 seconds to 100 seconds, or from 0.1 seconds to 100 seconds, or from 0.001 seconds to 10 seconds, or from 0.01 seconds to 10 seconds, or from 0.1 seconds to 10 seconds.

The carbon nanoparticles including the different carbon allotropes described herein are produced using the microwave plasma reactors with liquid precursor flows from 0.1 L/min to 1000 L/min, or from 2 L/min to 1000 L/min, or from 5 L/min to 1000 L/min, or greater than 1 L/min, or greater than 2 L/min, or greater than 5 L/min, or greater than 10 L/min, or greater than 100 L/min. The carbon nanoparticles and aggregates described herein are produced using the microwave plasma reactors with liquid precursor residence times from 0.001 seconds to 100 seconds, or from 0.01 seconds to 100 seconds, or from 0.1 seconds to 100 seconds, or from 0.001 seconds to 10 seconds, or from 0.01 seconds to 10 seconds, or from 0.1 seconds to 10 seconds.

The precursor material flow rate (such as gas or liquid flow rate) is used to tailor the mixture of allotropes produced within the reactor. At higher flow rates, the residence times are shorter, and at lower flow rates the residence times are longer. There is one or more carbon allotropes that form initially, and other carbon allotropes that form subsequently and/or that grow on the surfaces of the initially formed carbon allotrope. At higher flow rates (such as shorter residence times) the ratio of the initially formed allotrope to the subsequently formed allotropes will be higher than it will be at lower flow rates.

One example is the production of mixtures of graphene, graphite and MWSFs. MWSFs form first, and the graphene and/or graphite materials form on the surfaces of the initially formed MWSFs. When the mixture is produced with higher flow rates, the ratio of graphene and graphite to MWSFs is lower (such as low as 10% or 20%). Alternatively, when the mixture is produced with lower flow rates, the ratio of graphene and graphite to MWSFs is higher (such as up to 80% or 90%) because there is more time for additional layers of graphene and graphite to grow on the MWSF surfaces.

Another example is the production of mixtures of graphene, graphite, and amorphous carbon. Amorphous carbon forms first, and the graphene and/or graphite materials form on the surfaces of the initially formed amorphous carbon. When the mixture is produced with higher flow rates, the ratio of graphene and graphite to amorphous carbon is lower (such as low as 10% or 20%). Alternatively, when the mixture is produced with lower flow rates, the ratio of graphene and graphite to amorphous carbon is higher (such as up to 80% or 90%) because there is more time for additional layers of graphene and graphite to grow on the amorphous carbon surfaces.

It is important to note that other parameters, in addition to precursor material flow rate, also can affect which carbon allotropes form, and the growth rate of each, including, for example, microwave energy propagation related parameters (such as energy, power, pulse rate), chamber geometry, reaction temperature, the presence of a filament, and the precursor and supply gas species utilized. For example, when producing graphene, or mixtures of graphene and graphite, the microwave energy and power, as well as the precursor and supply gas flow rates can impact the number of layers in the graphene, and/or the ratio of graphene to graphite produced. At higher power, the rate of growth of the carbon layers increases, and at longer residence times the number of layers that are able to grow increases.

The carbon nanoparticles and aggregates described herein are produced using the microwave plasma reactors with chamber volumes from 100 $cm^3$ to 100,000 $cm^3$, or from 1000 $cm^3$ to 100,000 $cm^3$, or from 100 $cm^3$ to 10,000 $cm^3$, or from 1000 $cm^3$ to 10,000 $cm^3$, or from 1000 $cm^3$ to 5,000 $cm^3$. Multiple chambers can also be used in parallel in a single reactor, and multiple reactors can be used in parallel in the same reactor system.

The carbon nanoparticles and aggregates described herein are produced using the microwave plasma reactors at production rates greater than 10 kg/hr, or greater than 1 kg/hr, or from 0.1 to 100 kg/hr, or from 1 to 100 kg/hr, or from 10 to 100 kg/hr, or from 0.1 to 10 kg/hr, or from 0.1 to 1 kg/hr, or from 1 to 10 kg/hr.

Multiple Reactor Configurations

The microwave plasma chemical processing reactors are arranged in different configurations in the microwave chemical processing systems of the present disclosure, as described in the aforementioned U.S. Pat. No. 9,767,992, entitled "Microwave Chemical Processing Reactor."

The microwave plasma chemical processing reactors of the present disclosure have a single microwave energy generator, which is a source of microwave energy coupled to one or more than one FEWG. The microwave plasma chemical processing reactors of the present disclosure can have more than one microwave energy generator, coupled to more than one FEWG. The microwave energy is continuous wave or pulsed. The microwave energy generator power is from 1 to 100 kW.

The microwave plasma chemical processing reactors of the present disclosure have more than one reaction zone, which are connected together and have one or more than one outlet from which to collect the separated components.

The microwave plasma chemical processing reactors of the present disclosure contain multiple FEWGs with different geometries including manifold arrangements, and network arrangements.

The microwave plasma chemical processing reactors of the present disclosure have reaction zones with defined boundaries, and the supply gas and process inlets provide the supply gas (for creating the microwave plasma) and input material to the reaction zone through the boundaries. There are a plurality of supply gas and process inlets that provide the supply gas and input material to the reaction zone through the walls in controlled mass fractions. Providing the supply gas and input material to the reaction zone through the walls in controlled mass fractions can mitigate the deposition of the separated components on the reaction zone walls.

Examples of process material (such as input material) gases are described above. Alternatively, or in addition to, the process material can be a liquid that is provided through the process material inlet into the FEWG. Some examples of liquids that can be used as process materials are water, alkanes, alkenes, alkynes, aromatic hydrocarbons, saturated and unsaturated hydrocarbons (such as of alkanes, alkenes, alkynes, or aromatic hydrocarbons), ethanol, methanol, isopropyl alcohol (such as isopropanol), or mixtures thereof (such as a 50/50 mixture of ethanol/methanol). The liquid process materials listed above would produce carbon and hydrogen separated components. The flow rate of the liquid can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

The process material is a colloidal dispersion, such as a phase separated mixture in which one substance of microscopically dispersed insoluble or soluble particles is suspended throughout another substance, that is provided through the process material inlet into the FEWG. For example, the colloidal dispersion can include carbonaceous particles. Some examples of colloidal dispersions that can be used as process materials are solid particles from the Group 16, Group 14, Group 10, Group 9, Group 5, Group 2, Group 1, alloys thereof, and mixtures thereof, mixed with a liquid or a gas. The solid particles listed above can be mixed with liquids such as water, alkanes, alkenes, alkynes, aromatic hydrocarbons, saturated and unsaturated hydrocarbons (such as of alkanes, alkenes, alkynes, or aromatic hydrocarbons), ethanol, methanol, isopropyl alcohol, or mixtures thereof (such as a 50/50 mixture of ethanol/methanol). Examples of gases are Group 1 and Group 15-18, as well as inorganic compounds (such as group 14 hydride). Some examples of separated components that can be produced from the colloidal dispersion process materials listed above are solid inorganic materials coated in organic materials (such as silicon coated with graphene), and composite materials with interlayers of organic/inorganic materials (such as a silicon core with a layer of carbon encapsulating the silicon, coated with an additional inorganic layer). The flow rate of the colloidal dispersion can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

FIGS. 3C, 3D, 3E, and 3F show block diagrams of microwave chemical processing systems of the present disclosure, in which multiple FEWGs are coupled to one or more microwave energy generators (such as a microwave energy sources). The FEWGs can share some or all of the features of the systems described above. The supply gas and process material inputs shown here can also share some or all of the features described above. Each FEWG can have a reaction zone. A plasma can be generated from a supply gas in a plasma zone in each of the FEWGs, and a reaction length of each of the FEWGs serve as reaction zones to separate the process material into separate components. The reaction zones are connected together, and the microwave chemical processing system has one outlet for the separated components. The reaction zones are connected together, and the microwave chemical processing system has more than one outlet for the separated components. Each reaction zone has its own outlet for the separated components.

Figure 3C:
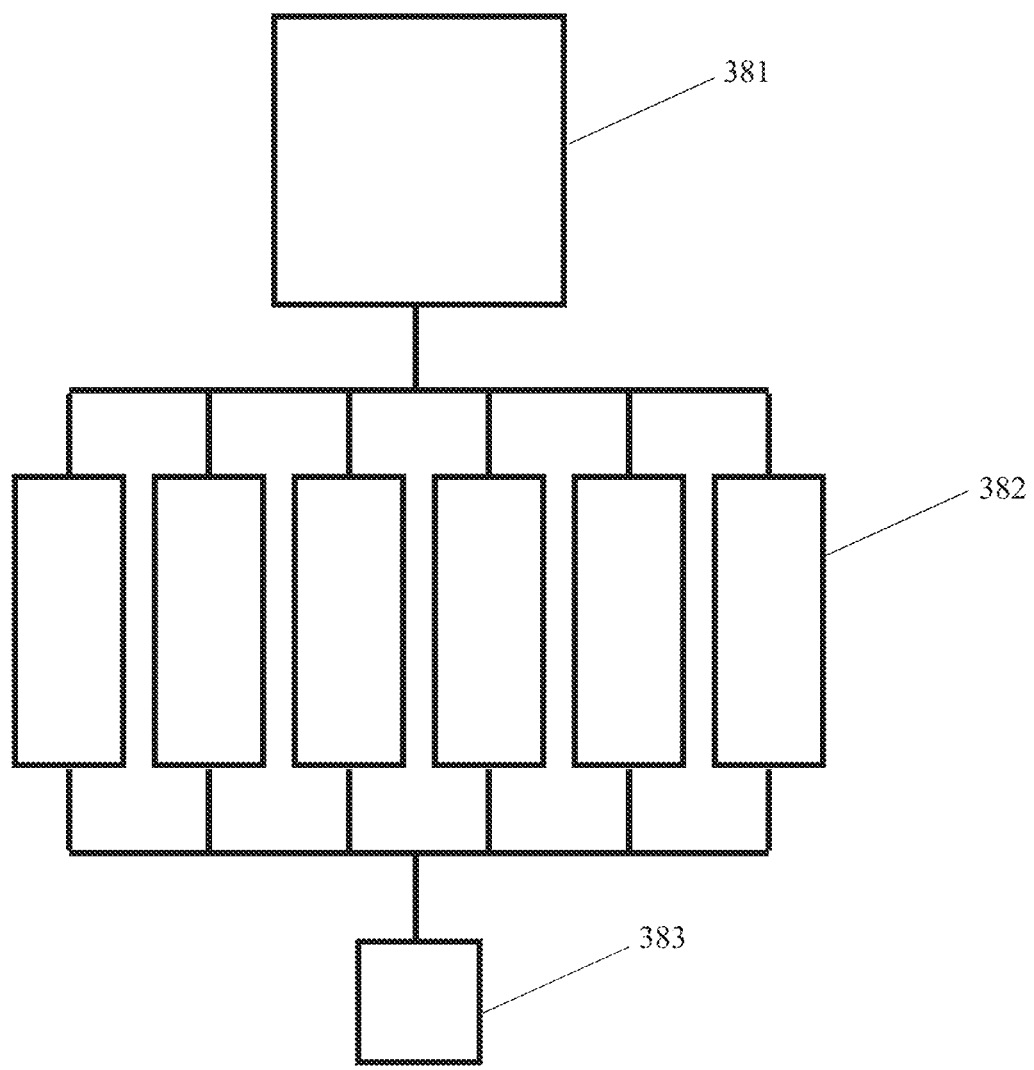
FIGS. 3C, 3D, 3E and 3F are block diagrams of microwave chemical processing systems having multiple field-enhancing waveguides and multiple microwave energy sources, according to some implementations.

FIG. 3C shows where there is one microwave energy generator 381 coupled to multiple FEWGs 382, and the reaction zones of the FEWGs are all connected together such that there is a single outlet 383 to collect the separated components.

Figure 3D:
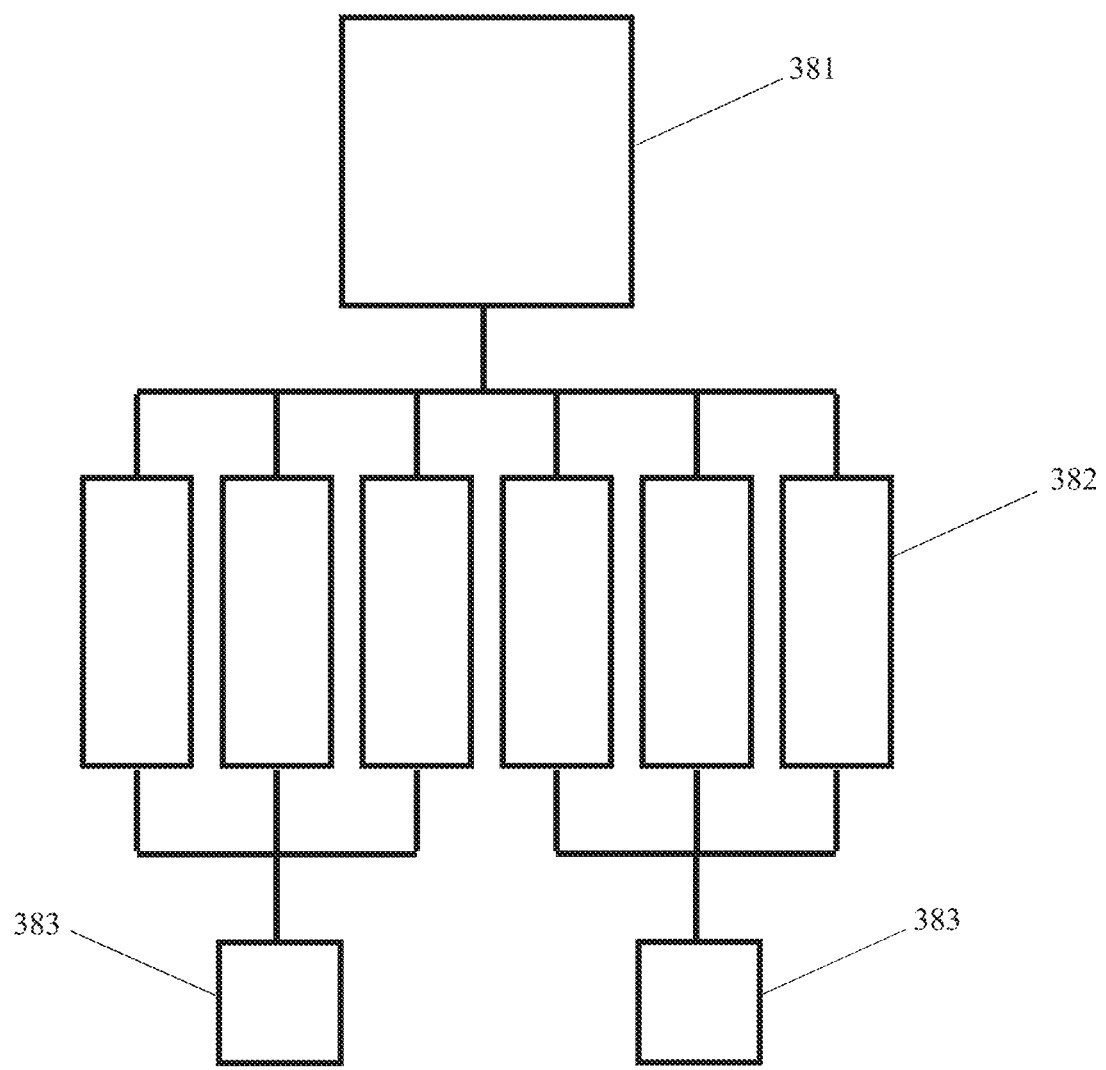

FIG. 3D shows where there is one microwave energy generator 381 coupled to multiple FEWGs 382, and the reaction zones of some the FEWGs are connected together such that there more than one outlet 383 to collect the separated components.

Figure 3E:
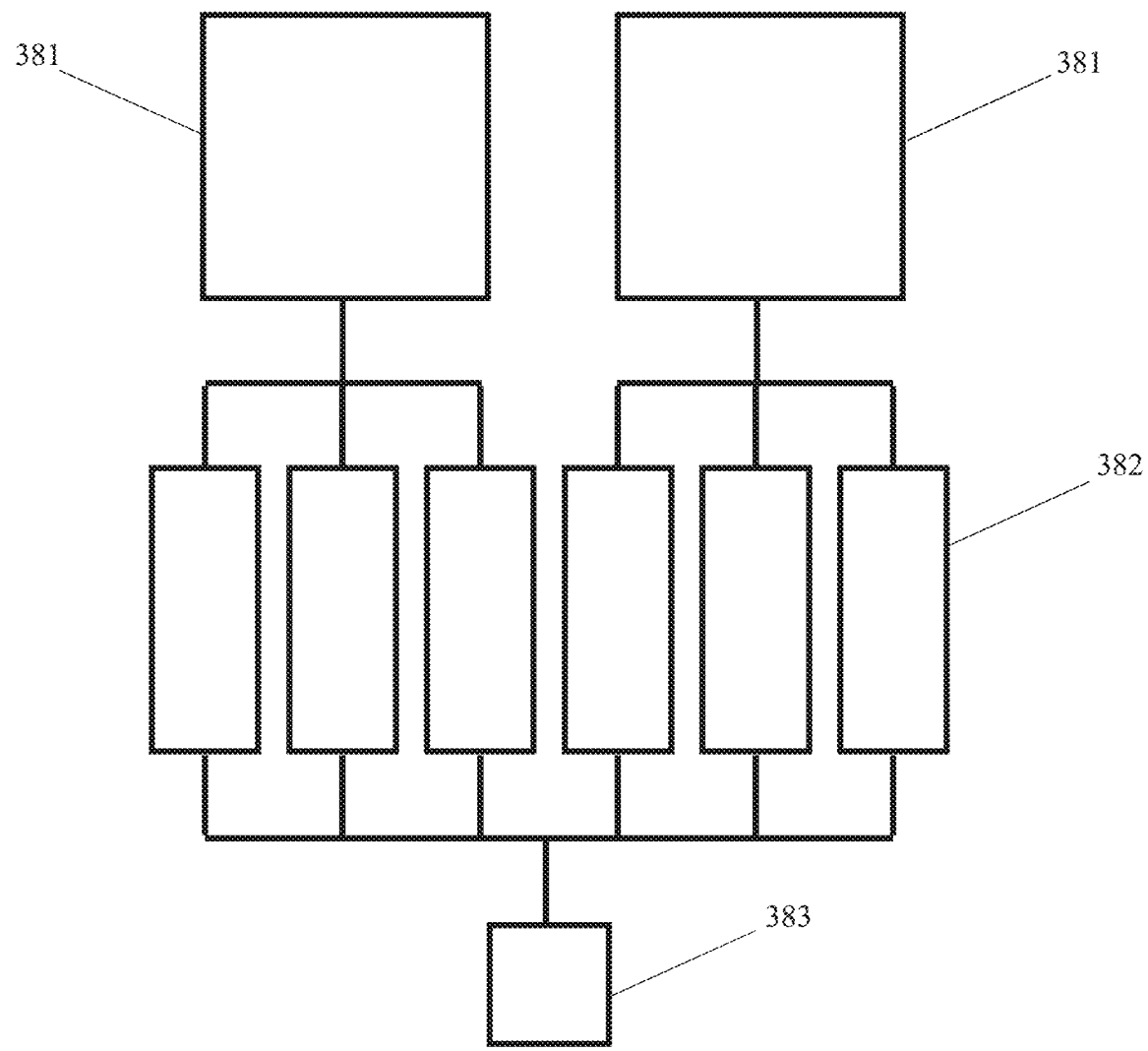

FIG. 3E shows where there is more than one microwave energy generator 381 coupled to multiple FEWGs 382, and the reaction zones of the FEWGs are all connected together such that there is a single outlet 383 to collect the separated components.

Figure 3F:
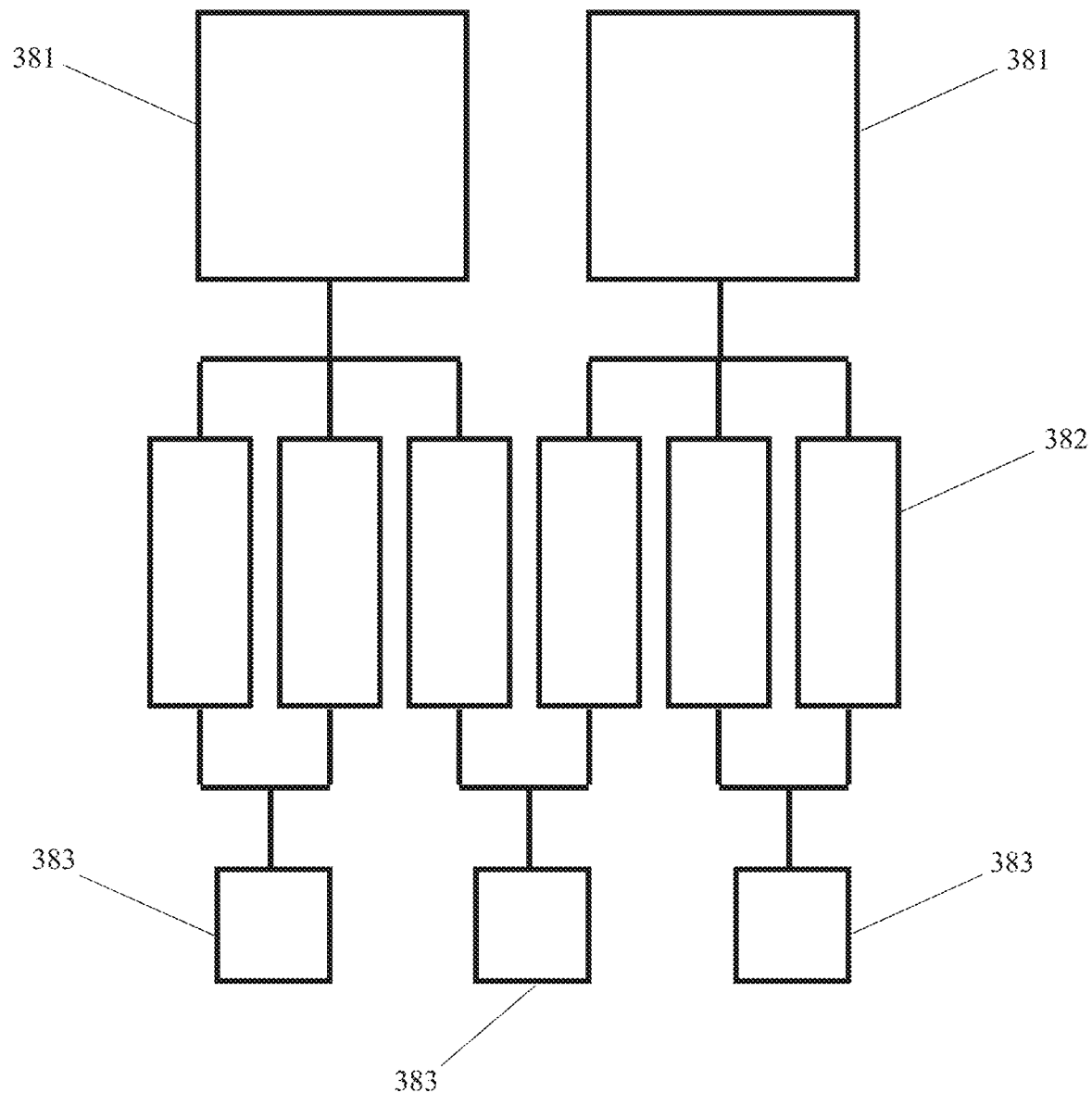

FIG. 3F shows where there is more than one microwave energy generator 381 coupled to multiple FEWGs 382, and the reaction zones of some the FEWGs are connected together such that there more than one outlet 383 to collect the separated components.

FIGS. 3C, 3D, 3E, and 3F depict 6 FEWGs for illustrative purposes, however, there can be configurations of fewer or greater than 6 FEWGs. For example, there are from 1 to 10 FEWGs coupled to each microwave energy generator. The microwave energy from more than one microwave generator can be combined using a power combiner, and then the combined microwave energy can be coupled into more than one FEWG. The microwave energy emitted from such a power combiner can be very large and can be coupled into many FEWGs (such as more than 10). Multiplexing is used to couple microwave energy into multiple FEWGs from a single microwave energy source. In one example, the multiplexing is time-division multiplexing which means that the energy is coupled from a microwave energy source into one set of FEWGs at one moment in time, and a switch is used to direct the energy into a different set of FEWGs at a later moment in time. The switch can be used to cycle energy between many sets of FEWGs (such as more than 2, or more than 5, or more than 10) from a single microwave energy source over time, where each set of FEWGs can contain multiple FEWGs (such as more than 2, or more than 5, or from 1 to 10). FIG. 3D depicts two outlets, but there can be more than two outlets, such as in FIG. 3F, and each FEWG can have its own outlet to collect the separated components. There are from 1 to 10 outlets to collect the separated components. FIG. 3D depicts 3 FEWGs connected into each outlet, but there can be fewer or greater than 3 FEWGs connected into each outlet, and each FEWG can have its own outlet to collect the separated components. FIGS. 3E and 3F depict two microwave energy generators, however, there can be more than 2 microwave energy generators. There can be from 1 to 10 FEWGs connected together into each outlet to collect the separated components.

Figure 3G:
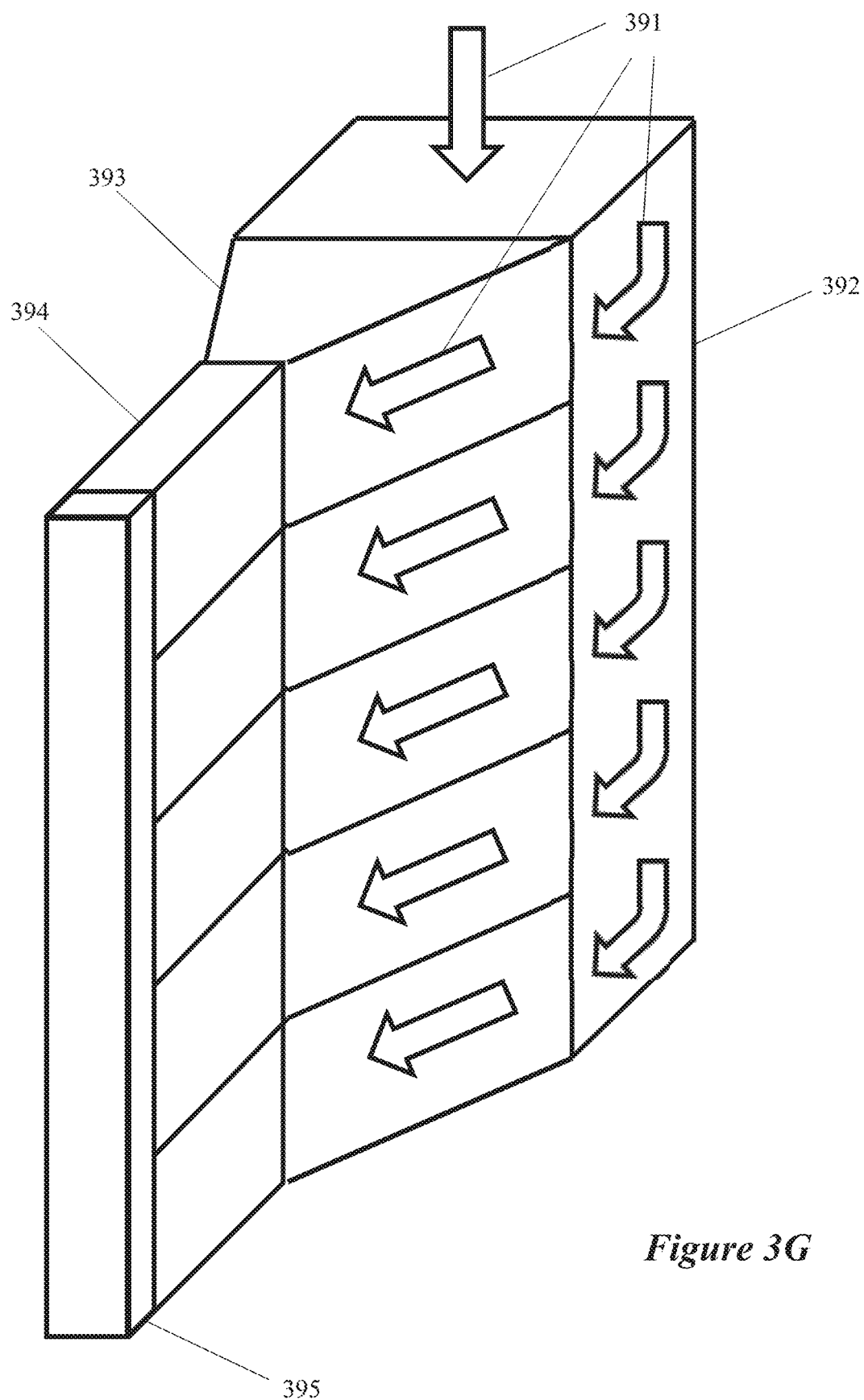

FIGS. 3G and 3H1 depict microwave chemical processing systems of the present disclosure, in which multiple FEWGs are coupled to one microwave energy generator (such as microwave energy sources) using different geometries. The FEWGs can share some or all of the features of the systems described above. The supply gas and process material inputs can also share some or all of the features described above. Each FEWG has a reaction zone. A plasma is generated from a supply gas in a plasma zone in each of the FEWGs, and a reaction length of each of the FEWGs serve as reaction zones to separate the process material into separate components. The reaction zones are connected together, and the microwave chemical processing system has one outlet for the separated components. The reaction zones are connected together, and the microwave chemical processing system has more than one outlet for the separated components. Each reaction zone has its own outlet for the separated components.

FIG. 3G shows a manifold geometry where there is one microwave energy generator coupled to multiple FEWGs. The microwave energy 391 is coupled to a manifold waveguide 392, and then is coupled into multiple FEWGs. The microwave energy enters the large cross-sectional area section of each the FEWGs, then into the field-enhancing zone of the FEWGs 393 and is then coupled into the smaller cross-sectional area reaction zones of a waveguide throat 394. In FIG. 3G, all of the FEWGs are all connected together such that there is a single outlet 395 to collect the separated components.

FIG. 3H1 shows a network geometry where there is one microwave energy generator coupled to multiple FEWGs. The microwave energy 391 is coupled to a network waveguide 392, and then is coupled into multiple FEWGs. The specific network waveguide dimensions can be dependent on the microwave frequency being used. The microwave energy enters the large cross-sectional area section of each the FEWGs, then into the field-enhancing zone of the FEWGs 393 and is then coupled into the smaller cross-sectional area reaction zones of the waveguide throat 394. In FIG. 3H1, all of the FEWGs are all connected together such that there is a single opening 3310 to collect the separated components.

FIGS. 3G and 3H1 depict one microwave energy generator coupled to 5 FEWGs in a manifold or network geometry, but however, there can be one microwave energy generator coupled to fewer or greater than 5 FEWGs in a manifold or network geometry. The microwave energy from more than one microwave generator can be combined using a power combiner, and then the combined microwave energy can be coupled into more than one FEWG in a manifold or network geometry. The microwave energy emitted from such a power combiner can be very large and can be coupled into many FEWGs (such as more than 10) in a manifold or network geometry. There are from 1 to 10 FEWGs coupled to each microwave energy generator in a manifold or network geometry. FIGS. 3G and 3H1 depict one outlet, but there can be more than one outlet from FEWGs coupled to microwave energy generators in a manifold or network geometry. There are from 1 to 10 outlets to collect the separated components from FEWGs coupled to microwave energy generators in a manifold or network geometry. FIGS. 3G and 3H1 depict one microwave energy generator coupled to multiple FEWGs, there is from 1 to 10 microwave energy generators coupled to from 1 to 10 FEWGs in a manifold or network geometry. There are from 1 to 10 FEWGs connected together into each outlet to collect the separated components from FEWGs coupled to microwave energy generators in a manifold or network geometry.

There are apertures between the manifold or network geometry waveguides 392 and the field-enhancing zones of the FEWGs 393. The dimensions of these apertures can be tailored to couple the microwave energy from the manifold or network geometry waveguides 392 to the field-enhancing zones of the FEWGs 393. The dimensions of these apertures are different sizes to balance the microwave energy transmission from the manifold or network geometry waveguides 392 between all of the coupled field-enhancing zones of the FEWGs 393.

The dimensions of the manifold or network geometry waveguides 392 are tailored such that they form a resonant cavity and there is (are) standing wave(s) of microwave energy within the manifold or network geometry waveguides 392. The standing wave of microwave energy is tuned to effectively couple microwave energy into each of the coupled field-enhancing zones of the FEWGs 393.

There is controlled leakage from the manifold or network geometry waveguides 392 to the field-enhancing zones of the FEWGs 393 to effectively distribute the amount of microwave energy coupled into each of the reaction zones of the waveguide throat 394. Some examples of designs to control the leakage from the manifold or network geometry waveguides 392 to the field-enhancing zones of the FEWGs 393 and effectively distribute the amount of microwave energy coupled into each of the reaction zones of the waveguide throat 394 are: changing the cross-section and/or lengths of the waveguides; using apertures between the manifold or network geometry waveguides 392 and the field-enhancing zones of the FEWGs 393; changing the angle of orientation between the manifold or network geometry waveguides 392 and the field-enhancing zones of the FEWGs 393; using filaments, point sources, electrodes and/or magnets within the manifold or network geometry waveguides or within the FEWGs (as will be discussed in further detail below); and combinations of two or more of these design features.

In some cases, rather than using the aforementioned filaments, point sources, or electrodes to cause ignition of the input materials to form a plasma, the geometry of a field-enhancing waveguide can be configured to cause free-space ignition of the input materials to form a plasma. Various apparatus and various methods for free-space ignition of a plasma are shown and described as pertains to FIG. 3H2 through FIG. 3L.

FIG. 3H2 is diagram of an example field-enhancing waveguide configured to cause free-space ignition of a plasma. As shown, microwaves propagate through the waveguide toward opening $331_O$. The geometry of the waveguide 355 is such that cross-sectional areas of the waveguide are smaller at locations closer to the opening than are the cross-sectional areas of the waveguide at locations farther from the opening. The decreasing cross-sectional area along the length of the waveguide enhances the field by concentrating the microwave energy nearer to the opening.

Figure 3I:
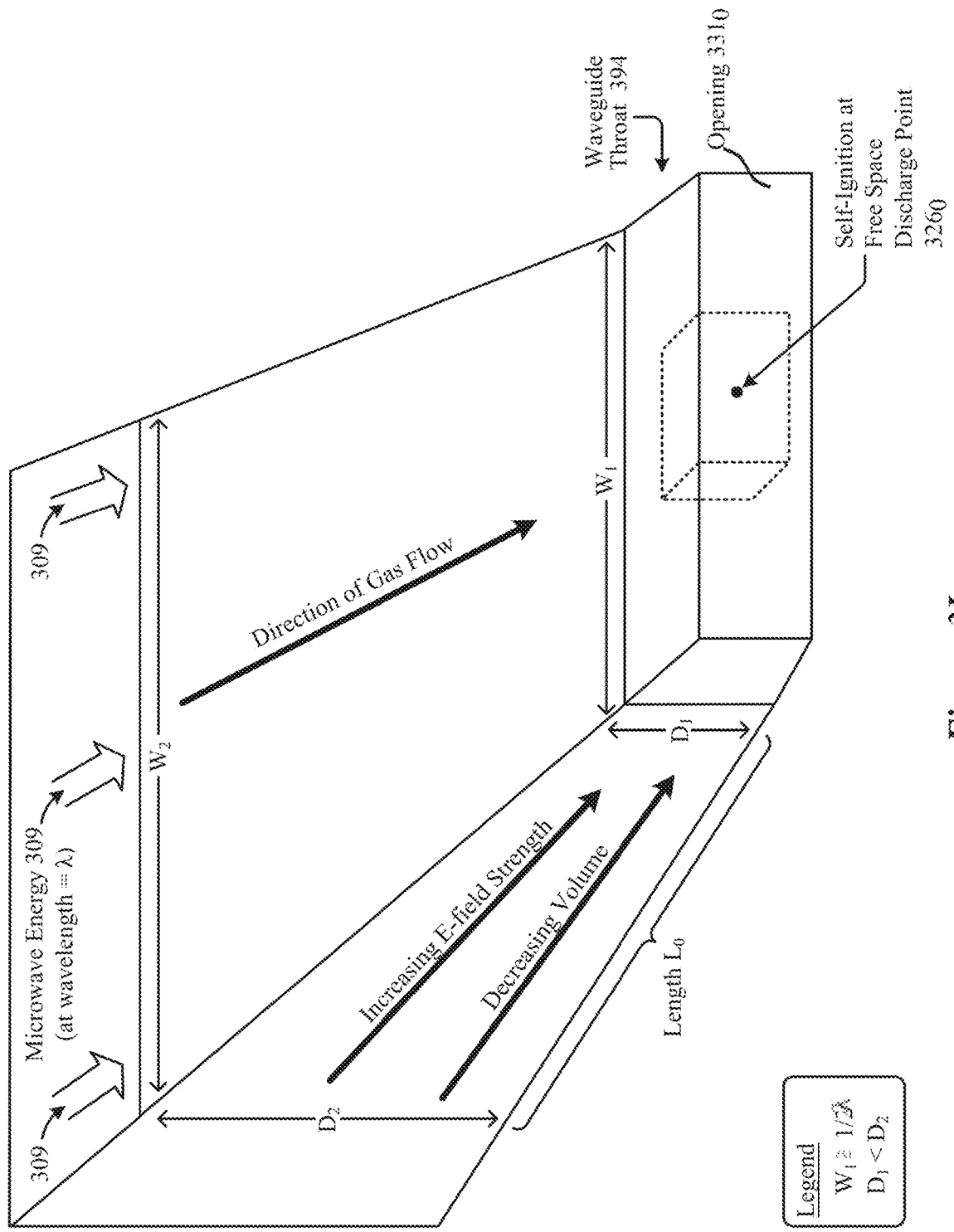
FIG. 3I shows an elevation view of a rectilinear configuration of a field-enhancing waveguide configured to cause free-space ignition of a plasma, according to some implementations.

FIG. 3I is an elevation view a field-enhancing waveguide configured to cause free-space ignition of a plasma. The aforementioned decreasing cross-sectional area along length $L_O$ of the waveguide corresponds to at least the difference (such as decrease) between dimension $D_2$ and dimension $D_1$. The decreasing cross-sectional area along a length dimension of the waveguide may correspond to at least the difference (such as decrease) between dimension $W_2$ and dimension $W_1$. The dimension $W_1$ is an inner dimension of the waveguide, and dimension $W_1$ can be selected to be at least one-half of the wavelength of the microwave and/or selected so as to support propagation of the specific microwave frequency being used.

As the microwave propagates toward the opening, the strength of the e-field increases due to the decrease in the cross-sectional area and corresponding decrease in inner volume near the waveguide throat 394. At some point the e-field becomes sufficiently strong that the input material, such as gaseous mixtures, expands into and/or generates a plasma upon exposure to microwave energy, a phenomenon that can be referred to as self-ignition. As shown, self-ignition can occur at a free space discharge point $326_O$ within the waveguide throat.

Figure 3J:
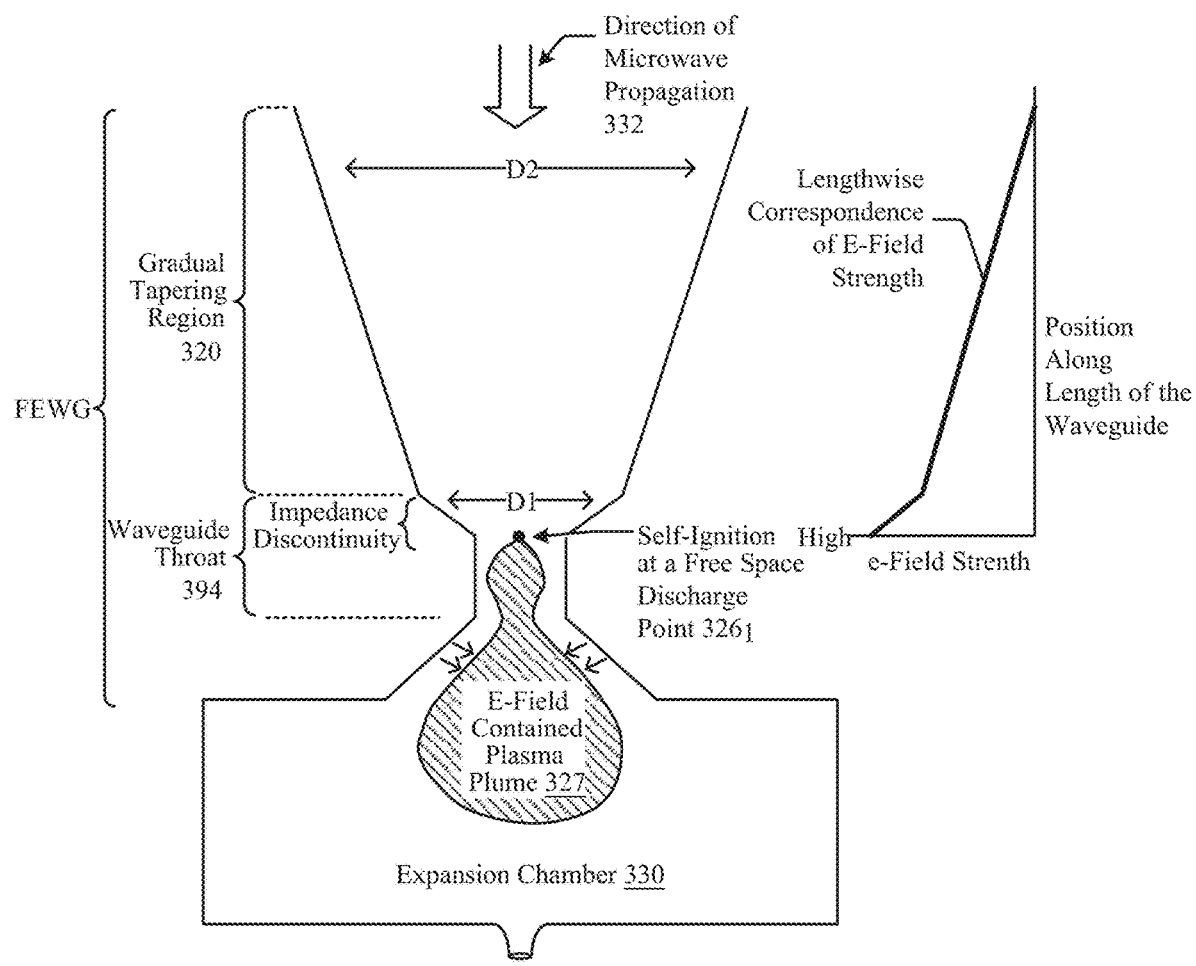
FIG. 3J shows a side view of a microwave chemical processing system in which a field-enhancing waveguide is configured to cause free-space ignition of a plasma, according to some implementations.

FIG. 3J shows a side view of a microwave chemical processing system in which a field-enhancing waveguide is configured to cause free-space ignition of a plasma. Specifically, and as shown, the geometry of the FEWG includes a gradual tapering region 320 that meets at waveguide throat 394. As shown, there can be a location within the waveguide throat where the e-field strength is high enough to cause dissociation of the input materials and ignite the plasma. Also, there can be a location within the waveguide throat where the shape of the waveguide throat causes impedance discontinuities in the plasma, which can contribute to ignition of the plasma. Some waveguide throat configurations can exploit the difference between an upstream (such as nearer to the pulsed microwave energy source) inner dimension of the waveguide throat and a downstream (such as farther from the pulsed microwave energy source) inner dimension of the waveguide throat causes one or more impedance discontinuities.

The technique of igniting the plasma in a free-space location within the waveguide is different from microwave chemical processing systems that rely on a secondary source of energy (such as an igniter apparatus) to ignite the plasma at a particular time and location. More specifically, the energy density needed to cause ignition of the plasma in a free-space location within the waveguide results, at least in part from the shape of the throat of the waveguide rather than from addition of energy from a source other than the pulsed microwave radiation source. One outcome that derives from achieving the energy density needed to cause ignition of the plasma in a free-space location within the waveguide rather than from addition of energy is that there is no additional energy source that needs to be controlled to turn on or turn off in synchronicity with the pulsing of the pulsed microwave radiation source.

The shown configuration includes an expansion chamber 330 such that the plasma can expand into a plume. More specifically, the plasma expands into an e-field contained plasma plume 327. The e-field contained plasma plume is held in a volume by the forces of the e-field. One effect of the combination of self-ignition at a free space discharge point 3261 and the fact that the plasma plume is being held in a volume by the e-field is that the plume is formed and subsists generally positioned away and apart from the walls of the containing vessel. This reduces or eliminates the need for cleaning the interior volume of the containing vessel, at least inasmuch as reactions between the dissociated constituents of the process gas and the walls of the containing vessel are eliminated or reduced. Moreover, since the plasma is ignited in free space without requiring the presence of a separate dedicated ignition source, there are no ignition components inside the FEWG, and thus there are no ignition components to clean or replace.

There are many possible geometries for the reactor, any of which have the characteristic that the energy in the e-field increases due to a decreasing cross-sectional area along a length dimension of the reactor. The heretofore shown examples are at least substantially rectilinear geometries which correspond to transverse electric (TE) wave propagation modes, however other geometries can be defined to support other wave propagation modes. For example, cylindrically shaped or conically shaped FEWGs and/or funnel-shaped waveguide throats can support transverse magnetic (TM) wave propagation modes.

Further details pertaining to reactor geometries that support multiple wave propagation modes are described in U.S. patent application Ser. No. 16/751,086, entitled "Complex Modality Reactor for Materials Production and Synthesis which is assigned to the same assignee as the present application, and which is incorporated herein by reference herein for all purposes.

FIGS. 3K1, 3K2, 3K3, and 3K4 show several opening shapes that correspond to differently configured field-enhancing waveguide geometries that are configured to cause free-space ignition of a plasma. The energy densities and energy distribution at the opening corresponds to the shape of the opening. As such, by changing the shape of the opening and the surrounding structures, the shape of the energy density and energy distribution in the waveguide throat can also be changed. Accordingly, differently shaped waveguide throats with differently shaped openings exhibit differently shaped energy density distributions, and differently shaped energy density distributions can cause differently shaped plasmas and/or plasma plumes.

As shown in opening view $332_1$ of FIG. 3K1, an opening $331_1$ can be a rectangular shape having a substantially 1:2 aspect ratio. As shown in opening view $332_2$ of FIG. 3K2, an opening $331_2$ can have a square shape having a substantially 1:1 aspect ratio. As shown in opening view $332_3$ of FIG. 3K3, an opening $331_3$ can be an elliptical shape having a substantially 1:2 aspect ratio.

There are many reasons to control the shape of the plasma volume or plume. For example, one reason is to increase the plasma density within the plume. That is, when and where there is higher plasma density, there are more radicals present. Also, when and where there is higher plasma density there can be better homogeneity of the plasma radicals. These effects deriving from higher plasma density lead to greater production rates. Another reason to control the shape of the plasma volume is to control supersaturation within the plasma volume. Controlling saturation of $C_2+$/C/H+ leads to uniform particle precipitation. A further reason to control the shape of the plasma is to contain the plasma in free space away from the physical structures of the waveguide throat. Yet another reason to control the shape of the plasma is to control the temperatures in the plasma by contouring the plasma volume for specific temperature gradients across all three dimensions of the plasma volume.

In some cases, the waveguide throat can be designed to ignite two separate plasmas at two separate energy density maxima within the waveguide throat. For example, the waveguide throat can be designed to ignite two separate plasmas, both of which are ignited in free space rather than against the inner walls of the containing structures. One possible design of a waveguide throat having two separate energy density maxima within the waveguide throat is illustrated in FIG. 3K4. Specifically, the width of the waveguide throat at the opening is at least one-half of the wavelength of the microwave. This width W1 supports wave propagation through the FEWG and into and through the waveguide throat, while the decreasing dimension D (such as from a larger dimension D2 to a smaller dimension D1) causes an increase in energy density as the wave propagates toward the opening. The shape of the opening and other structures within the waveguide throat are such that there are two energy density maxima that arise in free space locations within the waveguide throat. As such, there are two separate plasmas that are ignited at a respective energy density maxima. This is shown and described as pertains to FIG. 3K4 and FIG. 3L.

As used herein, the term "free space location" or "free space locations" refers to a point inside a waveguide throat that is distal from any physical structure. For example, point inside a waveguide throat that is distal from any physical structures may be a point inside the waveguide that is not coincident with the inner walls of the waveguide throat. As another example, a point inside a waveguide throat that is distal from any physical structure may be a point inside the waveguide that is not coincident with an energy-adding igniter apparatus.

Figure 3L:
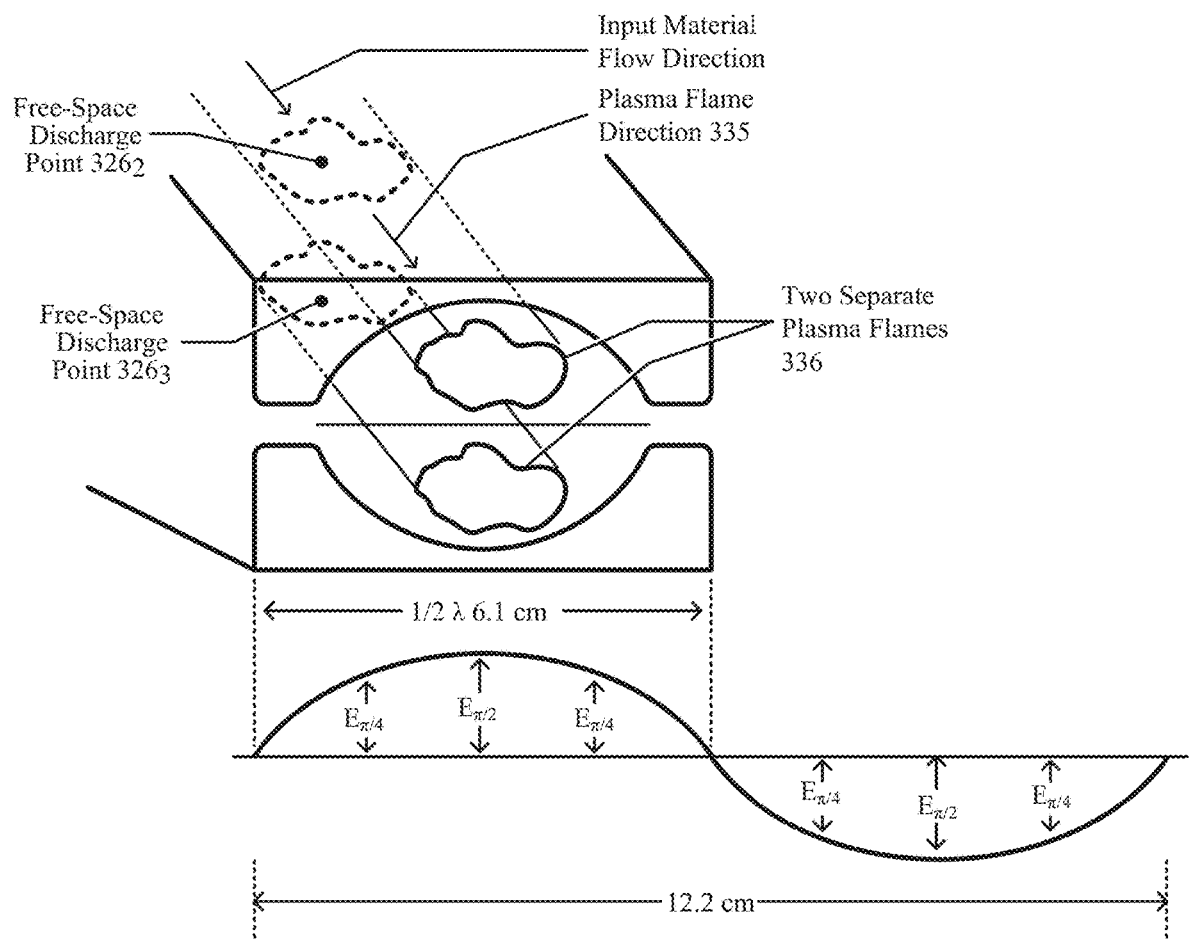
FIG. 3L depicts a field-enhancing waveguide having a waveguide throat that is configured to cause free-space ignition of a bifurcated plasmas, according to some implementations.

As shown in opening view $332_4$ of FIG. 3K4, an opening can have a substantially a half-sinusoidal shape having a substantially 1:2 aspect ratio. As the microwave propagates through the waveguide throat, the wave has energy maxima at the midpoints of the waveguide throat, as shown. Moreover, the choice of dimensions, aspect ratios, and/or aspects of tuning the opening serve to flatten the e-field, which in turn serves to shape the plasma. In certain cases, a tuned e-field shape can result in a wide plasma. The foregoing phenomena can be exploited regardless of the frequency of the microwave. FIG. 3L shows an illustrative numeric example.

FIG. 3L depicts a field-enhancing waveguide having a waveguide throat that is configured to cause free-space ignition of two separate plasmas. The two separate plasmas are ignited at free-space discharge point $326_2$ and at free-space discharge point $326_3$. The specific dimensions shown correspond to a microwave source of 2.45 GHz. Since the energy density of the propagating wave has maxima at the midpoints of the waveguide throat, two separate plasmas are ignited, one at each energy density maxima. Further, because the energy density increases toward the opening of the waveguide throat (such as in the shown plasma direction 335), the two separate plasmas increase in temperature as the flames gets closer to the opening of the waveguide throat. As shown, the two separate plasma flames 336 each have an oblong plasma shape. The shapes may change as the two separate plasma flames exit the waveguide throat. In some cases, such as when an expansion chamber is fitted to the waveguide throat, the two separate plasma flames may coalesce into a single flame that is contained within an e-field. In some reactor designs, a swirling gas confines the plasma flames into a shape defined at least in part by the fluid dynamics of the swirling gas as it interacts with the plasmas. Any known technique can be used to generate the swirling gas.

Microwave plasma reactors that comport with the foregoing designs exhibit many highly-desirable attributes such as: there is very little microwave power lost to heating; even very high energy such as high temperature, plasmas can be contained within the e-field, thus avoiding electrical or magnetic coupling of the plasma with the containing vessel; even very high energy, such as high temperature, plasmas can be contained within the e-field, thus avoiding losing energy from heating the walls of the waveguide or expansion chamber; and, since the plasmas can be ignited and contained within an e-field that is distal from the walls of the waveguide or expansion chamber, the need for ongoing cleaning is reduced or eliminated altogether.

Microwave Chemical Processing Methods

Figure 4A:
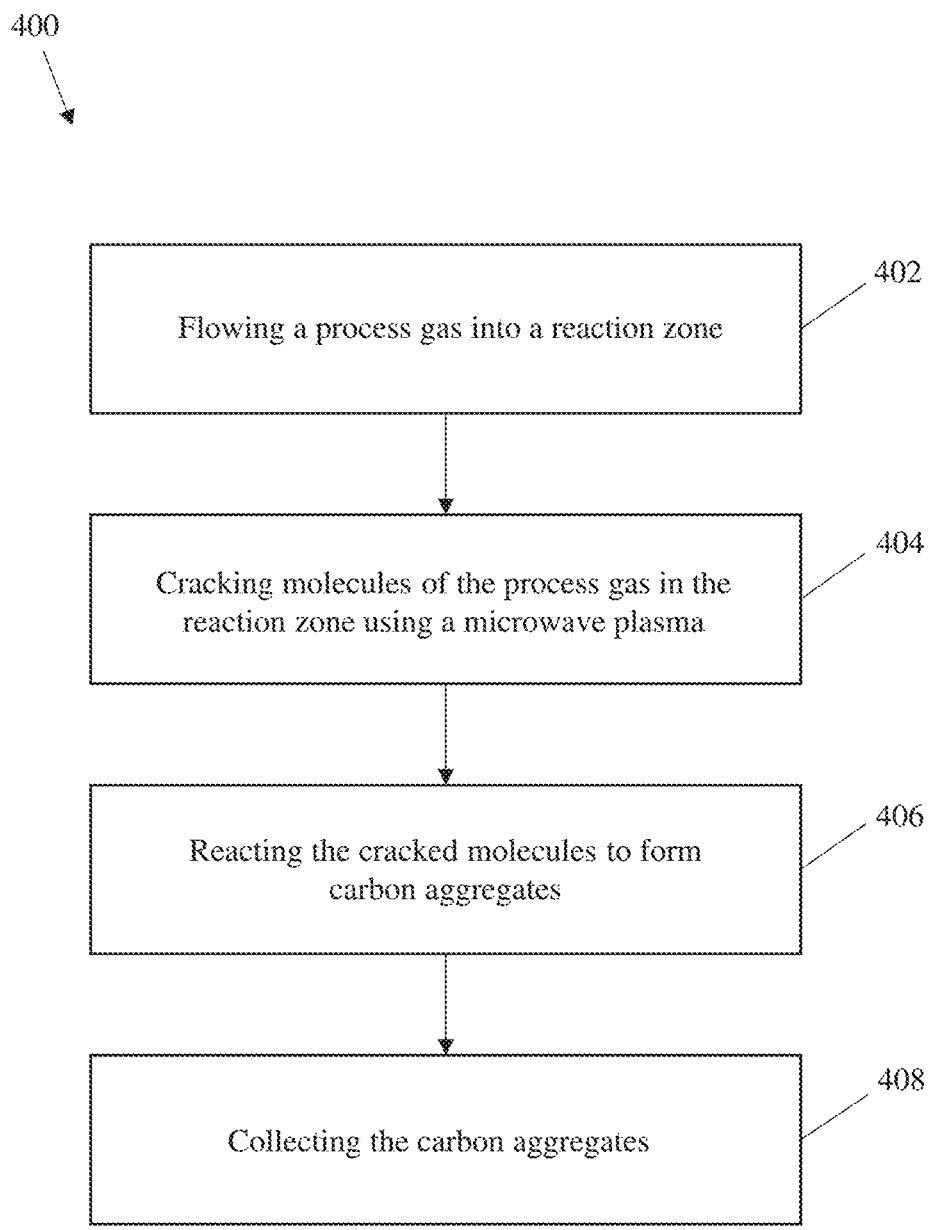
FIG. 4A shows an example flow chart of methods for microwave processing of a gas, according to some implementations.

A method for generating the carbon particles, nanoparticles, aggregates, and materials described herein produced using microwave plasma reactors is shown in FIG. 4A. The method 400 comprises step 402 of flowing a process gas into a reaction zone, step 404 of cracking molecules of the process gas in the reaction zone using a microwave plasma, step 406 of reacting the cracked molecules to form carbon aggregates, and step 408 of collecting the carbon aggregates. The carbon aggregates can include graphene. The carbon aggregates can include graphene, graphite, MWSFs, connected MWSFs, amorphous carbon, other carbon allotropes, or combinations thereof. Carbon aggregates contain a ratio of carbon to other elements, except hydrogen, greater than 99%, a median size of the carbon aggregates is from 1 to 50 microns, a surface area of the carbon aggregates is from 50 to 200 m2/g, when measured using the Brunauer-Emmett-Teller (BET) method with nitrogen as the adsorbate, and the carbon aggregates, when compressed, have an electrical conductivity greater than 500 S/m.

Figure 4B:
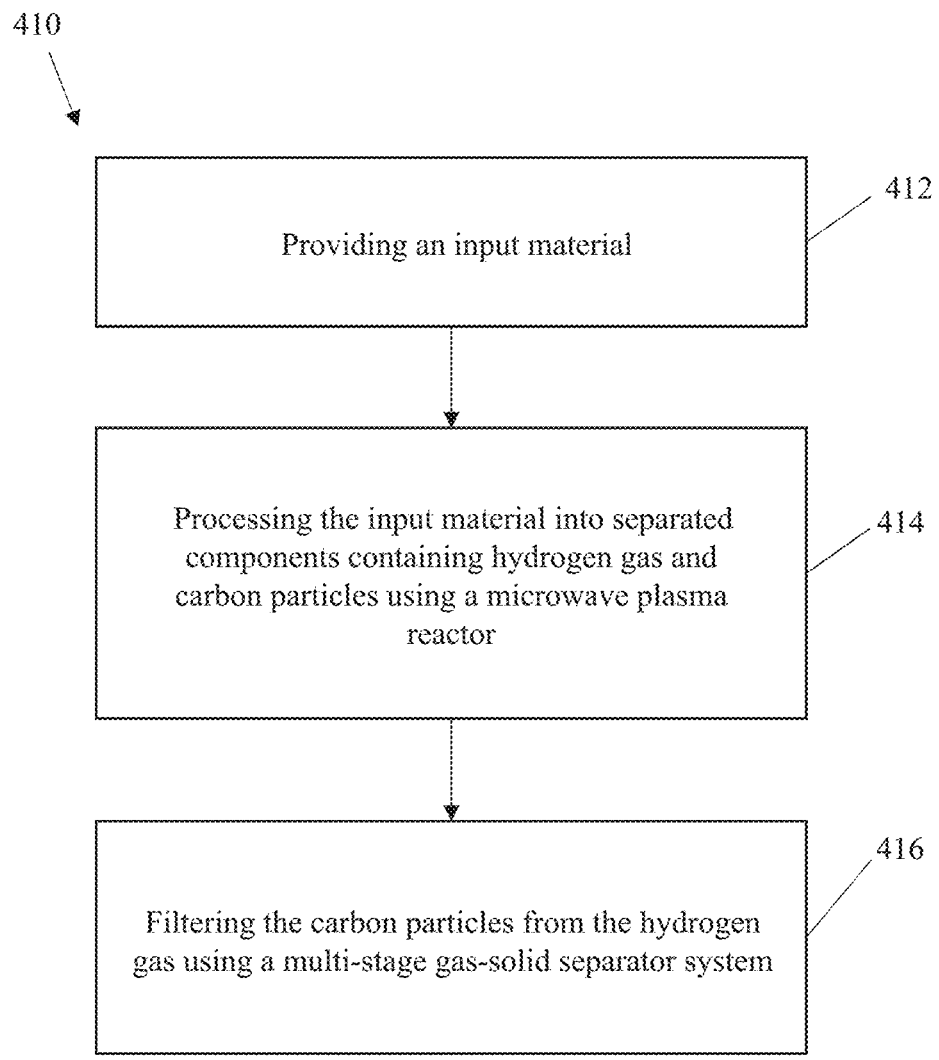
FIG. 4B shows an example flow chart of methods for microwave processing of a gas, according to some implementations.

A method for producing carbon particles described herein is shown in FIG. 4B. The method 410 includes step 412 of providing an input material comprising a hydrocarbon gas; step 414 of processing the input material into separate components using a microwave plasma reactor, wherein the separated components contain hydrogen gas and carbon particles; and step 416 of filtering the carbon particles from the hydrogen gas using a multi-stage gas-solid separator system. In the method 410, the multi-stage gas-solid separator system comprises: a first cyclone separator having an output; and a back-pulse filter system. The first cyclone separator filters the carbon particles from the separated components; and the back-pulse filter system filters the carbon particles from the output from the first cyclone separator.

The temperature in the multi-stage gas-solid separator system is adjustable, and the temperature is adjusted to change the concentration of adsorbed hydrocarbons in the collected carbon particles. The temperature in the multi-stage gas-solid separator system is greater than 300° C., and a concentration of hydrocarbons of the collected carbon particles is from 1% to 5%. The input material comprises natural gas, and the flow rate of the input material into the reactor is greater than 5 slm. The input material comprises biogas, and the flow rate of the input material into the reactor is greater than 5 slm.

A majority of the carbon particles filtered by the cyclone separator are greater than 1 micron in size. A majority of the carbon particles filtered by the back-pulse filter system are greater than 100 nm in size. The greater than 80% of the carbon particles are filtered after the separated components are filtered by the first cyclone separator. The greater than 99% of the carbon particles are filtered after the separated components are filtered by the first cyclone separator and the back-pulse filter system.

The density of the carbon particles is less than 0.2 g/cm$^3$. The surface area of the carbon particles is from 50 to 300 m$^2$/g, when measured via a Brunauer-Emmett-Teller (BET) method with nitrogen as the adsorbate.

The carbon particles comprise graphene and one or more other carbon allotropes in addition to graphene. The graphene comprises up to 15 layers; a ratio of carbon to other elements, except hydrogen, in the carbon particles is greater than 99%; and a ratio of the graphene to the other carbon allotropes is from 5% to 95%. The carbon particles comprise amorphous carbon, and wherein the ratio of the graphene to the amorphous carbon is from 1% to 10%.

The back-pulse filter system can include: a plurality of back-pulse filters, each back-pulse filter having a filtering state in which the back-pulse filter is filtering the separated components, and a cleaning state in which the back-pulse filter is being cleared using a flow of gas in the opposite direction from the flow of the separated components through the back-pulse filter; and a valve upstream of the plurality of back-pulse filters to switch each back-pulse filter between the filtering state and the cleaning state; wherein the plurality of back-pulse filters is arranged in parallel; and the process further comprises operating a first back-pulse filter of the plurality of back-pulse filters in the cleaning state while other back-pulse filters of the plurality of back-pulse filters are in the filtering state.

The multi-stage gas-solid separator system further can include a second cyclone separator between the first cyclone separator and the back-pulse filter system, wherein: the first cyclone separator filters out a first fraction of the carbon particles in the separated components, the second cyclone separator filters out a second fraction of carbon particles in the separated components, and the back-pulse filter system filters out a third fraction of carbon particles in the separated components. The median particle size of the particles in the first fraction is larger than the median particle size of the particles in the second fraction, and the median particle size of the particles in the second fraction is larger than the median particle size of the particles in the third fraction.

The microwave plasma reactor can include: a pressure from 0.1 atm to 10 atm; and a microwave energy plasma source with a frequency from 915 MHz to 5.8 GHz.

EXAMPLES

Example 1: Microwave Chemical Processing System Gas-Solid Separation System

In this first example, carbon particles and aggregates containing graphite and graphene were generated using a microwave plasma reactor system, described in implementations above. The microwave plasma reactor in this example had a main body made from stainless steel with a quartz inner wall material. However, the quartz inner wall material is not needed in all cases, and similar carbon materials can be produced in reactors not containing quartz in or adjacent to the reaction zone. The reaction zone volume was approximately 45 cm$^3$. The precursor material was methane and was optionally mixed with a supply gas (such as argon). The flow rate of methane was from 1 to 100 L/min, and the flow rate of the supply gas was from 0 to 100 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr.

In this example, a hydrocarbon was the input material for the reactor, and separated components were hydrogen gas and carbon particles containing graphite and graphene. The carbon particles were separated from the hydrogen gas in a multi-stage gas-solid separation system. After exiting the reactor, the hydrogen gas and carbon particles were processed through a cyclone separator first stage, and the output from the cyclone separator was then processed through a back-pulse filter second stage.

The cyclone separator used in the gas-solid separation system in this example was composed of stainless steel, had a 1" OD tube at the inlet and outlet, and had a length of approximately 13.25", and a diameter of approximately 2.5". The temperature of the cyclone separator during the separation experiment was greater than 225° C., and the pressure was from 0 to 100 psig.

The back-pulse filter used in the gas-solid separation system in this example included a porous stainless-steel filter element with median size from 0.5 µm to 25 µm. The temperature of the back-pulse filter during the filtration experiment was greater than 250° C. The minimum pressure drop across the filter was greater than 0.5 psig, and the maximum pressure drop was approximately 15 psig. The pressure on the reactor side of the filter (such as the upstream side during filtration) was greater than 1 psig, and the pressure on the outlet side (such as the downstream side during filtration) was approximately 0.5 psig less than the pressure inside the microwave plasma reactor.

The particles produced in this example contained graphite and graphene, and no seed particles. The particles in this example had a ratio of carbon to other elements (other than hydrogen) of approximately 99.5% or greater. The solids loading of the separated components from the reactor was from 0.001 g/L to 2.5 g/L.

The gas-solid separation system in this example, including the cyclone separator first stage followed by the back-pulse filter second stage, removed more than 99% of the carbon particles from the hydrogen gas in the separated components.

Figure 5A:
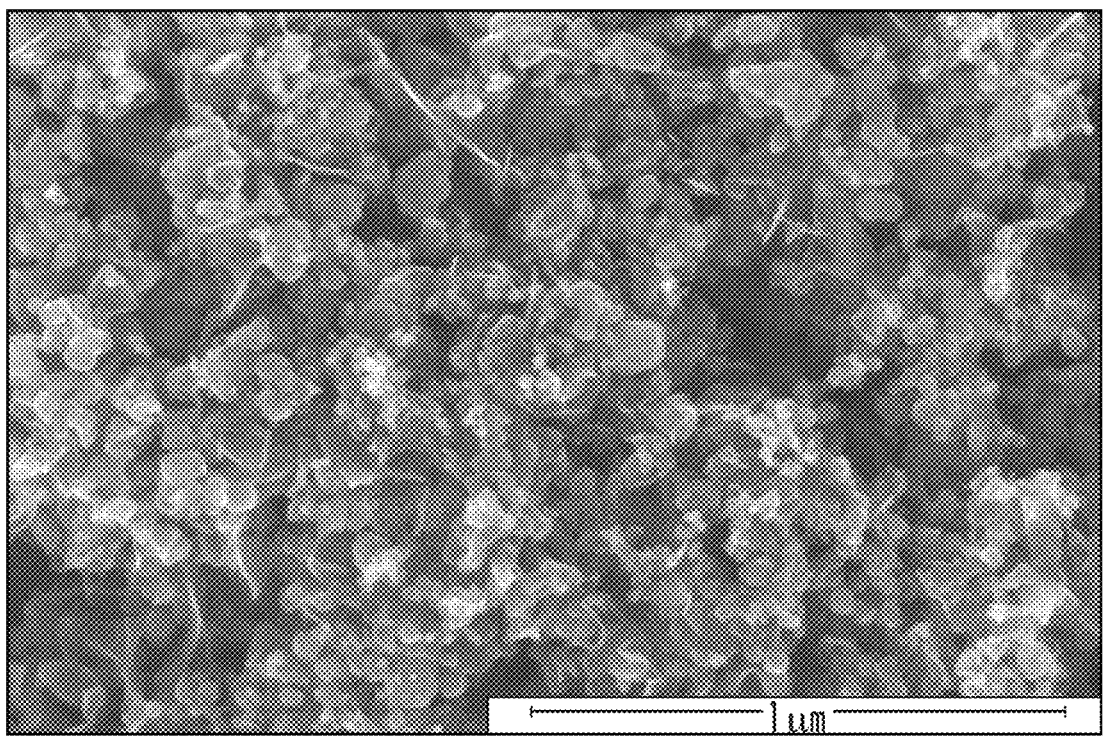
FIGS. 5A and 5B show scanning electron microscope (SEM) images from as-synthesized carbon aggregates containing graphite and graphene in a first example, according to some implementations.
Figure 5B:
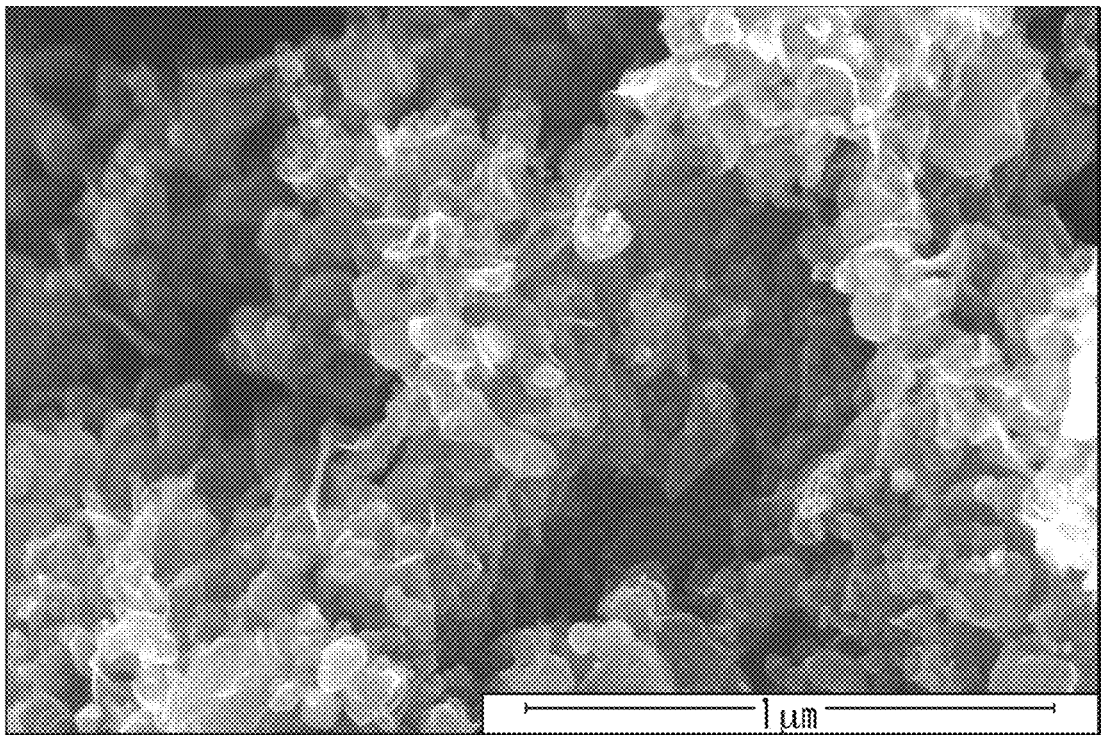

FIG. 5A shows an SEM image of carbon aggregates of this example, captured by the cyclone separator, showing the graphite and graphene allotropes. FIG. 5B shows an SEM image, of carbon aggregates of this example captured by the back-pulse filter, showing the graphite and graphene allotropes. The layered graphene is clearly shown within the distortion (wrinkles) of the carbon. The 3D structure of the carbon allotropes is also visible.

Figure 5C:
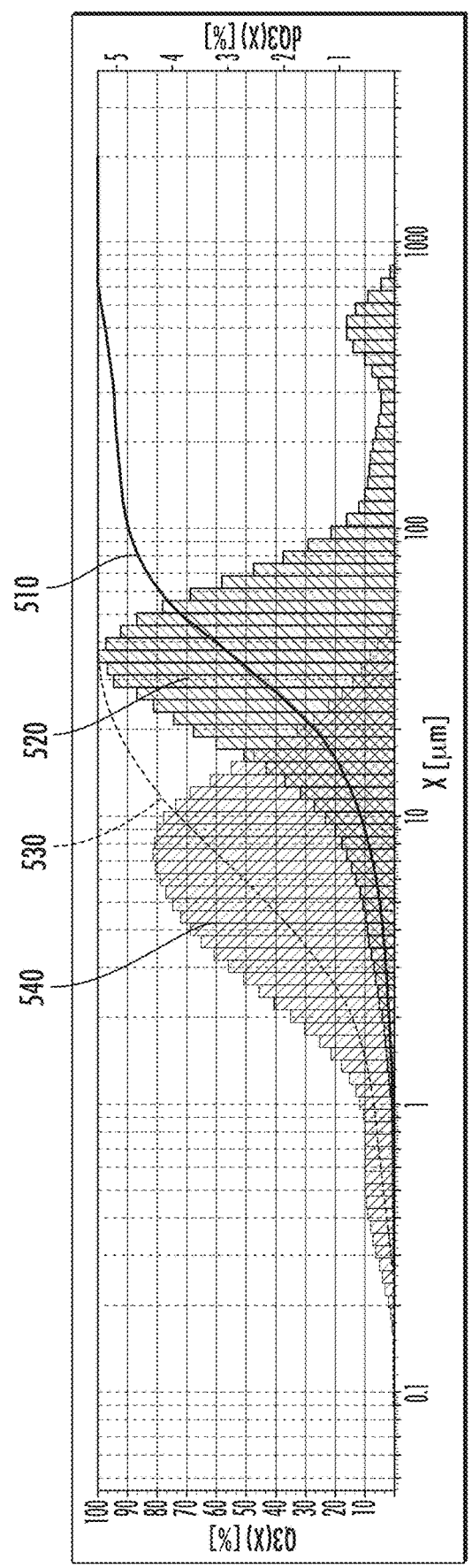
FIGS. 5C and 5D show particle size distributions of collected carbon particles in a first example, according to some implementations.

The particle size distribution of the carbon particles captured in the cyclone separator first stage in this example is shown in FIG. 5C. The mass basis cumulative particle size distribution 510 corresponds to the left y-axis in the graph (Q3(x) [%]). The histogram of the mass particle size distribution 520 corresponds to the right axis in the graph (dQ3(x) [%]). The median particle size captured in the cyclone separator in this example was approximately 33 µm, the 10th percentile particle size was approximately 9 µm, and the 90th percentile particle size was approximately 103 µm. The mass density of the particles collected in the cyclone separator was approximately 10 g/L.

Figure 5D:
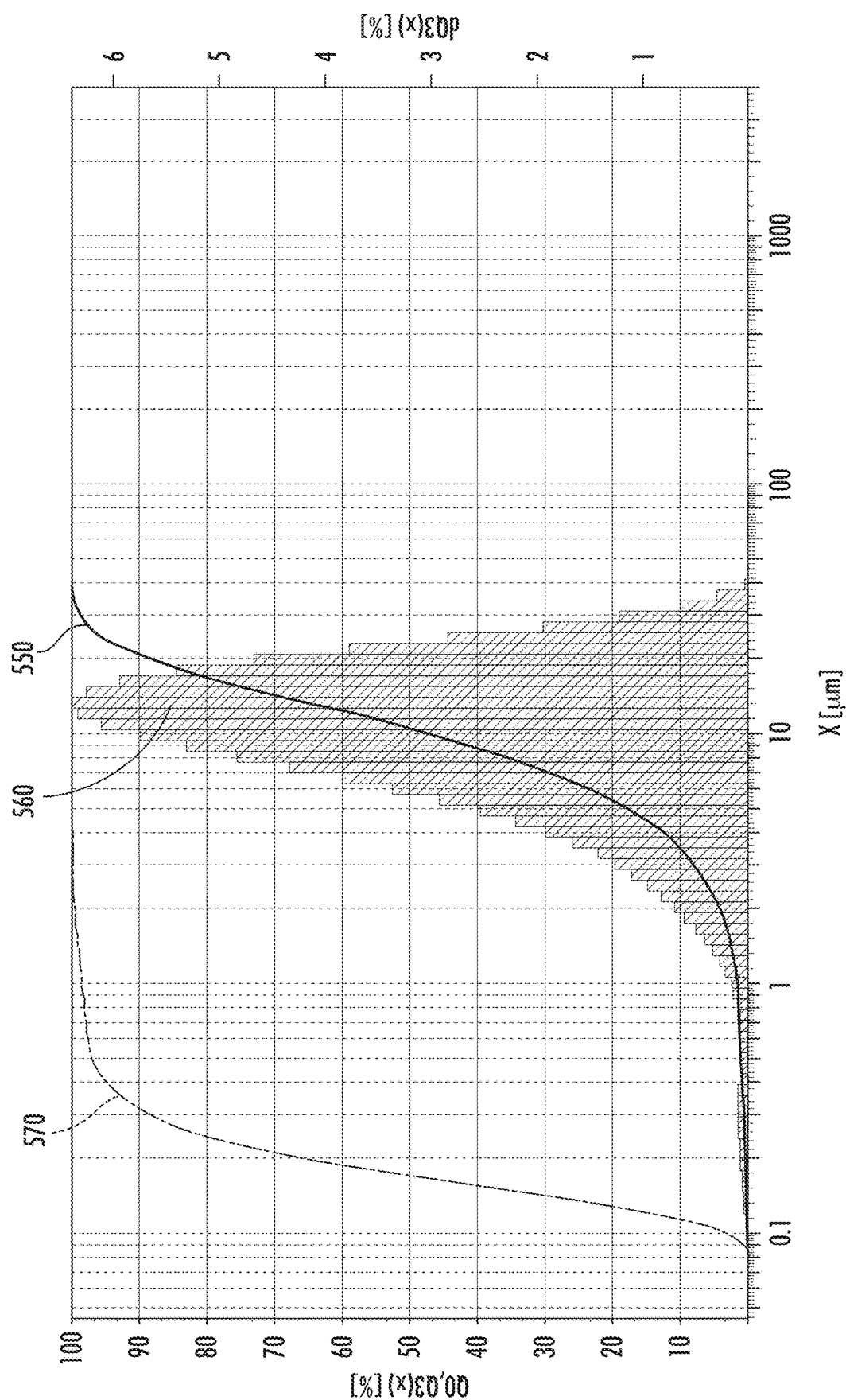

The particle size distribution of the carbon particles captured in the back-pulse filter second stage in this example is shown in FIG. 5D. The mass basis cumulative particle size distribution 550 corresponds to the left y-axis in the graph (Q3(x) [%]). The histogram of the mass particle size distribution 560 corresponds to the right axis in the graph (dQ3(x) [%]). The median particle size captured in the cyclone separator in this example was approximately 11 µm, the 10th percentile particle size was approximately 3.5 µm, and the 90th percentile particle size was approximately 21 µm. The graph in FIG. 5D also shows the number basis cumulative particle size distribution 570 corresponding to the left y-axis in the graph (Q0(x) [%]). The median particle size by number basis in this example was from approximately 0.1 µm to approximately 0.2 µm. The mass density of the particles collected in the back-pulse filter was approximately 22 g/L.

FIG. 5C also shows the results from a second experiment of this first Example.

The particles produced in the microwave plasma reactor of this example were sized-reduced by mechanical grinding, and then the size-reduced particles were processed using the cyclone separator of this example. The mass basis cumulative particle size distribution 530 of the size-reduced carbon particles captured in the cyclone separator in this example corresponds to the left y-axis in the graph (Q3(x) [%]). The histogram of the mass basis particle size distribution 540 corresponds to the right axis in the graph (dQ3(x) [%]). The median particle size of the size-reduced carbon particles captured in the cyclone separator in this example was approximately 6 µm, the 10th percentile particle size was from 1 µm to 2 µm, and the 90th percentile particle size was from 10 µm to 20 µm.

Example 2: Microwave Chemical Processing System Gas-Solid Separation System

In this second example, carbon particles and aggregates containing graphite, graphene and amorphous carbon were generated using a microwave plasma reactor system as described in Example 1. The precursor material contained methane, or isopropyl alcohol (IPA), or ethanol, or a condensed hydrocarbon (such as hexane). The carbon-containing precursors were optionally mixed with a supply gas (such as argon). When gaseous methane was used, the flow rate of methane was from 1 to 100 L/min, and the flow rate of the supply gas was from 0 to 100 L/min. When the precursor material was a liquid mixture of IPA and ethanol, the flow rate of the liquid mixture was from 0.1 to 100 mL/min. In some other cases, a condensed hydrocarbon was used, and the flow rate of the hydrocarbon was approximately 3 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr. After the aggregates were synthesized and collected, they were post-processed by annealing at a temperature from 1000 to 2200° C. in an inert atmosphere for a duration of approximately 60 to approximately 600 minutes.

The particles produced in this example contained graphite, graphene, amorphous carbon, and no seed particles. The particles in this example had a ratio of carbon to other elements (other than hydrogen) of approximately 99.5% or greater.

In this example, a hydrocarbon was the input material for the microwave plasma reactor, and separated components were hydrogen gas and carbon particles containing graphite, graphene, and amorphous carbon. The carbon particles were separated from the hydrogen gas in a multi-stage gas-solid separation system as described in Example 1. The solids loading of the separated components from the reactor was from 0.001 g/L to 2.5 g/L.

Figure 6A:
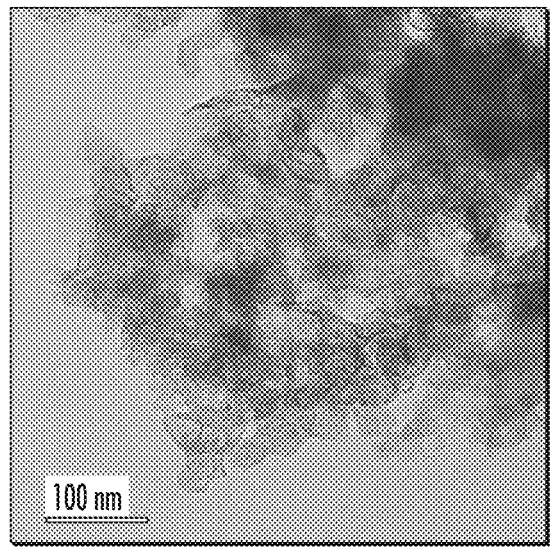
FIGS. 6A, 6B, and 6C show TEM images from as-synthesized carbon aggregates containing graphite, graphene, and amorphous carbon in a second example, according to some implementations.
Figure 6B:
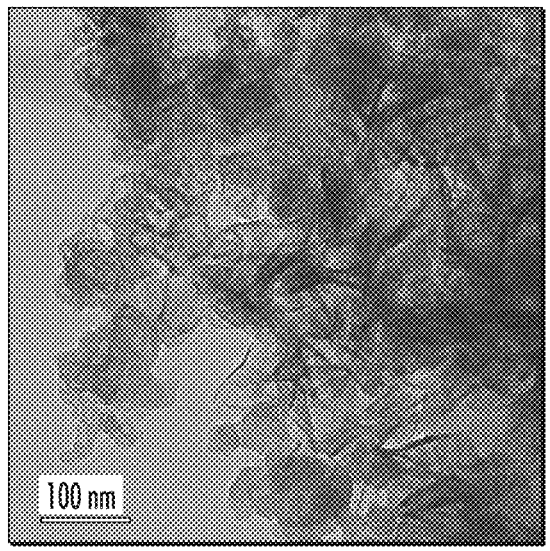
Figure 6C:
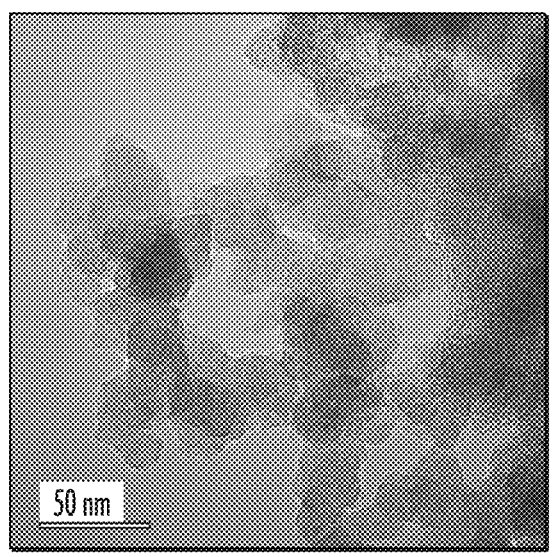

FIGS. 6A, 6B, and 6C show TEM images of as-synthesized carbon nanoparticles of this example showing the graphite, graphene, and amorphous carbon allotropes. The layers of graphene and other carbon materials can be clearly seen in the images.

Figure 6D:
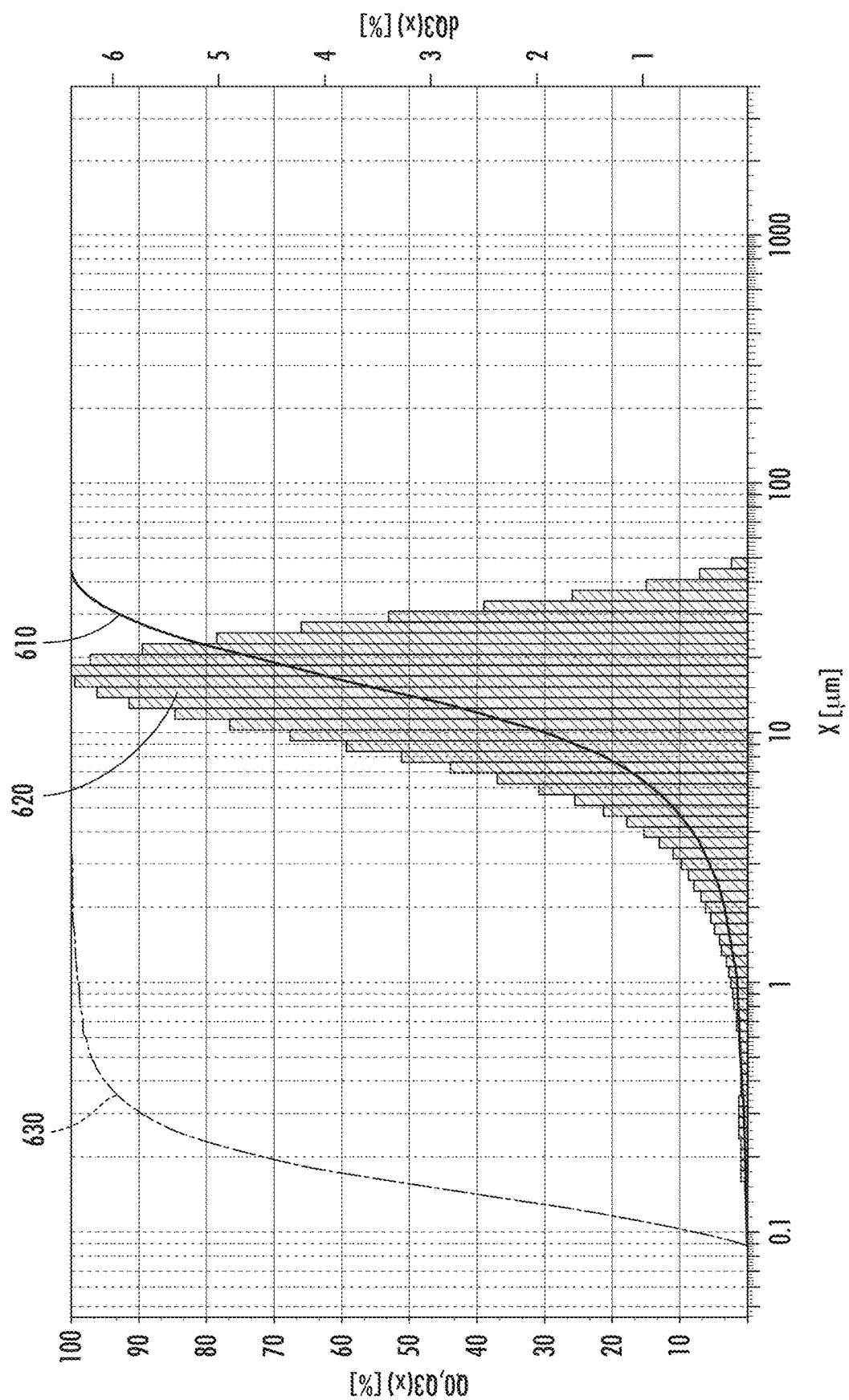
FIG. 6D shows particle size distributions of collected carbon particles in a second example, according to some implementations.

The particle size distribution of the carbon particles captured in the cyclone separator first stage in this example is shown in FIG. 6D. The mass basis cumulative particle size distribution 610 corresponds to the left y-axis in the graph (Q3(x) [%]). The histogram of the mass particle size distribution 620 corresponds to the right axis in the graph (dQ3(x) [%]). The median particle size captured in the cyclone separator in this example was approximately 14 µm, the 10th percentile particle size was approximately 5 µm, and the 90th percentile particle size was approximately 28 µm. The graph in FIG. 6D also shows the number basis cumulative particle size distribution 630 corresponding to the left y-axis in the graph (Q0(x) [%]). The median particle size by number basis in this example was from approximately 0.1 µm to approximately 0.2 µm.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

What is claimed is:

1. A reactor system comprising:
    a microwave energy source configured to generate a microwave energy;
    a field-enhancing waveguide (FEWG) coupled to the microwave energy source, the FEWG including a field-enhancing zone having a cross-sectional area that decreases along a length of the FEWG, the field-enhancing zone comprising:
        a supply gas inlet configured to receive a supply gas;
        a reaction zone configured to generate a plasma in response to excitation of the supply gas by the microwave energy;
        a process inlet configured to inject a raw material into the reaction zone; and
        a constricted region configured to retain at least some of the generated plasma within the reaction zone, the constricted region further configured to combine the plasma and the raw material in response to microwave energy within the constricted region;
    an expansion chamber in fluid communication with the constricted region and configured to expand the plasma; and
    an outlet configured to output a plurality of carbon-inclusive particles derived from the expanded plasma and the raw material.

2. The reactor system of claim 1, wherein the microwave energy is pulsed according to a pulse frequency.

3. The reactor system of claim 1, wherein the field-enhancing zone is configured to concentrate the microwave energy in the constricted region.

4. The reactor system of claim 1, wherein the FEWG further comprises a controller configured to adjust one or more of an electron density, an electron temperature, or a gas temperature within the FEWG.

5. The reactor system of claim 1, wherein the FEWG is configured to self- nucleate the carbon-inclusive particles.

6. The reactor system of claim 1, wherein the carbon-inclusive particles include graphene platelets.

7. The reactor system of claim 1, further comprising one or more energy sources configured to generate a thermal energy.

8. The reactor system of claim 7, wherein the thermal energy generated by the one or more energy sources is configured to disperse graphene platelets within each of the carbon-inclusive particles.

9. The reactor system of claim 1, wherein the FEWG is configured to adjust a length of the plasma by selectively flowing one or more precursors through the field-enhancing zone.

10. The reactor system of claim 1, wherein the constricted region is configured to concentrate the microwave energy in conjunction with the combining of the plasma and the raw material.

11. The reactor system of claim 10, wherein the concentrated microwave energy is configured to ignite the plasma.

12. The reactor system of claim 1, further comprising a pair of electrodes positioned on opposite sides of the FEWG and proximate to the reaction zone, the pair of electrodes configured to generate an electric field through which the plasma and the raw material are further combined.

13. The reactor system of claim 12, wherein a degree of concentration of the microwave energy is based on a magnitude of the electric field generated by the pair of electrodes.

14. The reactor system of claim 13, wherein the increase in the electric field strength is configured to cause a self-ignition of the plasma by combining any one or more of the supply gas or the raw material.

15. The reactor system of claim 1, wherein microwave energy source is configured to adjust a pulsing frequency of the microwave energy.

16. The reactor system of claim 1, wherein the raw material is configured to be converted into the carbon-inclusive particles in the expansion chamber.

17. The reactor system of claim 1, wherein the raw material further comprises any one or more of carbonaceous particles, colloidal dispersions, or a plurality of solid particles.

18. The reactor system of claim 1, wherein the constricted region further comprises an opening connecting the FEWG to the expansion chamber.

19. The reactor system of claim 18, wherein the opening has a defined shape including any one or more of a rectangle, a square, or an ellipse.

20. The reactor system of claim 19, wherein a density of the plasma is based at least in part on the defined shape of the opening.

21. The reactor system of claim 19, wherein a homogeneity of plasma radicals within the plasma is based at least in part on the defined shape of the opening.

22. The reactor system of claim 21, wherein the homogeneity of the plasma radicals within the plasma is configured to alter a density of the carbon-inclusive particles.

23. The reactor system of claim 18, wherein the opening is configured to separate the plasma from one or more surfaces of the expansion chamber.

* * * * *